US007263752B2

(12) United States Patent
Sakaida et al.

(10) Patent No.: US 7,263,752 B2
(45) Date of Patent: Sep. 4, 2007

(54) METHOD FOR MANUFACTURING AN INK-JET HEAD

(75) Inventors: Atsuo Sakaida, Gifu (JP); Yuji Shinkai, Handa (JP); Takeshi Asano, Nagoya (JP); Atsushi Hirota, Nagoya (JP)

(73) Assignee: Brother Kogyo Kabushiki Kaisha, Nagoya (JP)

( * ) Notice: Subject to any disclaimer, the term of this patent is extended or adjusted under 35 U.S.C. 154(b) by 96 days.

(21) Appl. No.: 11/094,427

(22) Filed: Mar. 31, 2005

(65) Prior Publication Data

US 2005/0185028 A1 Aug. 25, 2005

Related U.S. Application Data

(63) Continuation of application No. 10/367,847, filed on Feb. 19, 2003, now Pat. No. 6,973,703.

(30) Foreign Application Priority Data

| | | | |
|---|---|---|---|
| Feb. 19, 2002 | (JP) | ............................ | 2002-041296 |
| Feb. 22, 2002 | (JP) | ............................ | 2002-046164 |
| Sep. 26, 2002 | (JP) | ............................ | 2002-281139 |

(51) Int. Cl.

| | |
|---|---|
| ***H04R 17/00*** | (2006.01) |
| ***B21D 53/76*** | (2006.01) |
| ***H05K 3/02*** | (2006.01) |

(52) U.S. Cl. ...................... 29/25.35; 29/890.1; 29/847; 347/68; 347/71

(58) Field of Classification Search ............... 29/25.35, 29/890.1, 830, 832, 847; 347/68, 71, 42, 347/55

See application file for complete search history.

(56) References Cited

U.S. PATENT DOCUMENTS 4,680,595 A 7/1987 Cruz-Uribe et al.

(Continued)

FOREIGN PATENT DOCUMENTS

EP 0 860 280 A2 8/1998

(Continued)

OTHER PUBLICATIONS

Szczech et al., "Fine-Line Conductor Manufacturing Using Drop-On-Demand PZT Printing Technology", IEEE Transactions on Electronics Packaging Manufacturing, vol. 25, No. 1, Jan. 2002, pp. 26-33.*

*Primary Examiner*—A. Dexter Tugbang
(74) *Attorney, Agent, or Firm*—Oliff & Berridge, PLC.

(57) ABSTRACT

A method for manufacturing an ink-jet head, including forming a mark for indicating the positions of pressure chambers on a surface of a passage unit; preparing a member containing a piezoelectric sheet on which a common electrode is supported; attaching the member to the surface of the passage unit; and forming individual electrodes, based on the mark, on a face of the member facing the direction opposite to the attached face thereof to the passage unit.

3 Claims, 39 Drawing Sheets

U.S. PATENT DOCUMENTS

| | | | | |
|---|---|---|---|---|
| 4,730,197 A | | 3/1988 | Raman et al. | |
| 5,087,930 A | | 2/1992 | Roy et al. | |
| 5,402,159 A | | 3/1995 | Takahashi et al. | |
| 5,406,318 A | | 4/1995 | Moore et al. | |
| 5,433,809 A | * | 7/1995 | Pies et al. | 29/25.35 X |
| 5,619,234 A | | 4/1997 | Nagato et al. | |
| 5,714,195 A | | 2/1998 | Shiba et al. | |
| 5,757,400 A | | 5/1998 | Hoisington | |
| 5,948,290 A | | 9/1999 | Yamamoto et al. | |
| 6,033,058 A | | 3/2000 | Usui et al. | |
| 6,042,223 A | | 3/2000 | Katakura | |
| 6,109,727 A | | 8/2000 | Akahira et al. | |
| 2001/0020968 A1 | | 9/2001 | Isono et al. | |
| 2002/0012029 A1 | | 1/2002 | Miyata | |

FOREIGN PATENT DOCUMENTS

| | | | | |
|---|---|---|---|---|
| EP | 0 865 923 A2 | | 9/1998 | |
| EP | 0 931 653 A1 | | 7/1999 | |
| EP | 0 949 078 A1 | | 10/1999 | |
| EP | 0 991 130 A1 | | 4/2000 | |
| JP | 62-111758 | | 5/1987 | |
| JP | 2-4429 | | 1/1990 | |
| JP | 3-114654 | | 5/1991 | |
| JP | 4-341852 | | 11/1992 | |
| JP | 5-50607 | * | 3/1993 | 29/890.1 X |
| JP | 5-229115 | | 9/1993 | |
| JP | 5-338149 | | 12/1993 | |
| JP | 6-226975 | | 8/1994 | |
| JP | 7-67803 | | 7/1995 | |
| JP | 10-508808 | | 9/1998 | |
| JP | A-11-34341 | | 2/1999 | |
| JP | A-2001-260349 | | 9/2001 | |
| WO | WO99/42292 | | 8/1999 | |

* cited by examiner

METHOD FOR MANUFACTURING AN INK-JET HEAD

CROSS REFERENCE TO RELATED APPLICATION

This is a Continuation of application Ser. No. 10/367,847 filed Feb. 19, 2003, issued as U.S. Pat. No. 6,973,703. The entire disclosure of the prior applications is hereby incorporated by reference herein in its entirety.

BACKGROUND OF THE INVENTION

1. Field of Invention

The invention relates to an ink-jet head for printing by ejecting ink onto an image recording medium, a method for manufacturing the ink-jet head, an ink-jet printer, and a method for manufacturing an actuator unit.

2. Description of Related Art

In an ink-jet printer, an ink-jet head distributes ink supplied from an ink tank to pressure chambers. The ink-jet head selectively applies pulsed pressure to each pressure chamber to eject ink through a nozzle. As a means for selectively applying pressure to the pressure chambers, an actuator unit having laminated ceramic piezoelectric sheets may be used.

As an example, a generally-known ink jet head has one actuator unit in which continuous flat piezoelectric sheets extending over a plurality of pressure chambers are laminated. At least one of the piezoelectric sheets is sandwiched by a common electrode common to the pressure chambers and is being kept at the ground potential. The actuator unit also includes many individual electrodes, i.e., driving electrodes, disposed at positions corresponding to the respective pressure chambers. The part of piezoelectric sheet being sandwiched by the individual and common electrodes, and which is polarized in its thickness, acts as an active layer by applying an external electric field. Therefore, when an individual electrode on one face of the sheet is set at a different potential from the potential of the common electrode on the other face, the active layer is expanded or contracted in its thickness direction by the so-called longitudinal piezoelectric effect. The volume of the corresponding pressure chamber thereby changes, so ink can be ejected toward a print medium through a nozzle communicating with the pressure chamber.

In such an ink-jet head, to ensure good ink ejection performance, the actuator unit must be accurately positioned with respect to a passage unit so that the position of the active layer defied by each individual electrode must overlap with the corresponding pressure chamber in a plan view.

In this ink-jet head, the common electrode and the individual electrodes are formed by printing conductive pastes to be the common electrode and the individual electrodes in a predetermined pattern on the piezoelectric sheets and then by heating the pastes. Generally, when the common electrode and the individual electrodes are formed by printing the pastes, the pastes are heated with the piezoelectric sheets at a high temperature exceeding the heat-resisting level of the adhesive. Therefore, the actuator unit has to be prepared separately from the passage unit which has the ink passages with the pressure chambers. The actuator unit and the passage unit would then have to be bonded to each other by means of an adhesive with the pressure chambers being positioned on the inner side.

As described above, however, the passage unit is a lamination of metallic sheets bonded with adhesive, while the actuator unit is a sintered body prepared by heat-treating conductive electrode materials and the piezoelectric sheets at a high temperature. During high temperature sintering of the actuator unit, as the size of the piezoelectric sheets increases, the dimensional accuracy of the electrodes decreases. Thus, the longer the ink-jet head is, the more difficult the positioning process is between the pressure chambers in the passage unit and the individual electrodes in the actuator unit. As a result, the manufacture yield of heads may be decreased.

Further, an external connection member, such as a flexible printed circuit (FPC), is adhered onto the actuator unit for connecting the individual electrodes and a driver integrated circuit (IC). It is, therefore, necessary to adhere the external connection member firmly to the actuator unit.

Moreover, in the above-described ink-jet head, the individual electrodes are arranged on the laminated piezoelectric sheets. In order to manufacture this ink-jet head, a series of complicated steps are required to form through holes for connecting individual electrodes located at positions overlapping in a plan view, and burying a conductive material in the through holes.

SUMMARY OF THE INVENTION

An objective of the invention is to provide a method for manufacturing an ink-jet head which can accurately position an individual electrode in an actuator unit with respect to a corresponding pressure chamber in a passage unit.

Another objective of the invention is to provide a highly reliable ink-jet head in which an external connection member, such as an FPC to be adhered to the actuator unit, is difficult to be removed off the actuator unit, and a method for manufacturing an actuator unit to be used in the ink-jet head.

Still another objective of the invention is to provide an ink-jet head which does not require forming through holes for feeding driving signals to the individual electrodes in piezoelectric sheets, thereby improving its manufacturing process.

According to one aspect of the invention, there is provided a method for manufacturing an ink-jet head. The ink-jet head includes a passage unit that includes a plurality of pressure chambers, each having one end connected with a nozzle and the other end to be connected with an ink supply source, the plurality of pressure chambers being arranged along a plane to neighbor each other. The ink-jet head further includes a plurality of actuator units coupled or attached to a surface of the passage unit for changing the volume of each of the pressure chambers. Each actuator unit has a common electrode kept at a constant potential, a plurality of individual electrodes disposed at positions respectively corresponding to the pressure chambers, and a piezoelectric sheet sandwiched between the common electrode and the individual electrodes. The method for manufacturing such an ink-jet head comprises the steps of: forming a mark on the surface of the passage unit; preparing a member having the piezoelectric sheet on which the common electrode is supported; fixing the member to the surface of the passage unit; and forming the individual electrode, based on the mark, on a face of the member facing the direction opposite to the fixed face thereof to the passage unit. The invention also provides an ink-jet head manufactured by this method, and an ink-jet printer having the ink-jet head.

In this approach, after the member containing the piezoelectric sheet, which is to be the actuator unit, and the passage unit are attached together, the individual electrodes are formed on the member based on the mark formed on the passage unit. Therefore, it is possible to obtain an ink-jet head in which the positional accuracy of each individual electrode on the actuator unit with respect to the corresponding pressure chamber is improved, as compared with the case in which the actuator unit having the individual electrodes formed in advance is fixed to the passage unit.

In the invention, the sequence of the individual steps can be suitably interchanged. For example, the step of forming the marks may be performed after the step of preparing the member containing the piezoelectric sheet.

According to another aspect of the invention, there is provided a method for manufacturing an ink-jet head. The ink-jet head includes a passage unit that includes a plurality of pressure chambers, each having one end connected with a nozzle and the other end to be connected with an ink supply source, the plurality of pressure chambers being arranged along a plane to neighbor each other. The ink-jet head further includes a plurality of actuator units coupled to a surface of the passage unit for changing the volume of each of the pressure chambers. Each actuator unit has a common electrode kept at a constant potential, a plurality of individual electrodes disposed at positions respectively corresponding to the pressure chambers, and a piezoelectric sheet sandwiched between the common electrode and the individual electrodes. The method for manufacturing comprises the steps of: forming a first mark on the surface of the passage unit; preparing a member containing the piezoelectric sheet on which the common electrode is supported; forming a second mark on the member; fixing the member to the surface of the passage unit so that the first mark and the second mark have a predetermined positional relation; and forming the individual electrode, based on the first or second mark, on a face of the member facing the direction opposite to the fixed face thereof to the passage unit.

In this approach, after the member containing the piezoelectric sheet, which is to be the actuator unit, and the passage unit are attached together so that the marks formed on both of these two bodies have a predetermined position relative to each other, the individual electrodes are formed on the member based on the mark formed on the member or the mark formed on the passage unit. Therefore, it is possible to obtain an ink-jet head in which the positional accuracy of each individual electrode on the actuator unit with respect to the corresponding pressure chamber is improved, as compared with the case in which the actuator unit having the individual electrodes formed in advance is fixed to the passage unit.

According to still another aspect of the invention, there is provided an ink-jet head comprising a passage unit including a plurality of pressure chambers, each pressure chamber having one end connected with a nozzle and the other end to be connected with an ink supply source, the plurality of pressure chambers being arranged along a plane to neighbor each other. The ink-jet head further includes a plurality of actuator units coupled to a surface of the passage unit for changing the volume of each of the pressure chambers. Each actuator unit has a common electrode kept at a constant potential, a plurality of individual electrodes disposed at positions respectively corresponding to the pressure chambers, and a piezoelectric sheet sandwiched between the common electrode and the individual electrodes. The ink-jet head further includes a conductive film having a thickness substantially equal to that of the individual electrodes, the conductive film being formed on a face of the actuator unit facing the direction opposite to the fixed face thereof to the passage unit while separated from the individual electrodes.

In this configuration, because the conductive film formed at the region except the individual electrodes to strengthen the coupling of the external connection member (such as an FPC) and the actuator unit has a thickness substantially equal to that of the individual electrodes, little level difference is caused between the regions having the individual electrodes and the regions having the conductive film. Therefore, the external connection member adhered to the actuator unit cannot be easily removed or peeled off the actuator unit, thus improving the reliability of the ink-jet head.

According to still another aspect of the invention, there is provided a method for manufacturing an actuator unit including a piezoelectric sheet. The actuator unit is to be laminated on a passage unit having a plurality of pressure chambers formed therein. The method comprises the steps of: preparing a member having a piezoelectric sheet on which a common electrode is supported, the common electrode being provided to be common to pressure chambers and exposing from a side face of the member; forming a surface electrode that covers a face of the member facing the direction opposite to a face of the member to be fixed to the passage unit and that contacts with the common electrode on the side face of the member; and partially removing the surface electrode to form individual electrodes at positions corresponding to the respective pressure chambers.

In this approach, little level difference is caused between the individual electrodes and the surface electrode so that the external connection member is similarly adhered to both electrodes of the actuator unit and is difficult to be removed or peeled off the actuator unit. Therefore, the reliability of the ink-jet head is improved. Moreover, the common electrode and the surface electrode can be electrically connected without performing any of the complicated steps such as the step of forming the through holes in the piezoelectric sheets, thereby the manufacture cost can be reduced.

According to still another aspect of the invention, there is provided an ink-jet head comprising a passage unit that includes a plurality of pressure chambers each having one end connected with a nozzle and the other end to be connected with an ink supply source, the plurality of pressure chambers being arranged along a plane to neighbor each other. The ink-jet head further includes a plurality of actuator units fixed to a surface of the passage unit for changing the volume of each of the pressure chambers. Each actuator unit includes a common electrode kept at a constant potential; a plurality of individual electrodes arranged at positions corresponding to the respective pressure chambers, the individual electrodes being formed only on a face of the actuator unit facing the direction opposite to the fixed face thereof to the passage unit; and a piezoelectric sheet sandwiched between the common electrode and the individual electrodes.

In this configuration, no individual electrode is located in the actuator unit. Therefore, the ink-jet head can be manufactured without any of the complicated steps such as the step of forming the through holes for connecting the individual electrodes overlapping each other in a plan view.

BRIEF DESCRIPTION OF THE DRAWINGS

Other and further objects, features and advantages of the invention will become more apparent from the following description taken with reference to the accompanying drawings, in which.

DETAILED DESCRIPTION OF PREFERRED EMBODIMENTS

Figure 1:
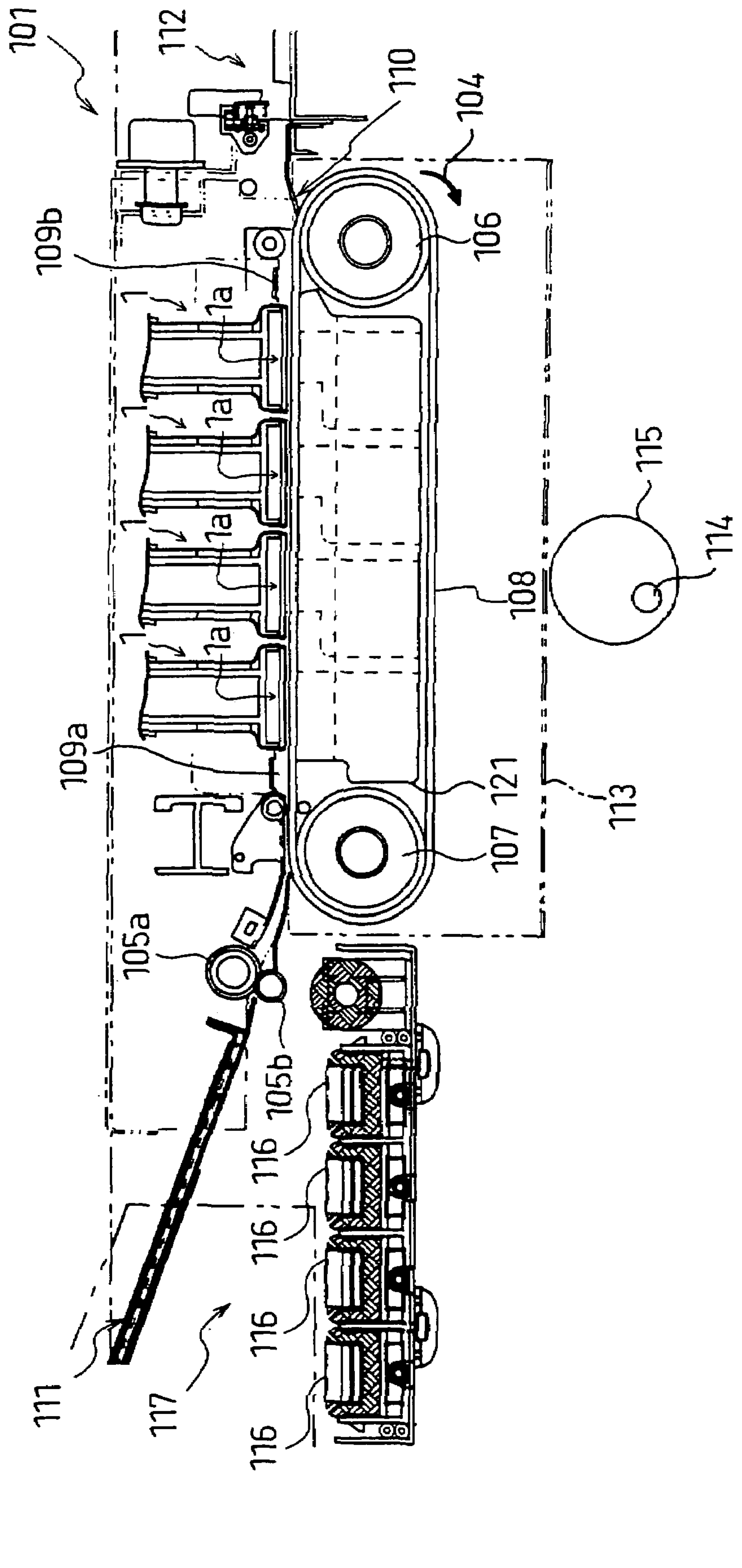
FIG. 1 is a schematic view of an ink-jet printer including ink-jet heads according to a first embodiment of the invention.

FIG. 1 is a schematic view of an ink-jet printer having ink-jet heads according to the first exemplary embodiment of the invention. As shown in FIG. 1, the ink-jet printer 101 is a color inkjet printer having four ink-jet heads 1. In this exemplary embodiment, printer 101 has an image recording medium feed unit 111 and an image recording medium discharge unit 112 are disposed on the left and right portions of printer 101 of FIG. 1, respectively. In various exemplary embodiments, the image recording medium includes, for example, a sheet of paper, card stock, photo paper, a transparency, or the like.

The ink-jet printer 101 includes an image recording medium transfer path that extends from the image recording medium feed unit 111 to the image recording medium discharge unit 112. A pair of feed rollers 105*a* and 105*b* is disposed immediately downstream of the image recording medium feed unit 111 for pinching and putting forward an image recording medium, such as a paper. By the pair of feed rollers 105*a* and 105*b*, the image recording medium is transferred from the left to the right of the printer 101 shown in FIG. 1. In the middle of the paper transfer path, two belt rollers 106 and 107 and an endless transfer belt 108 are disposed. The transfer belt 108 is wound on the belt rollers 106 and 107 to extend between them. The outer face, i.e., the transfer face, of the transfer belt 108 has been treated with silicone. Thus, an image recording medium fed through the pair of feed rollers 105*a* and 105*b* can be held on the transfer face of the transfer belt 108 by the adhesion of the face. In this state, the image recording medium is transferred downstream (rightward) by driving one belt roller 106 to rotate clockwise in FIG. 1 (the direction indicated by an arrow 104).

The ink-jet printer 101 further includes pressing members 109*a* and 109*b* which are disposed at positions for feeding an image recording medium onto the belt roller 107 and taking out the image recording medium from the belt roller 106, respectively. Either of the pressing members 109*a* and 109*b* can be used for pressing the image recording medium onto the transfer face of the transfer belt 108 so as to prevent the image recording medium from separating from the transfer face of the transfer belt 108. Thus, the image recording medium securely adheres to the transfer face.

A peeling device 110 is provided immediately downstream of the transfer belt 108 along the image recording medium transfer path. The peeling device 110 peels off the image recording medium, which has adhered to the transfer face of the transfer belt 108, from the transfer face to transfer the image recording medium toward the rightward image recording medium discharge unit 112.

Each of the four ink-jet heads 1 includes, at its lower end, a head main body 1*a*. Each head main body 1*a* has a rectangular section. The head main bodies 1*a* are arranged close to each other with the longitudinal axis of each head main body 1*a* being perpendicular to the image recording medium transfer direction (perpendicular to FIG. 1). That is, this printer 101 is a line type. The bottom of each of the four head main bodies 1*a* faces the image recording medium transfer path. In the bottom of each head main body 1*a*, a number of nozzles are provided each having a small-diameter ink ejection port. The four head main bodies 1*a* eject ink of magenta, yellow, cyan, and black, respectively. However, various other embodiments of the invention are not limited by the above described colors or order.

The head main bodies 1*a* are disposed such that a narrow clearance must be formed between the lower face of each head main body 1*a* and the transfer face of the transfer belt 108. The image recording medium transfer path is formed within the clearance. In this construction, while an image recording medium, which is being transferred by the transfer belt 108, passes immediately below the four head main bodies 1*a* in order, the respective color inks are ejected through the corresponding nozzles toward the upper face, i.e., the image recording medium face, to form a desired color image on the image recording medium.

The ink-jet printer 101 is provided with a maintenance unit 117 for automatically carrying out maintenance of the ink-jet heads 1. The maintenance unit 117 includes four caps 116 for covering the lower faces of the four head main bodies 1*a*, and a purge system (not shown).

During ink-jet printer 101 operation, the maintenance unit 117 is at a position immediately below the paper feed unit 117 (withdrawal position). When a predetermined condition is satisfied after finishing the printing operation, for example, when no printing operation takes place for a predetermined time period or when the printer 101 is powered off, the maintenance unit 117 moves to a position, known as cap position, immediately below the four head main bodies 1*a*. At this position, the maintenance unit 117 covers the lower faces of the head main bodies 1*a* with the respective caps 116 to prevent ink in the nozzles of the head main bodies 1*a* from becoming dry.

The belt rollers 106 and 107 and the transfer belt 108 are supported by a chassis 113. The chassis 113 is put on a cylindrical member 115 disposed under the chassis 113. The cylindrical member 115 is rotatable around a shaft 114 provided at a position which is off-center from the center of the cylindrical member 115. Thus, by rotating the shaft 114, the level of the uppermost portion of the cylindrical member 115 can be changed to move up or down the chassis 113 accordingly. When the maintenance unit 117 is moved from the withdrawal position to the cap position, the cylindrical member 115 must have been rotated at a predetermined angle in advance so as to move down the transfer belt 108 and the belt rollers 106 and 107 by an applicable distance from the position illustrated in FIG. 1. A space for the movement of the maintenance unit 117 is thereby ensured.

In the region surrounded by the transfer belt 108, a nearly rectangular guide 121 (having its width substantially equal to that of the transfer belt 108) is disposed at an opposite position to the ink-jet heads 1. The guide 121 is in contact with the lower face of the upper part of the transfer belt 108 to support the upper part of the transfer belt 108 from the inside.

Figure 2:
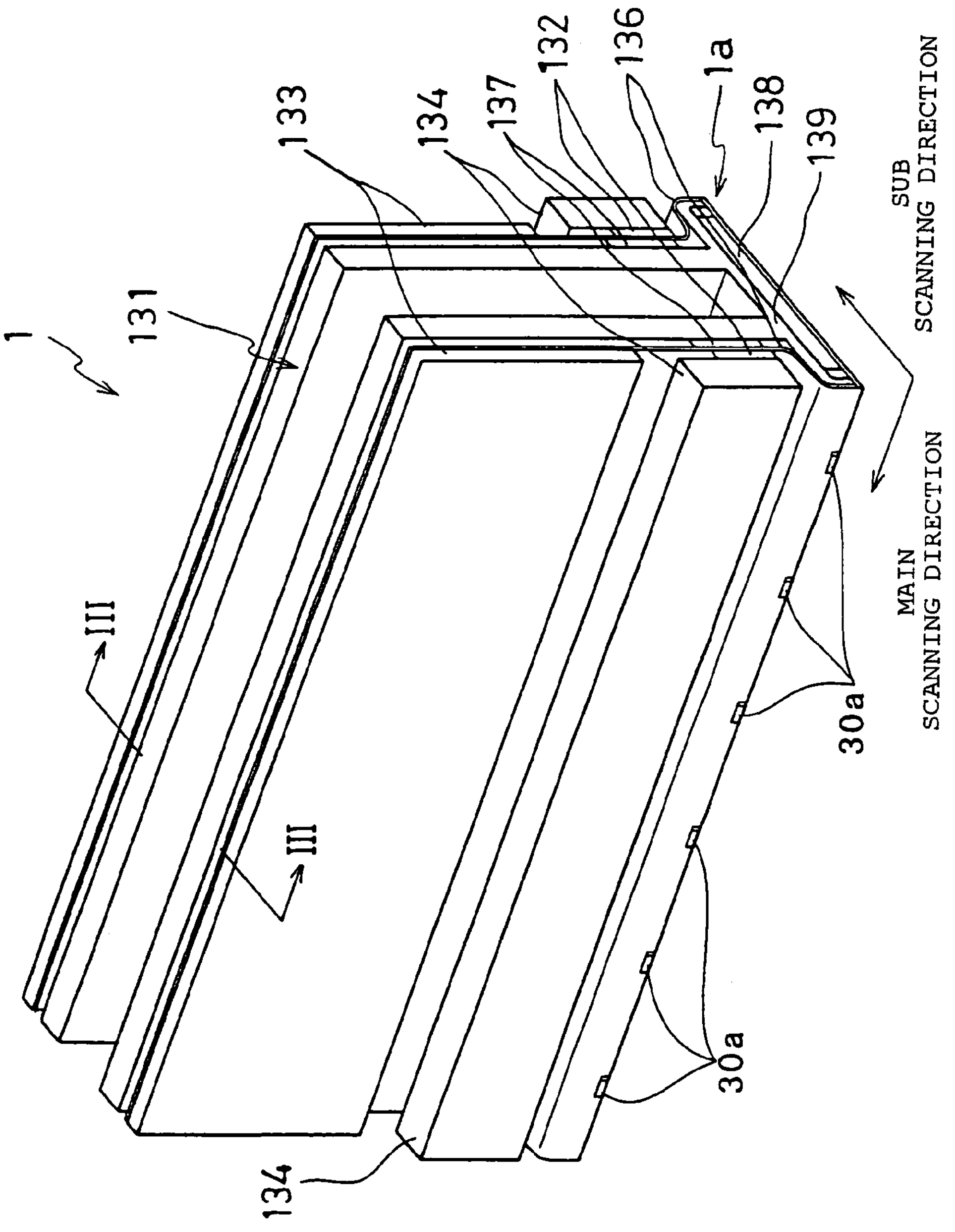
FIG. 2 is a perspective view of an ink-jet head according to the first embodiment of the invention.
Figure 3:
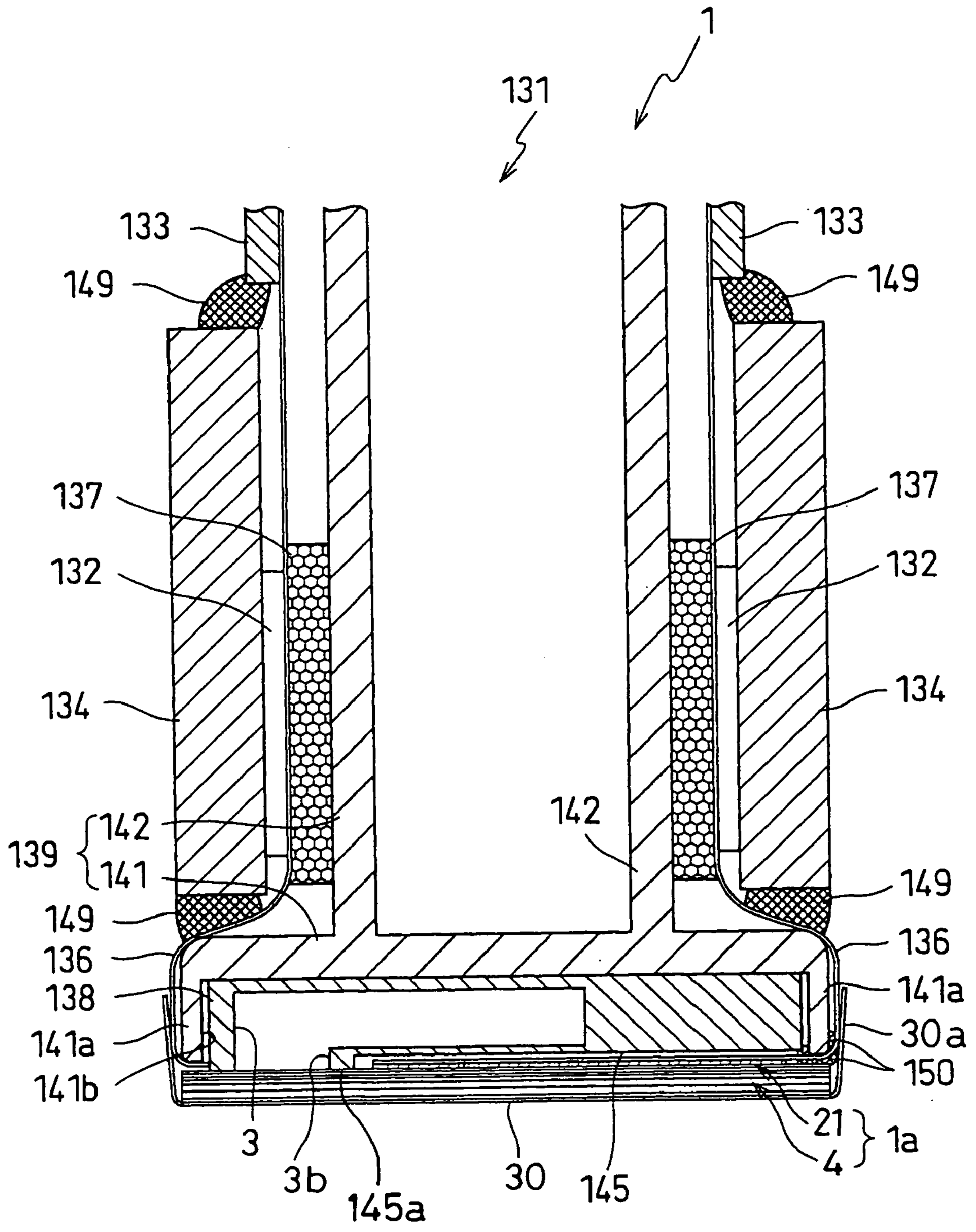
FIG. 3 is a sectional view taken along line III-III of FIG. 2.

Next, the structure of each ink-jet head 1 according to this exemplary embodiment will be described in more detail. FIG. 2 is a perspective view of the ink-jet head 1. FIG. 3 is a sectional view taken along line III-III in FIG. 2. Referring to FIGS. 2 and 3, the ink-jet head 1 according to this embodiment includes a head main body 1*a* having a rectangular shape in a plan view with its longest side extending in a main scanning direction, and a base portion 131 for supporting the head main body 1*a*. The base portion 131 supporting the head main body 1*a* further supports thereon driver ICs 132 for supplying driving signals to individual electrodes 35 (see FIG. 6), and substrates 133.

Referring to FIG. 2, the base portion 131 includes of a base block 138 partially bonded to the upper face of the head main body 1*a* to support the head main body 1*a*, and a holder 139 bonded to the upper face of the base block 138 to support the base block 138. The base block 138 is a nearly rectangular member having substantially the same length of the head main body 1*a*. The base block 138 is made of metal-like material, such as stainless steel, and functions as a light structure for reinforcing the holder 139. The holder 139 includes a holder main body 141 disposed near the head main body 1*a*, and a pair of holder support portions 142, each of which extending on the opposite side of the holder main body 141 to the head main body 1*a*. Each holder support portion 142 is configured as a flat member. These holder support portions 142 extend along the longitudinal direction of the holder main body 141 and are disposed in parallel with each other at a predetermined interval.

Skirt portions 141*a* in a pair, protruding downward, are provided in both end portions of the holder main body 141*a* in a direction perpendicular to the main scanning direction. Each skirt portion 141*a* is formed through the length of the holder main body 141. As a result, a nearly rectangular groove 141*b* is defined by the pair of skirt portions 141*a* in the lower portion of the holder main body 141. The base block 138 is positioned in the groove 141*b*. The upper surface of the base block 138 is adhered to the bottom of the groove 141*b* of the holder main body 141 with an adhesive. The thickness of the base block 138 is slightly larger than the depth of the groove 141*b* of the holder main body 141. As a result, the lower end of the base block 138 protrudes downward beyond the skirt portions 141*a*.

Within the base block 138, as a passage for ink to be supplied to the head main body 1*a*, an ink reservoir 3 is formed as a nearly rectangular space or hollow region extending along the longitudinal direction of the base block 138. In the lower face 145 of the base block 138, openings 3*b* (see FIG. 4) are formed each communicating with the ink reservoir 3. The ink reservoir 3 is connected with a not-illustrated main ink tank or ink supply source (not shown) within the printer main body through a supply tube (not shown). Thus, the ink reservoir 3 is appropriately supplied with ink from the main ink tank.

In the lower face 145 of the base block 138, the surrounding area of each opening 3*b* protrudes downward from the surrounding portion. The base block 138 is fixed to a passage unit 4 (see FIG. 3) of the head main body 1*a* at the only vicinity portion 145*a* of each opening 3*b* of the lower face 145. Thus, the region of the lower face 145 of the base block 138 other than the vicinity portion 145*a* of each opening 3*b* is distant from the head main body 1*a*. Actuator units 21 are disposed within the distance.

On the outer side face of each holder support portion 142 of the holder 139, a driver IC 132 is attached with an elastic member 137, such as a sponge positioned between them. A heat sink 134 is disposed in close contact with the outer side face of the driver IC 132. The heat sink 134 is made of a nearly rectangular member for efficiently radiating heat generated in the driver IC 132. A flexible printed circuit (FPC) 136, acting as a power supply member, is connected to the driver IC 132. The FPC 136 connected to the driver IC 132 is adhered to, and electrically-connected with, the corresponding substrate 133 and the head main body 1*a* using solder or the like. The substrate 133 is disposed outside the FPC 136 above the driver IC 132 and the heat sink 134. The upper face of the heat sink 134 is bonded to the substrate 133 with a seal member 149. Also, the lower face of the heat sink 134 is bonded to the FPC 136 with a seal member 149.

Between the lower face of each skirt portion 141*a* of the holder main body 141 and the upper face of the passage unit 4, a seal member 150 is disposed to sandwich the FPC 136. The FPC 136 is attached to the passage unit 4 and the holder main body 141 by using the seal member 150. Therefore, even if the head main body 1*a* is elongated, the head main body 1*a* can be prevented from bending, the interconnecting portion between each actuator unit and the FPC 136 can be prevented from receiving stress, and the FPC 136 can be securely held in place.

Referring to FIG. 2, near each lower corner of the ink-jet head 1 along the main scanning direction, six protruding portions 30*a* are disposed at regular intervals along the corresponding side wall of the ink-jet head 1. These protruding portions 30*a* are provided at both ends in the sub scanning direction of a nozzle plate 30 in the lowermost layer of the head main body 1*a* (see FIGS. 7A and 7B). The nozzle plate 30 is bent by about 90 degrees along the boundary line between each protruding portion 30*a* and the other portion. The protruding portions 30*a* are provided at positions corresponding to the vicinities of both ends of various image recording media to be used for printing. Each bent portion of the nozzle plate 30 has a rounded shape. This makes it difficult for an image recording medium to jam.

Figure 4:
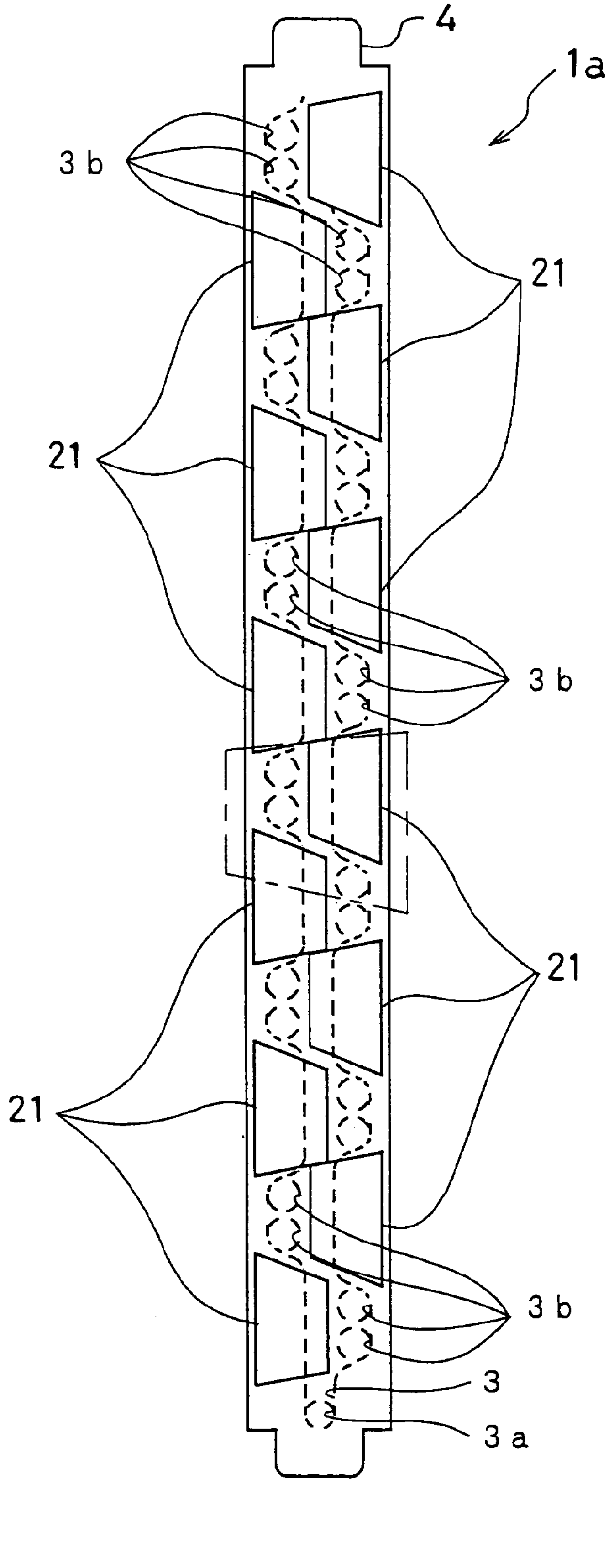
FIG. 4 is a plan view of a head main body included in the ink-jet head illustrated in FIG. 2.

FIG. 4 is a schematic plan view of the head main body 1*a*. In FIG. 4, an ink reservoir 3 formed in the base block 138 is conceptually illustrated with a broken line. Referring to FIG. 4, the head main body 1*a* has a rectangular shape in the plan view extending in the main scanning direction. The head main body 1*a* includes a passage unit 4, in which a large number of pressure chambers 10 and a large number of ink ejection ports 8 at the front ends of nozzles (as for both, see FIGS. 5, 6, and 7), are provided as described later. Trapezoidal actuator units 21 arranged in two lines in a crisscross manner are bonded onto the upper face of the passage unit 4. Each actuator unit 21 is disposed such that its parallel opposed sides (upper and lower sides) extend along the longitudinal direction of the passage unit 4. The oblique sides of each neighboring actuator units 21 overlap each other in the lateral direction of the passage unit 4.

The lower face of the passage unit 4 corresponding to the bonded region of each actuator unit 4 is made into an ink ejection region. In the surface of each ink ejection region, a large number of ink ejection ports 8 are arranged in a matrix, as described later. In the base block 138 disposed above the passage unit 4, an ink reservoir 3 is formed along the longitudinal direction of the base block 138. The ink reservoir 3 communicates with an ink tank (not shown) through an opening 3*a* provided at one end of the ink reservoir 3, so that the ink reservoir 3 is always filled up with ink. In the ink reservoir 3, pairs of openings 3*b* are provided in regions where no actuator unit 21 is present, so as to be arranged in a crisscross manner along the longitudinal direction of the ink reservoir 3.

Figure 5:
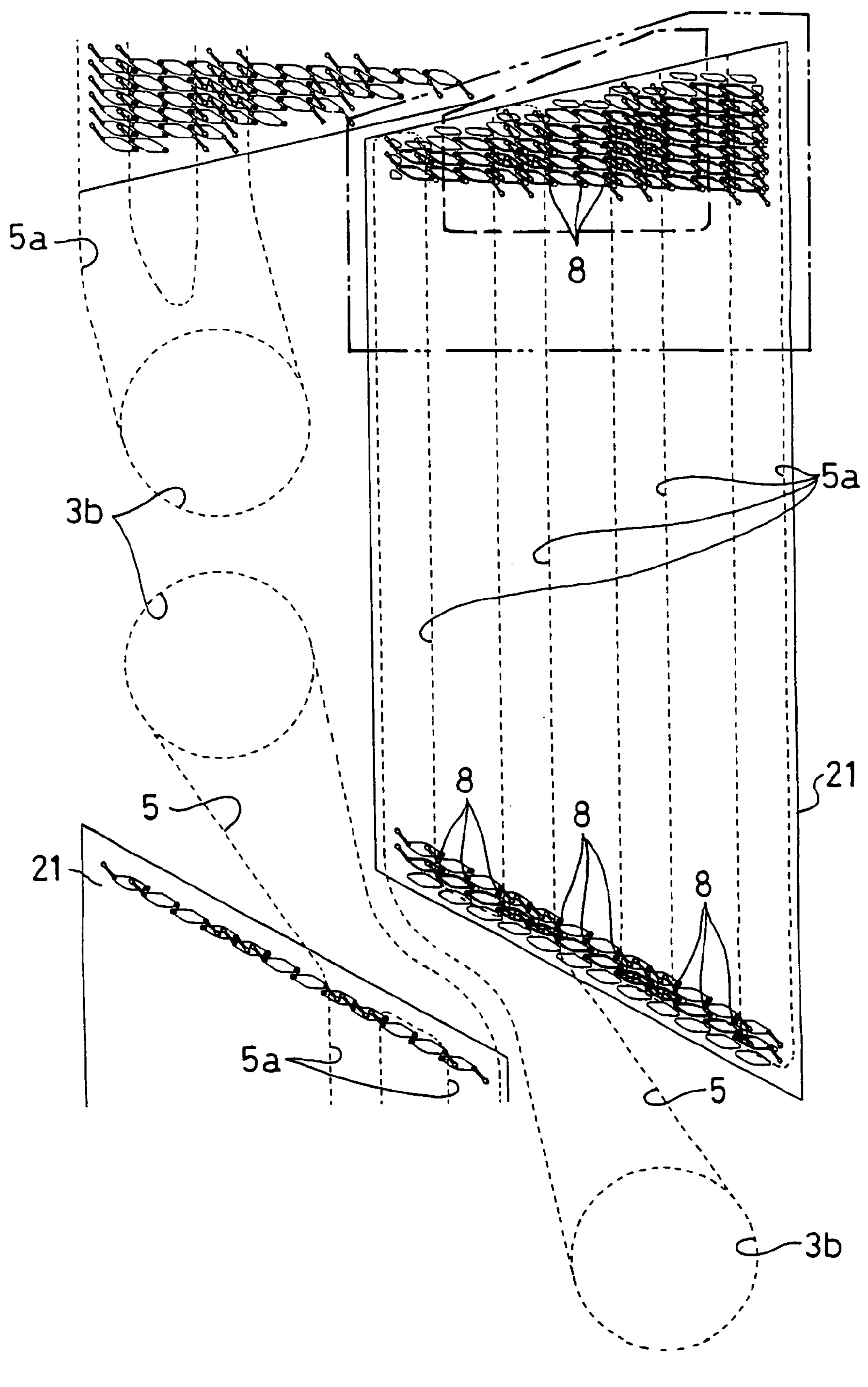
FIG. 5 is an enlarged view of the region enclosed by an alternate long and short dash line illustrated in FIG. 4.

FIG. 5 is an enlarged view of the region enclosed with an alternate long and short dash line in FIG. 4. Referring to FIGS. 4 and 5, the ink reservoir 3 communicates through openings 3*b* with a manifold channel 5 disposed under the openings 3*b*. Each opening 3*b* is provided with a filter (not shown) for catching dust and dirt that may be contained in ink. The front end portion of each manifold channel 5 branches into two sub-manifold channels 5*a*. Below a single one of the actuator unit 21, two sub-manifold channels 5*a* extend from each of the two openings 3*b* on both sides of the actuator unit 21 in the longitudinal direction of the ink-jet head 1. That is, below the single actuator unit 21, four sub-manifold channels 5*a* in total extend along the longitudinal direction of the ink-jet head 1. Each sub-manifold channel 5*a* is filled up with ink supplied from the ink reservoir 3.

Figure 6:
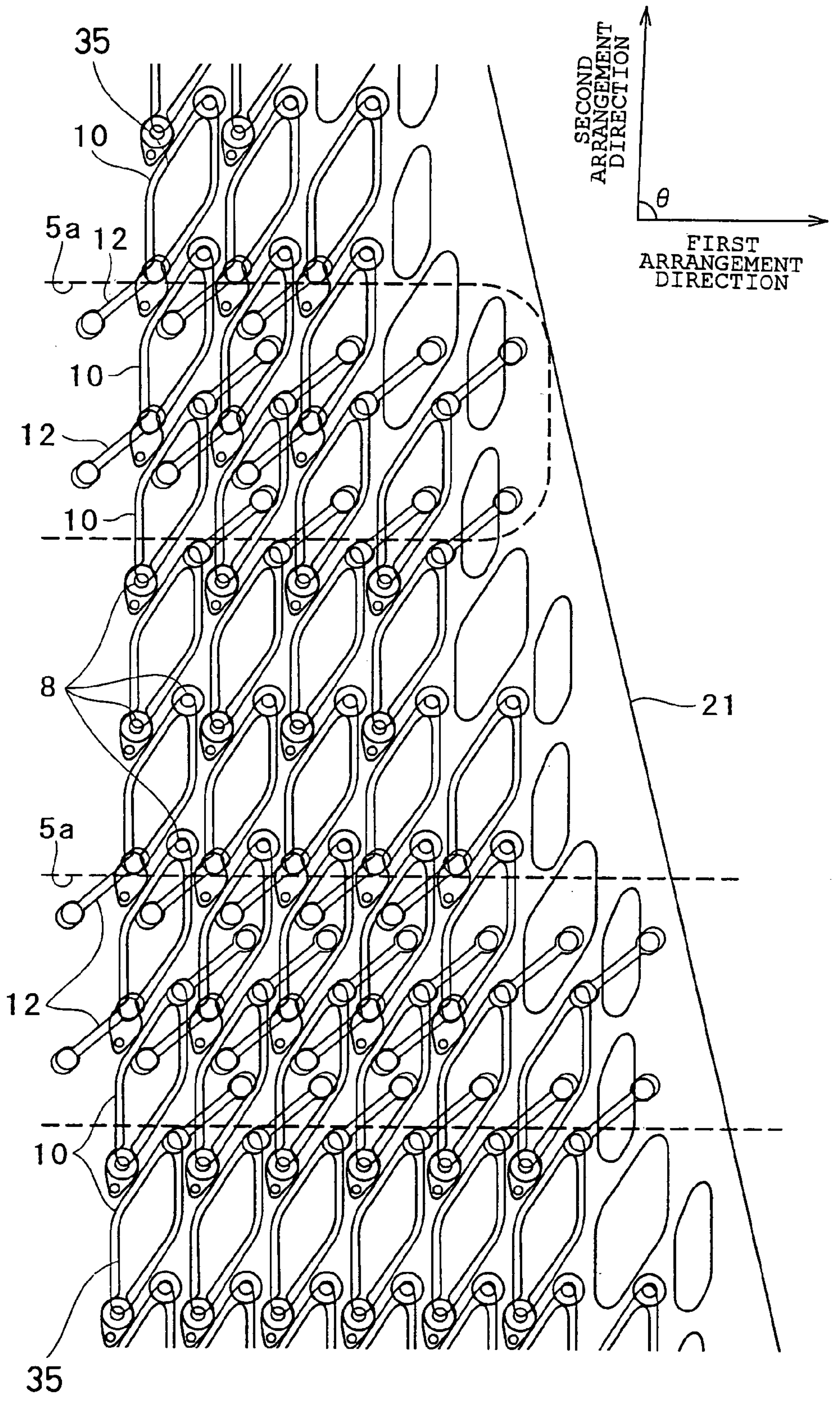
FIG. 6 is an enlarged view of the region enclosed by an alternate long and short dash line illustrated in FIG. 5.

FIG. 6 is an enlarged view of the region enclosed with an alternate long and short dash line in FIG. 5. Referring to FIGS. 5 and 6, on the upper face of each actuator unit 21, individual electrodes 35 having a nearly rhombic or diamond-like shape in a plan view are uniformly arranged in a matrix. A large number of ink ejection ports 8 are arranged in a matrix in the surface of the ink ejection region corresponding to the actuator unit 21 of the passage unit 4. In the passage unit 4, pressure chambers (cavities) 10 each having a nearly rhombic shape in a plan view somewhat larger than that of the individual electrodes 35 are uniformly arranged in a matrix. Further, in the passage unit 4, apertures 12 are also uniformly arranged in a matrix. These pressure chambers 10 and apertures 12 communicate with the corresponding ink ejection ports 8. The pressure chambers 10 are provided at positions corresponding to the respective individual electrodes 35. In a plan view, the large part of the individual electrode 35*a* and 35*b* is included in a region of the corresponding pressure chamber 10. In FIGS. 5 and 6, for ease in understanding the drawings, the pressure chambers 10, the apertures 12, etc., are illustrated with solid lines though they should be illustrated with broken lines because they are within the actuator unit 21 or the passage unit 4.

Figure 7:
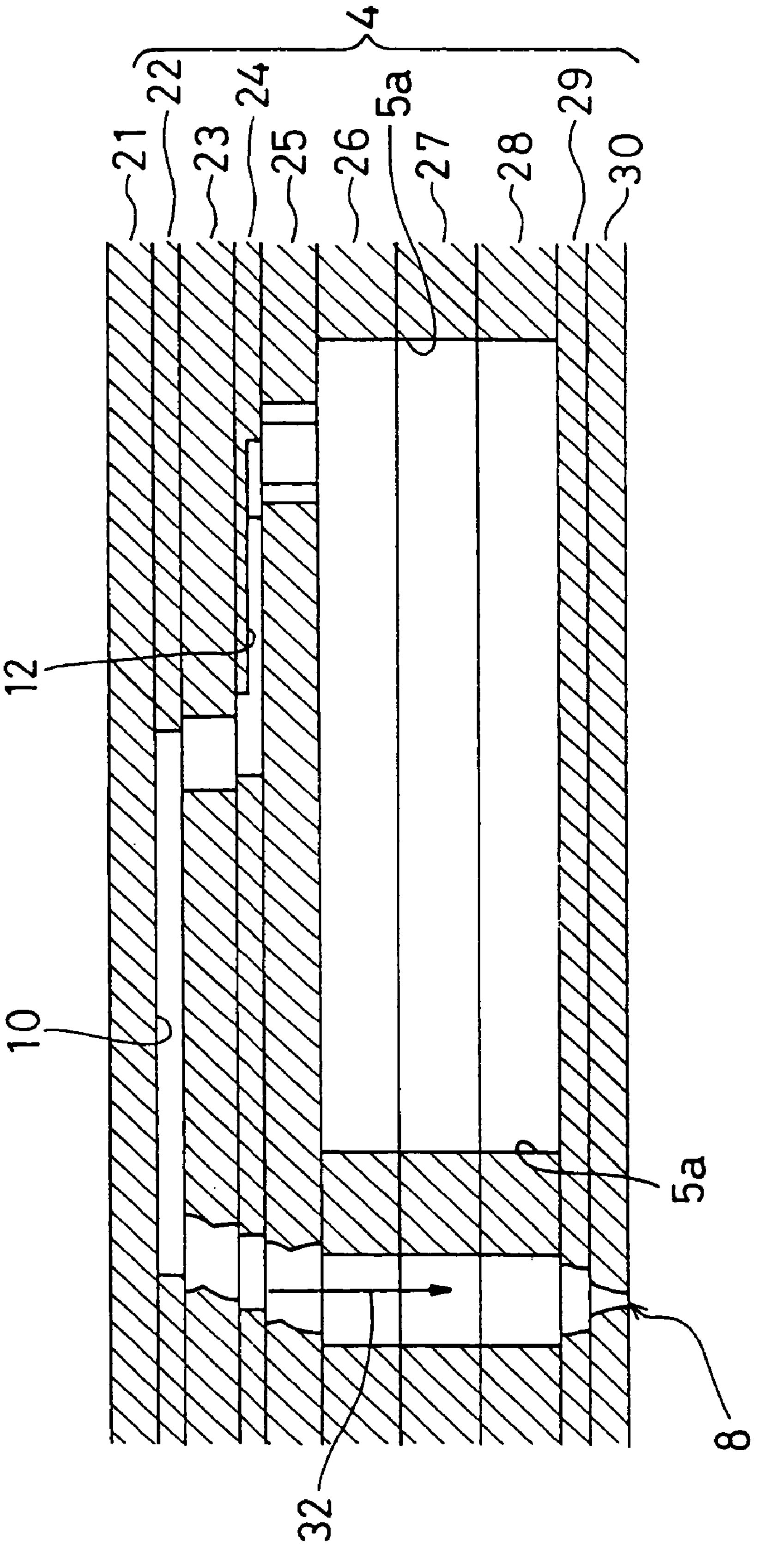
FIG. 7 is a partial sectional view of the ink-jet head main body illustrated in FIG. 4.

FIG. 7 is a partial sectional view of the head main body 1*a* of FIG. 4 along the longitudinal direction of a pressure chamber. As shown in FIG. 7, each ink ejection port 8 is formed at the front end of a tapered nozzle. Each ink ejection port 8 communicates with a sub-manifold channel 5*a* through a pressure chamber 10 (length: 900 microns, width: 350 microns) and an aperture 12. Thus, within the ink-jet head 1 formed are ink passages 32 each extending from an ink tank to an ink ejection port 8 through an ink reservoir 3, a manifold channel 5, a sub-manifold channel 5*a*, an aperture 12, and a pressure chamber 10.

Referring to FIG. 7, the pressure chamber 10 and the aperture 12 are provided at different levels. Therefore, in the portion of the passage unit 4 corresponding to the ink ejection region under an actuator unit 21, an aperture 12 communicating with one pressure chamber 10 can be disposed within the same portion in plan view as a pressure chamber 10 neighboring the pressure chamber 10 communicating with the aperture 12. As a result, because pressure chambers 10 can be arranged close to each other at a high density, high resolution image printing can be achieved with an ink-jet head 1 having a relatively small occupation area.

In the plane of FIGS. 5 and 6, pressure chambers 10 are arranged within an ink ejection region in two directions, that is, a direction along the longitudinal direction of the ink-jet head 1, called first arrangement direction, and a direction somewhat inclining from the lateral direction of the ink-jet head 1, called a second arrangement direction. The first and second arrangement directions form an angle theta, θ, somewhat smaller than the right angle. The second arrangement direction is along the lower left or upper right side of each pressure chamber 10 illustrated in FIG. 6. The ink ejection ports 8 are arranged at 50 dpi in the first arrangement direction. On the other hand, the pressure chambers 10 are arranged in the second arrangement direction such that the ink ejection region corresponding to one actuator unit 21 includes twelve pressure chambers 10. Therefore, within the whole width of the ink-jet head 1, in a region of the interval between two ink ejection ports 8 neighboring each other in the first arrangement direction, there are twelve ink ejection ports 8. At both ends of each ink ejection region in the first arrangement direction (corresponding to an oblique side of the actuator unit 21), the above condition is satisfied by making a compensation relation to the ink ejection region corresponding to the opposite actuator unit 21 in the lateral direction of the ink-jet head 1. Therefore, in the ink-jet head 1 according to this embodiment, by ejecting ink droplets in order through a large number of ink ejection ports 8 arranged in the first and second directions with relative movement of an image recording medium along the lateral direction of the ink-jet head 1, printing at 600 dpi in the main scanning direction can be performed.

Figure 8:
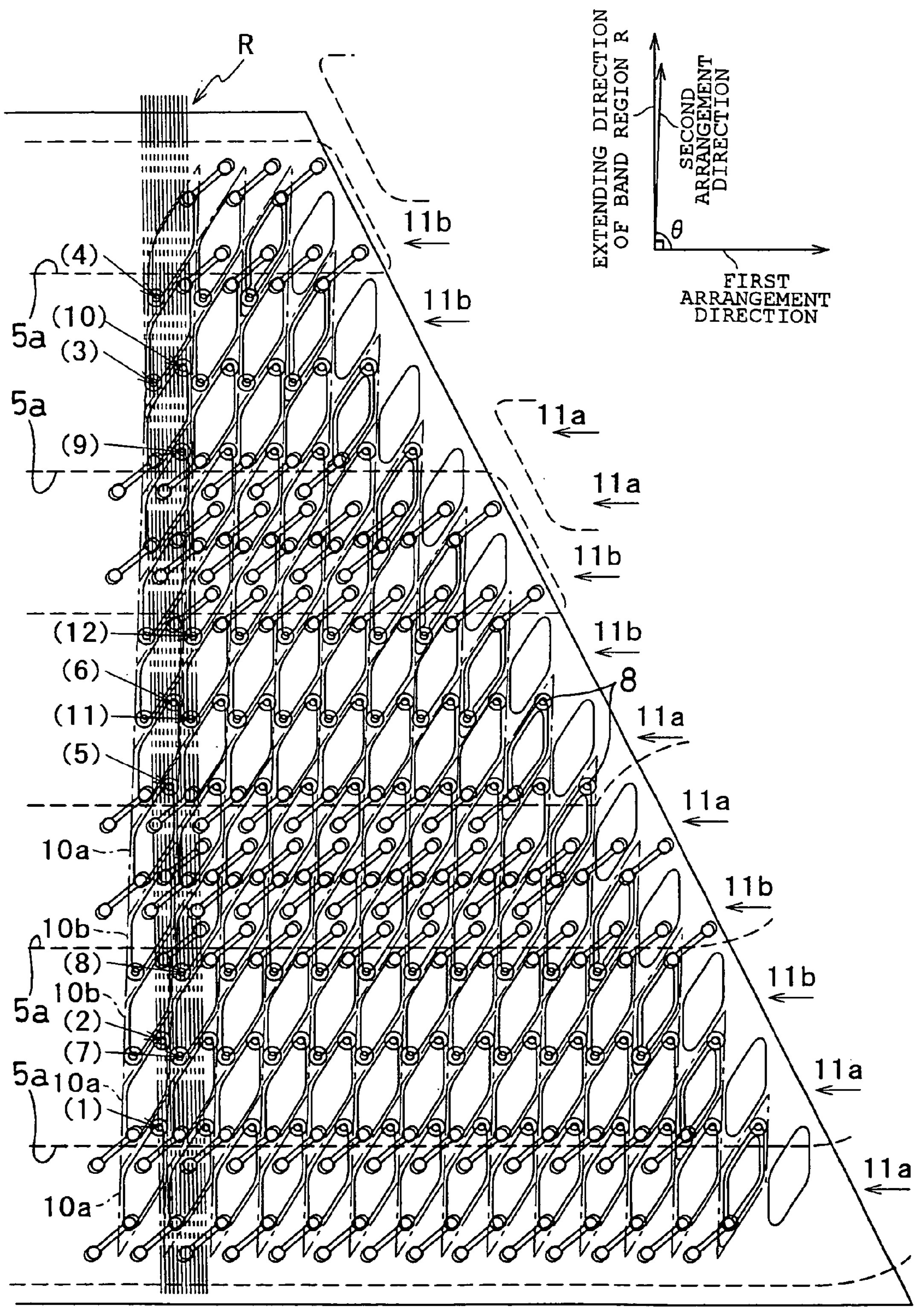
FIG. 8 is an enlarged view of the region enclosed by an alternate long and two short dashes line in FIG. 5.

Next, the structure of the passage unit 4 will be described in more detail with reference to FIG. 8. FIG. 8 is a schematic view showing the positional relation among each pressure chamber 10, each ink ejection port 8, and each aperture or restricted passage 12. Referring to FIG. 8, pressure chambers 10 are arranged in lines in the first arrangement direction at predetermined intervals at 500 dpi. Twelve lines of pressure chambers 10 are arranged in the second arrangement direction. As the whole, the pressure chambers 10 are two-dimensionally arranged in the ink ejection region corresponding to one actuator unit 21.

The pressure chambers 10 are classified into two types: pressure chambers 10*a*, in each of which a nozzle is connected with the upper acute portion in FIG. 8, and pressure chambers 10*b*, in each of which a nozzle is connected with the lower acute portion. Pressure chambers 10*a* and 10*b* are arranged in the first arrangement direction to form pressure chamber lines 11*a* and 11*b*, respectively. Referring to FIG. 8, in the ink ejection region corresponding to one actuator unit 21, from the lower side of FIG. 8, there are disposed two pressure chamber lines 11*a* and two pressure chamber lines 11*b* neighboring the upper side of the pressure chamber lines 11*a*. The four pressure chamber lines of the two pressure chamber lines 11*a* and the two pressure chamber lines 11*b* constitute a set of pressure chamber lines. Such a set of pressure chamber lines is repeatedly disposed three times from the lower side in the ink ejection region corresponding to one actuator unit 21. A straight line extending through the upper acute portion of each pressure chamber in each pressure chamber lines 11*a* and 11*b* crosses the lower oblique side of each pressure chamber in the pressure chamber line neighboring the upper side of that pressure chamber line.

As described above, when viewing perpendicularly to FIG. 8, two first pressure chamber lines 11*a* and two pressure chamber lines 11*b*, in which nozzles connected with pressure chambers 10 are disposed at different positions, are arranged alternately close to each other. Consequently, as an entire structure, the pressure chambers 10 are arranged in a uniform-like pattern. On the other hand, nozzles are arranged in a concentrated manner in a central region of each set of pressure chamber lines formed by the above four pressure chamber lines. Therefore, in case that each four pressure chamber lines form a set of pressure chamber lines and such a set of pressure chamber lines is repeatedly disposed three times from the lower side as described above, a region where no nozzle exists is formed near the boundary between each neighboring sets of pressure chamber lines, i.e., on both sides of each set of pressure chamber lines constituted by four pressure chamber lines. Wide sub-manifold channels 5*a* used for supplying ink to the corresponding pressure chambers 10 extend there. In this ink-jet head, in the ink ejection region corresponding to one actuator unit 21, four wide sub-manifold channels 5*a* are arranged in the first arrangement direction, i.e., one on the lower side of FIG. 8, one between the lowermost set of pressure chamber lines and the second lowermost set of pressure chamber lines, and two on both sides of the uppermost set of pressure chamber lines.

Referring to FIG. 8, nozzles communicating with ink ejection ports 8 for ejecting ink are arranged in the first arrangement direction at regular intervals at 50 dpi to correspond to the respective pressure chambers 10 uniformly arranged in the first arrangement direction. On the other hand, while twelve pressure chambers 10 are uniformly arranged also in the second arrangement direction forming an angle theta, θ, with the first arrangement direction, twelve nozzles corresponding to the twelve pressure chambers 10 include ones each communicating with the upper acute portion of the corresponding pressure chamber

10 and ones each communicating with the lower acute portion of the corresponding pressure chamber 10, as a result, they are not uniformly arranged in the second arrangement direction at regular intervals.

If all nozzles communicate with the same-side acute portions of the respective pressure chambers 10, the nozzles are uniformly arranged also in the second arrangement direction at regular intervals. In this case, nozzles are arranged so as to shift in the first arrangement direction by a distance corresponding to 600 dpi printing resolution per pressure chamber line from the lower side to the upper side of FIG. 8. In contrast, in this ink-jet head, because four pressure chamber lines of two pressure chamber lines 11*a* and two pressure chamber lines 11*b* form a set of pressure chamber lines, and such a set of pressure chamber lines is repeatedly disposed three times from the lower side, the shift of nozzle position in the first arrangement direction per pressure chamber line from the lower side to the upper side of FIG. 8 is not always the same.

In the ink-jet head 1, a band region R will be discussed that has a width (about 508.0 microns) corresponding to 50 dpi in the first arrangement direction and extends perpendicularly to the first arrangement direction. In this band region R, any of twelve pressure chamber lines includes only one nozzle. That is, when such a band region R is defined at an optional position in the ink ejection region corresponding to one actuator unit 21, twelve nozzles are always distributed in the band region R. The positions of points respectively obtained by projecting the twelve nozzles onto a straight line extending in the first arrangement direction are distant from each other by a distance corresponding to a 600 dpi printing resolution.

When the twelve nozzles included in one band region R are denoted by (1) to (12) starting from one whose projected image onto a straight line extending in the first arrangement direction is the leftmost, the twelve nozzles are arranged in the order of (1), (7), (2), (8), (5), (11), (6), (12), (9), (3), (10), and (4) from the lower side.

In the ink-jet head 1 having this structure, by properly driving active layers in the actuator unit 21, a character, an figure, or the like, having a resolution of 600 dpi can be formed. That is, by selectively driving active layers corresponding to the twelve pressure chamber lines in order in accordance with the transfer of an image recording medium, a specific character or figure can be printed on the image recording medium.

By way of example, a case will be described wherein a straight line extending in the first arrangement direction is printed at a resolution of 600 dpi. First, a case will be briefly described wherein nozzles communicate with the same-side acute portions of pressure chambers 10. In this case, in accordance with transfer of an image recording medium, ink ejection starts from a nozzle in the lowermost pressure chamber line in FIG. 8. Ink ejection is then shifted upward with selecting a nozzle belonging to the upper neighboring pressure chamber line in order. Ink dots are thereby formed in order in the first arrangement direction adjacent to each other at 600 dpi. Finally, all the ink dots form a straight line extending in the first arrangement direction at a resolution of 600 dpi.

On the other hand, in this inkjet head, ink ejection starts from a nozzle in the lowermost pressure chamber line 11*a* in FIG. 8, and ink ejection is then shifted upward with selecting a nozzle communicating with the upper neighboring pressure chamber line in order in accordance with transfer of an image recording medium. In this embodiment, however, because the positional shift of nozzles in the first arrangement direction per pressure chamber line from the lower side to the upper side is not always the same, ink dots formed in order in the first arrangement direction in accordance with the transfer of the print medium are not arranged at regular intervals at 600 dpi.

More specifically, as shown in FIG. 8, in accordance with the transfer of the print medium, ink is first ejected through a nozzle (1) communicating with the lowermost pressure chamber line 11*a* in FIG. 8 to form a dot row on the print medium at intervals corresponding to 50 dpi (about 508.0 microns). Next, as the print medium is transferred and the straight line formation position has reached the position of a nozzle (7) communicating with the second lowermost pressure chamber line 11*a*, ink is ejected through the nozzle (7). The second ink dot is thereby formed at a position shifted from the first formed dot position in the first arrangement direction by a distance of six times the interval corresponding to 600 dpi (about 42.3 microns) (about 42.3 microns*6=about 254.0 microns).

Next, as the print medium is further transferred and the straight line formation position has reached the position of a nozzle (2) communicating with the third lowermost pressure chamber line 11*b*, ink is ejected through the nozzle (2). The third ink dot is thereby formed at a position shifted from the first formed dot position in the first arrangement direction by a distance of the interval corresponding to 600 dpi (about 42.3 microns). As the print medium is further transferred and the straight line formation position has reached the position of a nozzle (8) communicating with the fourth lowermost pressure chamber line 11*b*, ink is ejected through the nozzle (8). The fourth ink dot is thereby formed at a position shifted from the first formed dot position in the first arrangement direction by a distance of seven times the interval corresponding to 600 dpi (about 42.3 microns) (about 42.3 microns*7=about 296.3 microns). As the print medium is further transferred and the straight line formation position has reached the position of a nozzle (5) communicating with the fifth lowermost pressure chamber line 11*a*, ink is ejected through the nozzle (5). The fifth ink dot is thereby formed at a position shifted from the first formed dot position in the first arrangement direction by a distance of four times the interval corresponding to 600 dpi (about 42.3 microns) (about 42.3 microns*4=about 169.3 microns).

After this, in the same manner, ink dots are formed with selecting nozzles communicating with pressure chambers 10 in order from the lower side to the upper side in FIG. 8. In this case, when the number of a nozzle in FIG. 8 is N, an ink dot is formed at a position shifted from the first formed dot position in the first arrangement direction by a distance corresponding to (magnification n=N-1)*(interval corresponding to 600 dpi). When the twelve nozzles have been finally selected, the gap between the ink dots to be formed by the nozzles (1) in the lowermost pressure chamber lines 11*a* in FIG. 8 at an interval corresponding to 50 dpi (about 508.0 microns) is filled up with eleven dots formed at intervals corresponding to 600 dpi (about 42.3 microns). Therefore, as the whole, a straight line extending in the first arrangement direction can be drawn at a resolution of 600 dpi.

Figure 9:
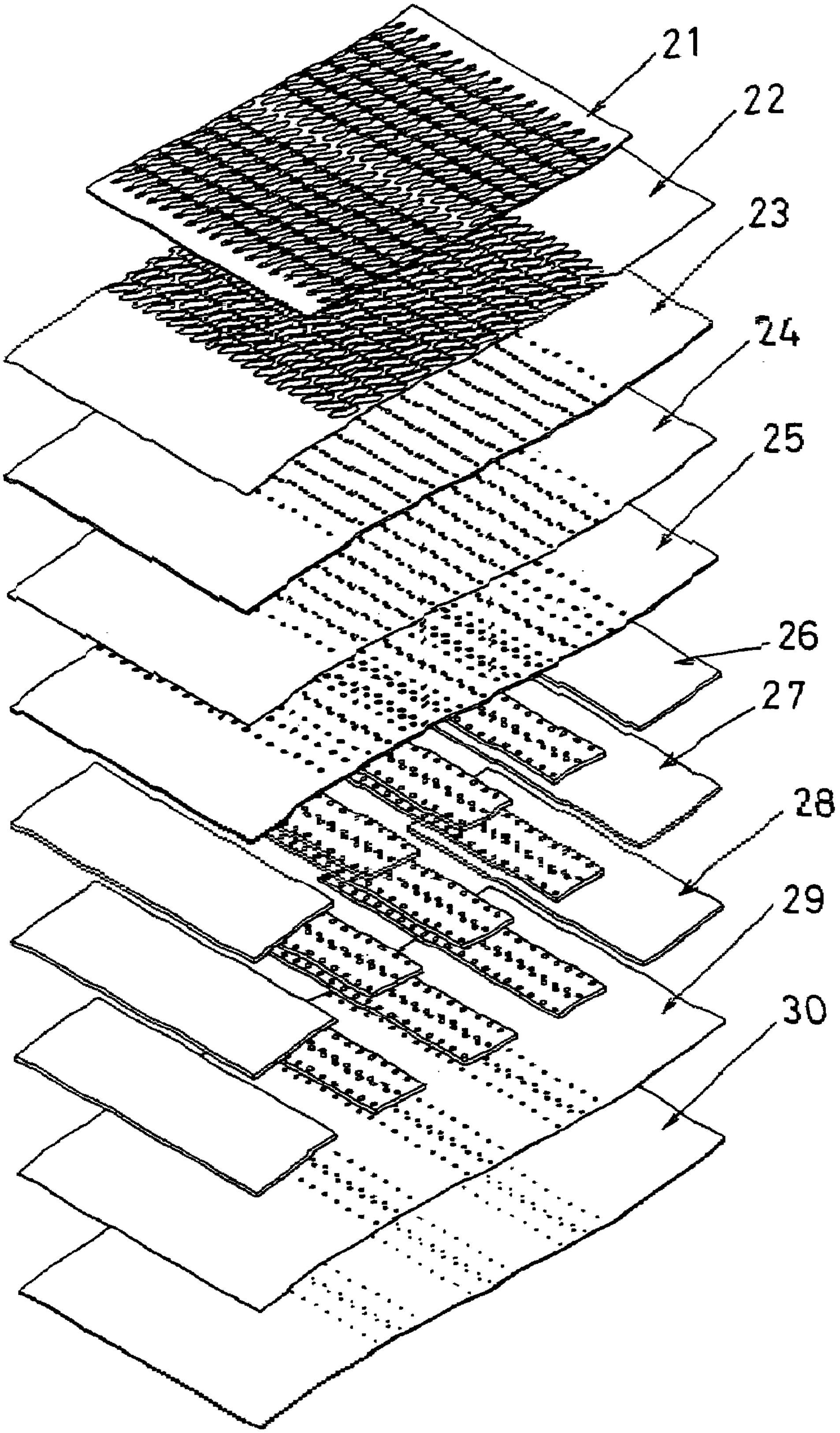
FIG. 9 is a partial exploded perspective view of the ink-jet head main body illustrated in FIG. 4.

Next, the sectional construction of the ink-jet head 1 according to this embodiment will be described. FIG. 9 is a partial exploded view of the head main body 1*a* of FIG. 4. Referring to FIGS. 7 and 9, a principal portion on the bottom side of the ink-jet head 1 has a layered structure laminated with ten sheet materials in total, i.e., from the top, an actuator unit 21, a cavity plate 22, a base plate 23, an aperture plate 24, a supply plate 25, manifold plates 26, 27, and 28, a cover plate 29, and a nozzle plate 30. Of them, nine plates other than the actuator unit 21 constitute a passage unit 4.

As described later in detail, the actuator unit 21 is laminated with four piezoelectric sheets 41 to 44 (see FIG. 11) and is provided with electrodes so that only the uppermost layer includes portions to be active only when an electric field is applied (hereinafter, simply referred to as "layer including active layers (active portions)"), and the remaining three layers are inactive. The cavity plate 22, which is made of metal, has a large number of substantially rhombic openings that are formed corresponding to the respective pressure chambers 10. The base plate 23, which is also made of metal, includes a communication hole formed between each pressure chamber 10 of the cavity plate 22 and the corresponding aperture 12, and a communication hole formed between the pressure chamber 10 and the corresponding ink ejection port 8. The aperture plate 24, which is made of metal, includes, in addition to apertures 12, communication holes that are formed for connecting each pressure chamber 10 of the cavity plate 22 with the corresponding ink ejection port 8. The supply plate 25, which is made of metal, includes communication holes formed between each aperture 12 and the corresponding sub-manifold channel 5*a*, and communication holes formed for connecting each pressure chamber 10 of the cavity plate 22 with the corresponding ink ejection port 8. Each of the manifold plates 26, 27, and 28, which are made of metal, defines an upper portion of each sub-manifold channel 5*a*, and include communication holes that formed for connecting each pressure chamber 10 of the cavity plate 22 with the corresponding ink ejection port 8. The cover plate 29, made of metal, includes communication holes formed for connecting each pressure chamber 10 of the cavity plate 22 with the corresponding ink ejection port 8. The nozzle plate 30, also made of metal, includes tapered ink ejection ports 8 functioning as a nozzles for the respective pressure chambers 10 of the cavity plate 22.

Sheets 21 to 30 are positioned in layers with each other to form such an ink passage 32 as illustrated in FIG. 7. The ink passage 32 first extends upward from the sub-manifold channel 5*a*, then extends horizontally in the aperture 12, then further extends upward, then again extends horizontally in the pressure chamber 10, then extends obliquely downward in a certain length away from the aperture 12, and then extends vertically downward toward the ink ejection port 8.

Figure 10:
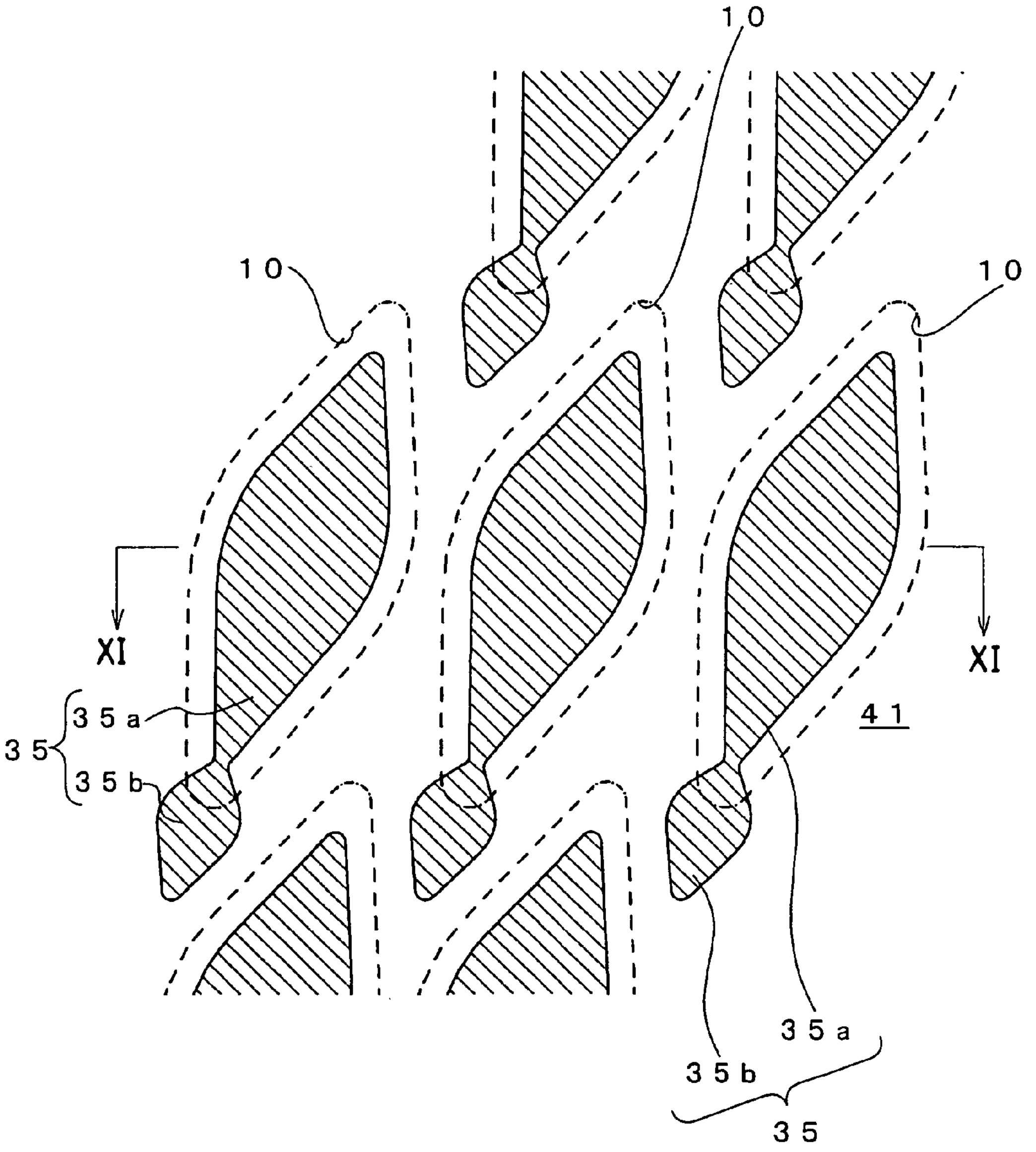
FIG. 10 is an enlarged plan view of an actuator unit in the region shown in FIG. 6.
Figure 11:
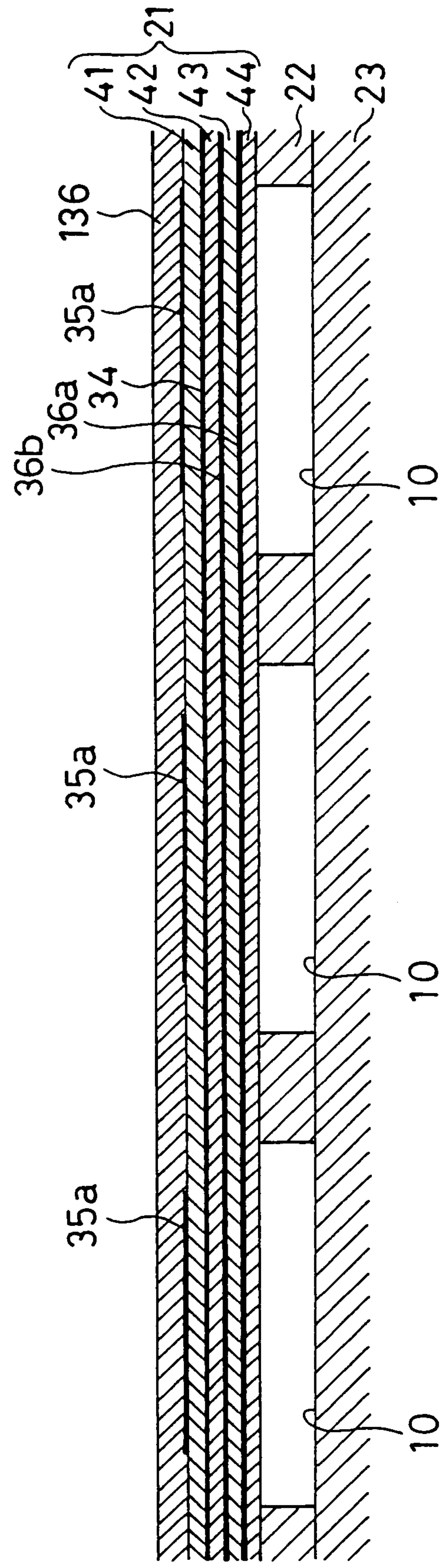
FIG. 11 is a partial sectional view of the ink-jet head main body shown in FIG. 4 and taken along line XI-XI of FIG. 10.

Next, the detailed structure of the actuator unit 21 will be described. FIG. 10 is an enlarged plan view of the actuator unit 21. FIG. 11 is a partial sectional view of the inkjet head 1 and taken along line XI-XI of FIG. 10.

Referring to FIG. 10, an about 1.1 microns-thick individual electrode 35 is formed on the upper surface of the actuator unit 21 at a position substantially overlapping each pressure chamber 10 in a plan view. The individual electrode 35 is composed of a generally rhombic main electrode portion 35*a*, and a generally rhombic auxiliary electrode portion 35*b* formed continuously from one acute portion of the main electrode portion 35*a* and made smaller than the main electrode portion 35*a*. The main electrode portion 35*a* has a shape similar to that of the pressure chamber 10 and is smaller than the pressure chamber. The main electrode portion 35*a* is arranged so as to be contained in the pressure chamber 10 in a plan view. On the other hand, most part of the auxiliary electrode portion 35*b* extends out of the pressure chamber 10 in the plan view. A later-described piezoelectric sheet 41 is exposed from the region of the upper face of the actuator unit 21 other than the individual electrodes 35.

As shown in FIG. 11, the actuator unit 21 includes four piezoelectric sheets 41, 42, 43 and 44 formed to have the same thickness of about 15 microns. An FPC 136 used for supplying signals to control the potentials of the individual electrodes 35 and the common electrode 34 is adhered or bonded to the actuator unit 21. The piezoelectric sheets 41 to 44 are formed into a continuous laminar flat sheet or a continuous flat sheet layer, and are arranged across the numerous pressure chambers 10 formed in one ink discharge region in the ink-jet head 1. The piezoelectric sheets 41 to 44 are arranged as the continuous flat sheet layers across the numerous pressure chambers 10 so that the individual electrodes 35 can be arranged in a high density by using a screen printing technique, for example. Therefore, the pressure chambers 10, formed at positions corresponding to the individual electrodes 35, can also be arranged in a high density so that a high-resolution image can be printed. In this embodiment, the piezoelectric sheets 41 to 44 are made of a ceramic material of lead zirconate titanate-base (PZT) having ferroelectricity. In FIG. 11, the FPC 136 and the piezoelectric sheet 41 are shown to be bonded all over their faces. However, the two components may be bonded only at the auxiliary electrode portion 35*b* of each individual electrode 35. This bonding relation is also applied to FIG. 22 and FIG. 32.

Between the uppermost piezoelectric sheet 41 and the piezoelectric sheet 42 downward adjacent to the piezoelectric sheet 41, an about 2 micron-thick common electrode 34 is interposed formed on the entire lower and upper faces of the piezoelectric sheets.

On the upper face of the actuator unit 21, i.e., on the upper face of the piezoelectric sheet 41, as described above, the individual electrodes 35 are formed for each of the pressure chambers 10. Each individual electrode 35 is composed of a main electrode portion 35*a* and the generally rhombic auxiliary electrode portion 35*b*. The main electrode portion 35*a* has a shape, for example, a length of 850 microns and a width of 250 microns, similar to the shape of the pressure chamber 10 in a plan view, so that a projection image of the main electrode portion 35*a* projected along the thickness direction of the individual electrode 35*a* is included in the corresponding pressure chamber 10. The auxiliary electrode portion 35*b* is made smaller than the main electrode portion 35*a*. Moreover, reinforcement metallic films 36*a* and 36*b* for reinforcing the actuator unit 21 are interposed between the piezoelectric sheets 43 and 44 and between the piezoelectric sheets 42 and 43, respectively. The reinforcement metallic films 36*a* and 36*b* are, similarly with the common electrode 34, formed on the entire surfaces of the sheets, and have substantially the same thickness as that of the common electrode 34. In this embodiment, each individual electrode 35 is made of a laminated metallic material, in which nickel Ni, having a thickness of about 1 micron, and gold Au, having a thickness of about 0.1 microns, are formed as the lower and upper layers, respectively. Each of the common electrode 34 and the reinforcement metallic films 36*a* and 36*b* is made of a silver-palladium (Ag—Pd) base metallic material. The reinforcement metallic films 36*a* and 36*b* do not act as electrodes, so that they are not always required. However, by providing these reinforcement metallic films 36*a* and 36*b*, the brittleness of the piezoelectric sheets 41 to 44 after sintering can be compensated. This enables the piezoelectric sheets 41 to 44 to be easily handled.

The common electrode 34 is grounded in the region (not shown) through the FPC 136. Thus, the common electrode 34 is kept at the ground potential equally at a region corresponding to any pressure chamber 10. On the other hand, the individual electrodes 35 can be selectively controlled in their potentials independently of one another for the respective pressure chambers 10. For this purpose, the generally rhombic auxiliary electrode portion 35*b* of each individual electrode 35 is, in independence, electrically bonded with a driver IC 132 through a lead wire (not shown). Thus, in this embodiment, the individual electrodes 35 are connected with the FPC 136 at the auxiliary electrode portions 35*b* outside the pressure chambers 10 in a plan view, so that the deformation of the actuator unit 21 in the thickness direction is blocked less. Therefore, the change in the volume of each pressure chamber 10 can be increased. In a modification, many pairs of common electrodes 34, each having a shape larger than that of a pressure chamber 10 so that the projection image of each common electrode projected along the thickness direction of the common electrode may include the pressure chamber, may be provided for each pressure chamber 10. In another modification, many pairs of common electrodes 34, each having a shape slightly smaller than that of a pressure chamber 10 so that the projection image of each common electrode projected along the thickness direction of the common electrode may be included in the pressure chamber, may be provided for each pressure chamber 10. Thus, the common electrode 34 may not always be a single conductive layer formed on the whole of the face of a piezoelectric sheet. In the above modifications, however, all the common electrodes must be electrically connected with one another so that the portion corresponding to any pressure chamber 10 may be at the same potential.

In the ink-jet head 1 according to this embodiment, the piezoelectric sheets 41 to 44 are to be polarized in their thickness direction. That is, the actuator unit 21 has the so-called "unimorph structure," in which the uppermost (as located at the most distant from the pressure chamber 10) piezoelectric sheet 41 is the layer wherein active layers are located, and the lower (i.e., near the pressure chamber 10) three piezoelectric sheets 42 to 44 are made into inactive layers. When the individual electrode 35 is set at a positive or negative predetermined potential, therefore, the portions of the piezoelectric sheet 41 to 43, as sandwiched between the electrodes, act as the active layers to contract perpendicularly of the polarization by the transversal piezoelectric effect, if the electric field and the polarization are in the same direction, for example. On the other hand, because the piezoelectric sheets 42 to 44 are not affected by the electric field, they do not contract by themselves. Thus, a difference in strain perpendicular to the polarization is produced between the uppermost piezoelectric sheet 41 and the lower piezoelectric sheets 42 to 44. As a result, the piezoelectric sheets 41 to 44 are ready to deform (i.e., the unimorph deformation) into a convex shape toward the inactive side. At this time, as shown in FIG. 11, the lower face of the piezoelectric sheets 41 to 44 is fixed on the upper face of the partition (or the cavity plate) 22 defining the pressure chamber, so that the piezoelectric sheets 41 to 44 deform into the convex shape toward the pressure chamber side. Therefore, the volume of the pressure chamber 10 is decreased to raise the pressure of ink so that the ink is ejected from the ink ejection port 8. After this, when the individual electrode 35 is returned to the same potential as that of the common electrode 34, the piezoelectric sheets 41 to 44 restore the original shape, and the pressure chamber 10 also restores its original volume so that the pressure chamber 10 draws the ink from the manifold channel 5.

In another driving method, all the individual electrodes 35 are set in advance at a potential different from that of the common electrode 34. When an ejection request is issued, the corresponding individual electrode 35 is set at the same potential as that of the common electrode 34. After this, at a predetermined timing, the individual electrodes 35 can also be set again at the potential different from that of the common electrode 34. In this case, at the timing when the individual electrode 35 is set at the same potential as that of the common electrode 34, the piezoelectric sheets 41 to 44 return to their original shapes. The corresponding pressure chamber 10 is thereby increased in volume from its initial state (in which the potentials of both electrodes are different from each other), such that the ink is drawn from the manifold channel 5 into the pressure chamber 10. After this, at the timing when the individual electrode is set again at the potential different from that of the common electrode 34, the piezoelectric sheets 41 to 44 deform into a convex shape toward the pressure chamber 10. The volume of the pressure chamber 10 is thereby decreased, and the pressure of ink in the pressure chamber 10 is raised to eject the ink.

On the other hand, in the case when the polarization occurs in the reverse direction to the electric field applied to the piezoelectric sheets 41 to 44, the active layers in the piezoelectric sheet 41 sandwiched by the individual electrodes 35 and the common electrode 34 are ready to elongate perpendicularly to the polarization by the transversal piezoelectric effect. As a result, the piezoelectric sheets 41 to 44 deform into a concave shape toward the pressure chamber 10. Therefore, the volume of the pressure chamber 10 is increased to draw ink from the manifold channel 5. After this, when the individual electrodes 35 return to their original potential, the piezoelectric sheets 41 to 44 also return to their original flat shape. The pressure chamber 10 thereby returns to its original volume to eject ink through the ink ejection port 8.

Thus, in the ink-jet head 1 according to this embodiment, the active layers are contained in only the piezoelectric sheet 41, which is one of the outermost layers of the actuator unit 21 and the most distant from the pressure chamber, and the individual electrodes 35 are formed only on the outermost face (or the upper face). Therefore, the actuator unit 21 can be easily manufactured because a through hole need not be formed for connecting the individual electrodes overlapping in a plan view.

In the ink-jet head 1 according to this embodiment, moreover, the piezoelectric sheets 42, 43 and 44 as the three inactive layers are arranged between the piezoelectric sheet 41 containing the active layers at the most distant from the pressure chamber 10 and the passage unit 4. Thus, by forming the three inactive layers for one piezoelectric sheet including active layers, the change in the volume of the pressure chamber 10 can be made to be relatively large. Lowering the voltage to be applied to each individual electrode 35, a decrease in size of each pressure chamber 10, and high integration of the pressure chambers 10 can be intended thereby. This has been confirmed by the present inventor.

In the ink-jet head 1, because the piezoelectric sheet 41 including the active layers and the piezoelectric sheets 42 to 44 as the inactive layers are made of the same material, the material need not be changed in the manufacturing process. Thus, they can be manufactured through a relatively simple process, and a reduction of manufacturing cost is expected. Further, for the reason that each of the piezoelectric sheet 41 including active layers and the piezoelectric sheets 42 to 44 as the inactive layers has substantially the same thickness, a further reduction of cost can be intended by simplifying the manufacturing process. This is because the thickness control can easily be performed when the ceramic materials to be the piezoelectric sheets are put in layers.

In addition, in the ink-jet head 1 structured as described above, by sandwiching the piezoelectric sheet 41 by the common electrode 34 and the individual electrodes 35, the volume of each pressure chamber 10 can easily be changed by the piezoelectric effect. Further, because the piezoelectric sheet 41 including active layers is in a shape of a continuous flat layer, it can easily be manufactured.

The ink-jet head 1 according to this embodiment is provided with the actuator unit 21 having the unimorph structure, in which the piezoelectric sheets 42 to 44 near the pressure chamber 10 are made into the inactive layer whereas the piezoelectric sheet 41 distant from the pressure chamber 10 is made into a layer containing the active layers. Therefore, the change in the volume of the pressure chamber 10 can be increased by the transversal piezoelectric effect. As compared with the ink-jet head in which the active layers are formed on a piezoelectric sheet near the pressure chamber 10 whereas the inactive layer is formed on piezoelectric sheet(s) distant from the pressure chamber 10, it is possible to lower the voltage to be applied to the individual electrode 35 and/or to integrate the pressure chambers 10 highly. By lowering the applied voltage, the driver IC for driving the individual electrodes 35 can be made smaller, and the cost can be reduced. In addition, the pressure chamber 10 can be reduced. Even in the case of a high integration of the pressure chambers 10, moreover, a sufficient amount of ink can be ejected. Thus, it is possible to decrease the size of the head 1 and to arrange the printing dots highly densely.

Next, a first manufacture method of the ink-jet head 1 shown in FIG. 4 will be further described with reference to FIG. 12 to FIG. 15.

Figure 12:
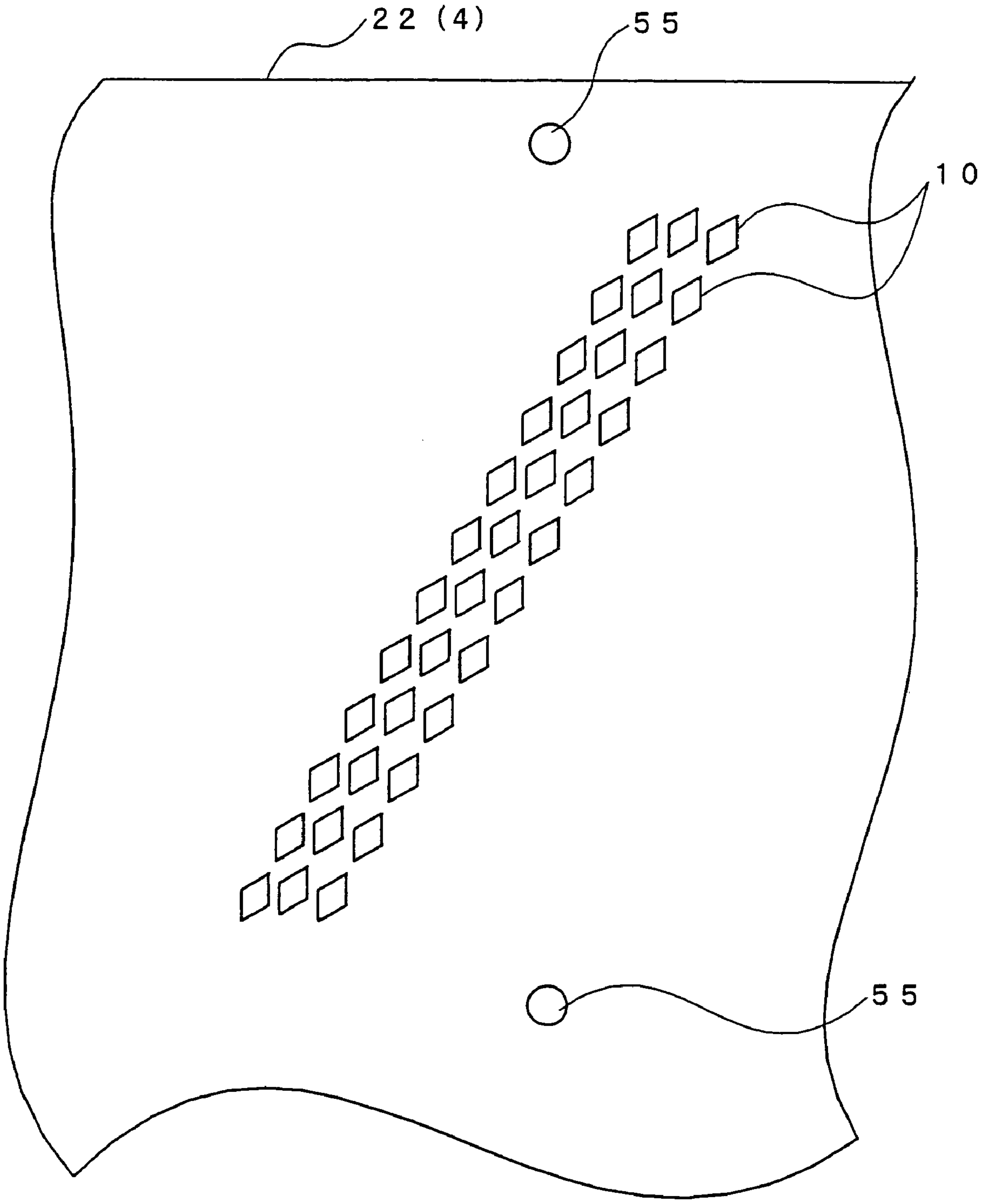
FIG. 12 is a plan view showing a cavity plate, in which marks are formed at a step in the course of the manufacture of the ink-jet head shown in FIG. 4 and based on a first manufacture method.

To manufacture the ink-jet head 1, a passage unit 4 and each actuator unit 21 are separately manufactured in parallel and then both are bonded to each other. To manufacture the passage unit 4, each plate 22 to 30 forming the passage unit 4 is subjected to etching using a patterned photoresist as a mask, thereby forming openings as illustrated in FIGS. 7 and 9 in the respective plates 22 to 30. As part of this manufacture method, as shown in FIG. 12, as the pressure chambers 10 are formed in the cavity plate 22, round marks (or cavity position recognition marks) 55 are simultaneously formed at an etching step. In other words, the cavity plate 22 is etched by using the photoresist having apertures at portions corresponding to the pressure chambers 10 and the marks 55, as the mask. The marks 55 are provided for positioning the printing positions of the later-described individual electrodes 35 and are formed outside of the ink ejecting region, for example, at a predetermined longitudinal interval of the cavity plate 22 and at two portions spaced in the widthwise direction of the cavity plate 22. The marks 55 may be exemplified by holes or recesses. FIG. 12 shows only some of the numerous pressure chambers 10.

In a modification, the marks 55 may be formed at a step different from the etching step of forming the pressure chambers 10, that is, by using another photoresist as the mask. By performing the etching step of forming the marks 55 simultaneously with the etching step of forming the pressure chambers 10, the precision of positioning the marks 55 with respect to the pressure chambers 10 can be enhanced, which improves the positioning precision of the individual electrodes 35 and the pressure chambers 10, as will be described later.

Moreover, the remaining eight plates 23 to 30 other than the cavity plate 22 are etched to form the apertures. After this, the passage unit 4 is prepared by overlaying and adhering the nine plates 22 to 33 through an adhesive to form an ink passage 32.

In order to prepare the actuator unit 21, on the other hand, a conductive paste to be a reinforcement metallic film **36*a* is printed in a pattern on a green sheet of a ceramics material to be a piezoelectric sheet 44. In parallel with this, an electrically conductive paste to be a reinforcement metallic film 36*b* is printed in a pattern on a green sheet of a ceramics material to be a piezoelectric sheet 43, and a conductive paste to be a common electrode 34 is printed in a pattern on a green sheet of a ceramics material to be a piezoelectric sheet 42. After this, a layered structure is prepared by overlaying the four piezoelectric sheets 41 to 44 while positioning them with a jig and is sintered at a predetermined temperature. As a result, a layered structure (or the piezoelectric sheet containing member) is formed which has the common electrode 34 formed on the lower face of the piezoelectric sheet 41** at the uppermost layer but does not have the individual electrodes.

Figure 13A:
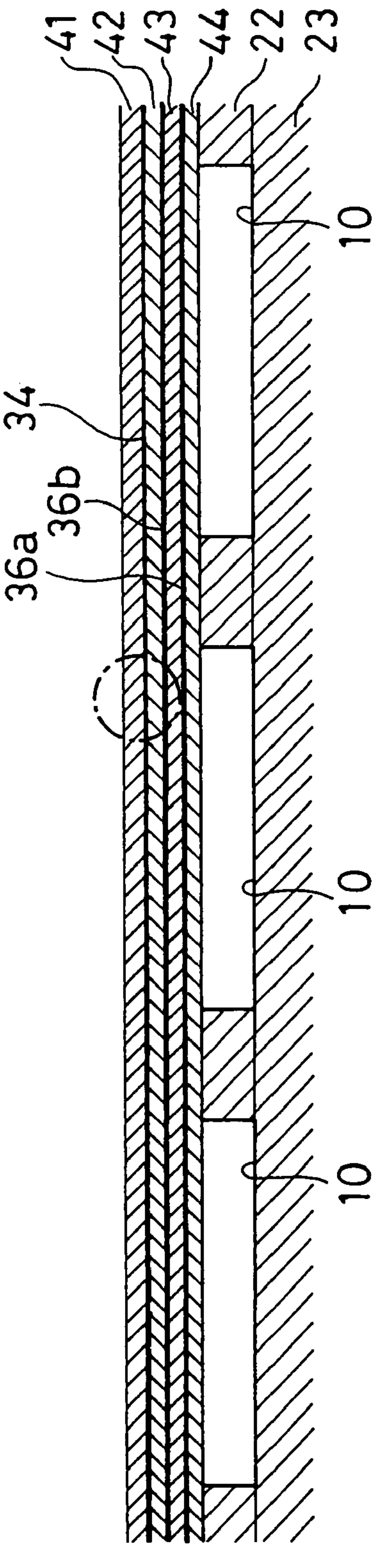
FIG. 13A and FIG. 13B are partial sectional views at individual steps in the course of the manufacture of the ink-jet head shown in FIG. 4 and based on the first manufacture method embodiment of the invention.
Figure 14A:
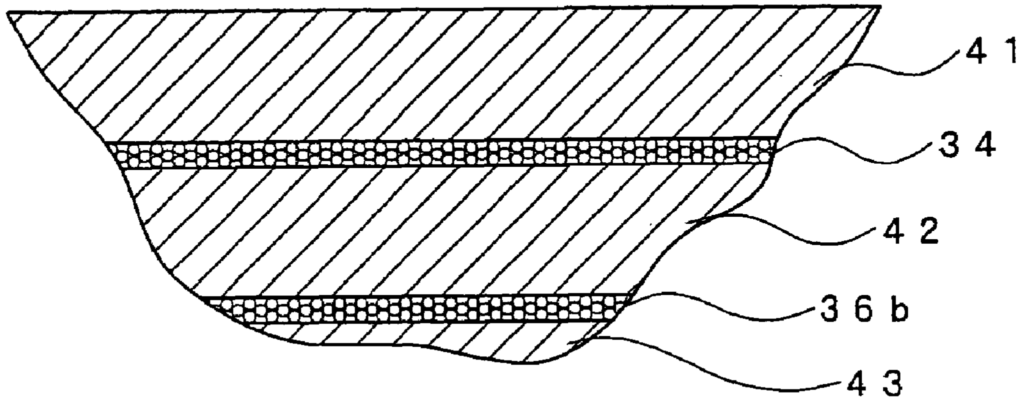
FIG. 14A and FIG. 14B are partial enlarged sectional views of the actuator unit at individual steps in the course of the manufacture of the ink-jet head shown in FIG. 4 and based on the first manufacture method embodiment of the invention.
Figure 14B:
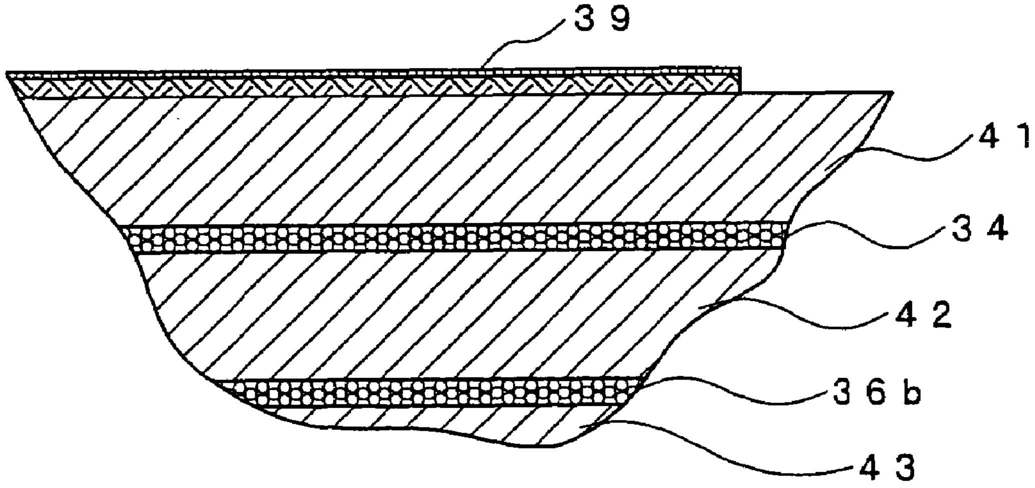

Next, the actuator unit 21 manufactured as described above is bonded or fixed to the passage unit 4 with an adhesive so that the piezoelectric sheet 44 is to be in contact with the cavity plate 22. At this time, both are bonded to each other on the basis of marks 55 and **55*a* (as referred to FIG. 15) for positioning formed on the surface of the cavity plate 22 of the passage unit 4 and the surface of the piezoelectric sheet 41, respectively. Here, a high precision is generally not required for this positioning because the individual electrodes are not formed yet on the layered structure to be the actuator unit 21. The sectional view of the ink-jet head at this time, as corresponding to FIG. 11, is presented in FIG. 13A, and a partially enlarged view of the region, as enclosed by an alternate long and short dash line, is shown in FIG. 14A. The mark 55*a* on the piezoelectric sheet 41 may be formed either before or after the piezoelectric sheets 41 to 44** are baked.

Figure 13B:
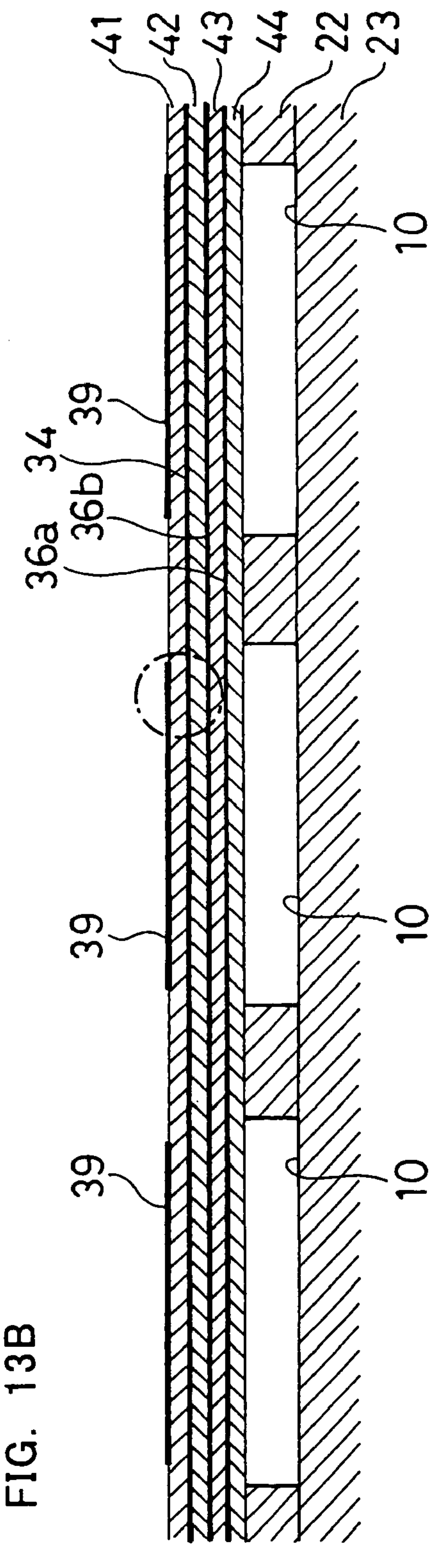
Figure 15:
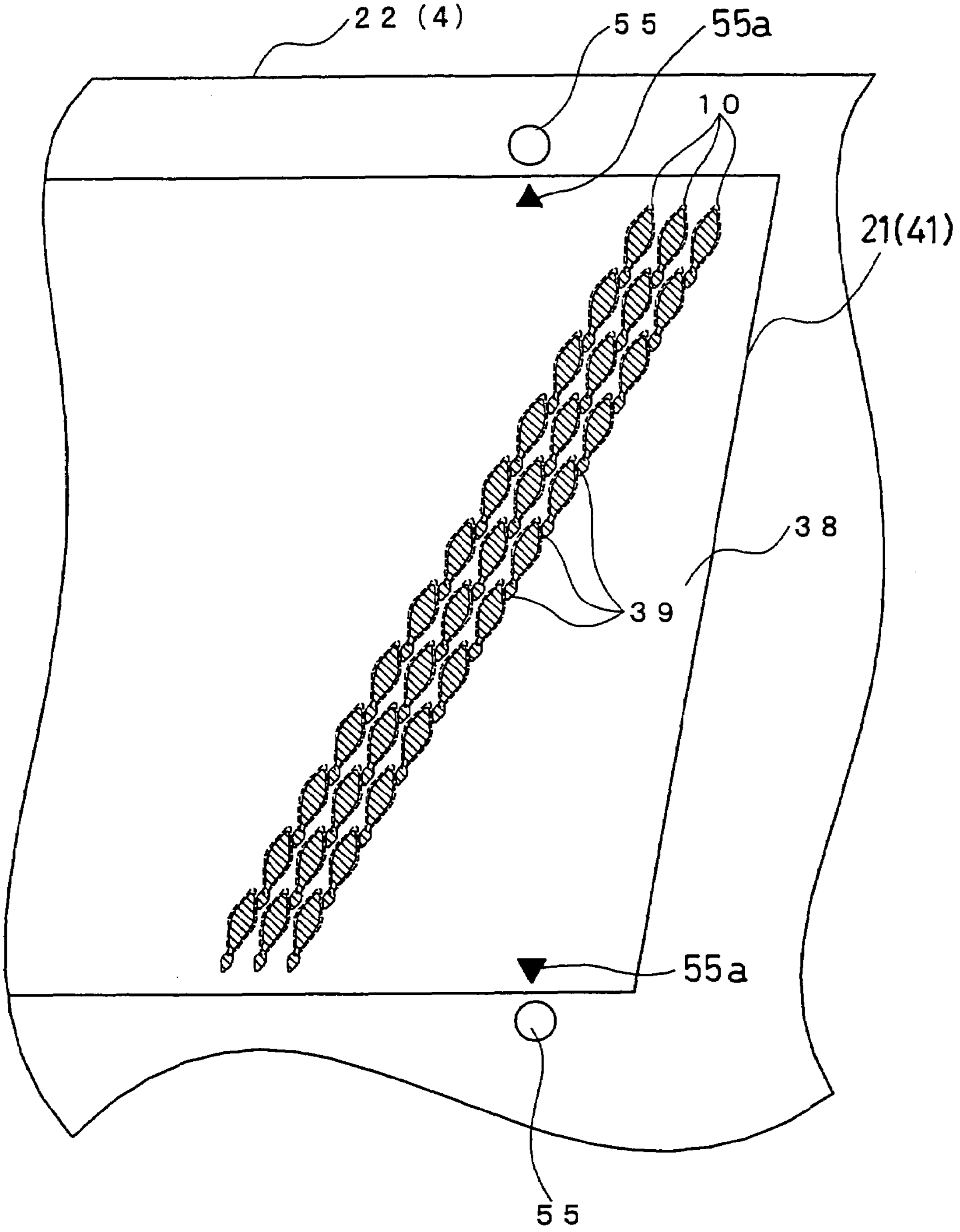
FIG. 15 is a plan view for explaining a region to be printed, at a step in the course of the manufacture of the ink-jet head shown in FIG. 4 and based on the first manufacture method embodiment of the invention.

After this, as shown in FIG. 13B and FIG. 15, the marks 55 formed on the cavity plate 22 are optically recognized, and conductive pastes 39 to be individual electrodes 35 are printed in a pattern at the aforementioned positions over the piezoelectric sheet 41 with reference to the positions of the marks 55 recognized. At this time, the region of FIG. 13B, as enclosed by an alternate long and short dash line, is presented in FIG. 14B.

Next, the pastes 39 are sintered at a sintering step. As a result, the individual electrodes 35 are formed on the piezoelectric sheet 41, and the actuator unit 21 is prepared. Here at this sintering step, the adhesive for bonding the passage unit 4 and the layered structure to be the actuator unit 21 has to be exemplified by one having a heat-resisting temperature higher than the sintering temperature for sintering the pastes 39 printed in a pattern of the individual electrodes 35, or the material for the pastes 39 has to be exemplified by one having a sintering temperature lower than the heat-resisting temperature of the adhesive for bonding the passage unit 4 and the actuator unit 21.

After this, the FPC 136 for feeding the electric signals to the individual electrodes 35 is electrically jointed by soldering to the actuator unit 21, and the manufacture of the ink-jet head 1 is completed through further predetermined steps. Moreover, the common electrode 34 is kept at the ground potential by connecting the wiring lines in the FPC 136 with the common electrode 34.

In the ink-jet head manufacturing method thus far described, the pattern of the individual electrodes 35 is formed by sintering the paste 39 which has been printed in a pattern on the basis of the marks 55 formed on the passage unit 4 having the pressure chambers 10. As compared with the case in which the actuator unit having the individual electrodes formed in advance is bonded to the passage unit, therefore, the positioning precision of the individual electrodes 35 formed on the piezoelectric sheet 41 relative to the pressure chambers 10 is improved. As a result, the ink ejecting performance has an excellent homogeneity so that the ink-jet head 1 is easily elongated. In contrast to the ink-jet head 1 of this embodiment in which a plurality of actuator units 21 are provided and arrayed in the longitudinal direction of the passage unit 4, it is possible to use only one actuator unit 21 which is as long as the passage unit 4.

Further, in this manufacture method, the pastes 39 are printed and sintered after the piezoelectric sheets 41 to 44 and the passage unit 4 are bonded, as described above, so that the actuator units 21 can be easily handled. Moreover, the individual electrodes 35 can be printed by means of the printer which is used for forming the common electrode 34, so that the manufacture cost can be reduced.

Further, in this manufacture method, the individual electrodes are not formed between the adjoining piezoelectric sheets 41 to 44 when these piezoelectric sheets are laminated, that is, only the piezoelectric sheet 41 most distant from the pressure chambers 10 is a layer containing the active layers. Therefore, the through holes used for connecting the individual electrodes (overlapping one another in a plan view) need not be formed in the piezoelectric sheets 41 to 44. According to this manufacture method, the ink-jet head 1 can be manufactured at a low cost by the relatively simple steps, as described before.

In this manufacture method, moreover, the four piezoelectric sheets 41 to 44 are laminated such that only the uppermost piezoelectric sheet 41 is a layer containing the active layers, and the remaining three piezoelectric sheets 42 to 44 are inactive layers. According to the ink-jet head 1 thus manufactured, the volume change of the pressure chambers 10 can be made relatively large, as described above. Therefore, it is possible to lower the drive voltage of the individual electrodes 35 and to reduce the size and raise the integration of the pressure chambers 10.

As a deformation example process, a lamination having the piezoelectric sheets 41 to 44 is first baked, the mark **55*a* and the individual electrodes are next formed on the piezoelectric sheet 41, and thereafter the actuator unit 21 and the passage unit 4 are adhered to each other. The mark 55*a* and the individual electrodes 35 are formed by performing a baking process after a pattern of the conductive paste has been printed. If the mark 55*a* is formed in advance on the piezoelectric sheet 41, the individual electrodes 35 may be formed on the basis of the mark 55*a*. In any case, the dimension of the baked lamination (piezoelectric sheets 41 to 44) seldom varies in baking the paste for forming the individual electrodes 35. Therefore, the individual electrodes 35 and the pressure chambers 10 formed in the passage unit 4 can be aligned with good accuracy over the whole actuator unit 21 by aligning the passage unit 4 and the piezoelectric sheet 41 in such a manner that the mark 55 on the passage unit 4 and the mark 55*a* on the piezoelectric sheet 41 have the prescribed positional relationship with each other. Further, according to this deformation example, there is no need to perform a heat treatment for baking the individual electrodes 35 after adhering the actuator unit 21 and the passage unit 4, thereby advantageously increasing the degree of freedom of the selection of adhesive used for adhering the actuator unit 21 and the passage unit 4**.

As mentioned above, providing the reinforcement metallic films **36*a* and 36*b* reinforces the brittleness of the piezoelectric sheets 41 to 44, thereby improving the handling ability of the piezoelectric sheets 41 to 44. However, it is not always necessary to provide the reinforcement metallic films 36*a* and 36*b*. For example, when the size of the actuator unit 21 is approximately 1 inch, the handling ability of the piezoelectric sheets 41 to 44 is not damaged by brittleness even if the reinforcement metallic films 36*a* and 36*b*** are not provided.

Further, according to this embodiment, the individual electrodes 35 are formed only on the piezoelectric sheet 41 as described above. On the other hand, when individual electrodes are also formed on the piezoelectric sheets 42 to 44, i.e., other than the piezoelectric sheet 41, the individual electrodes have to be printed on the desired piezoelectric sheets 41 to 44 before laminating and baking the piezoelectric sheets 41 to 44. Accordingly, the contraction of piezoelectric sheets 41 to 44 in baking causes a difference between the positional accuracy of the individual electrodes on the piezoelectric sheets 42 to 44 and the positional accuracy of the individual electrodes 35 on the piezoelectric sheet 41. According to this exemplary embodiment, however, because the individual electrodes 35 are formed only on the piezoelectric sheet 41, such difference in positional accuracy is not caused and the individual electrodes 35 and the corresponding pressure chambers 10 are aligned with good accuracy.

Figure 16A:
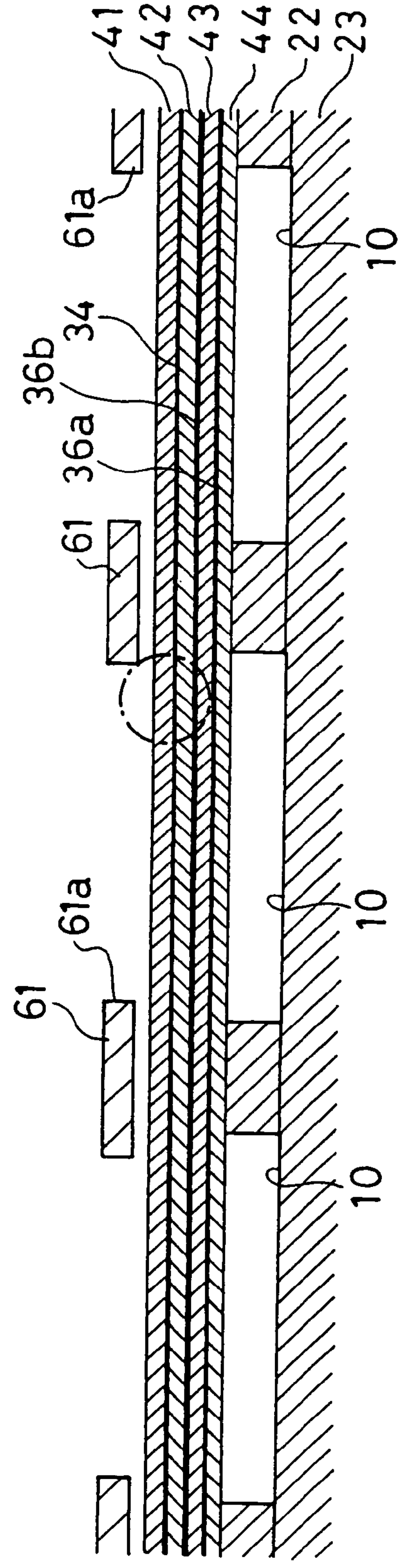
FIG. 16A and FIG. 16B are partial sectional views at individual steps in the course of the manufacture of the ink-jet head shown in FIG. 4 and based on a second manufacture method embodiment of the invention.

Next, a second manufacture method of the inkjet head 1 will be further described with reference to FIG. 16 to FIG. 18. Here, the steps up to the bonding step shown in FIG. 13A are identical, and thus their description has been omitted.

First, from the bonded state shown in FIG. 13A, the marks 55 formed on the cavity plate 22 are optically recognized, and a metal mask 61 is arranged over the piezoelectric sheet 41 with respect to the positions of the recognized marks 55. As shown in FIG. 18, in this metal mask 61, having a number of apertures **61*a* of the same shape as that of the individual electrodes 35 are formed in the same matrix array as that of the individual electrodes 35. The metal mask 61 is positioned by means of a jig on the basis of the marks 55 so that the positions of the apertures 61*a* may be aligned with the positions at which the individual electrodes 35 are to be formed. The apertures 61*a* of the metal mask 61 may be etched in advance by using a photoresist as the mask. A sectional view of the ink-jet head at this time corresponding to FIG. 11 is presented in FIG. 16A, and the partial enlarged view of a region enclosed by an alternate long and short dash line is presented in FIG. 17**A.

Figure 16B:
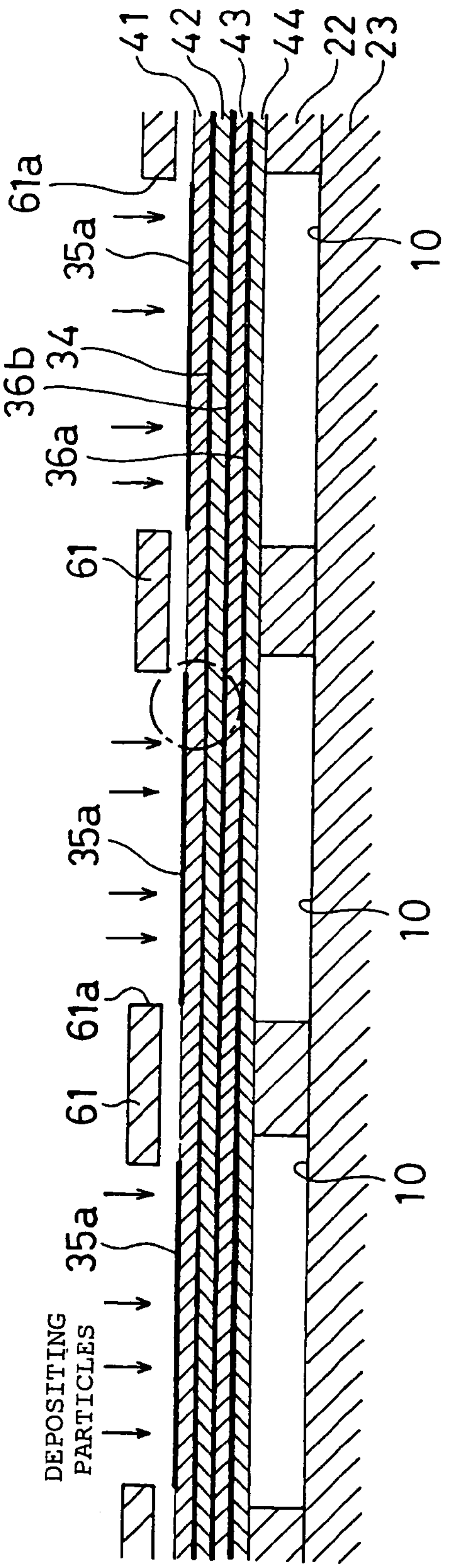
Figure 17A:
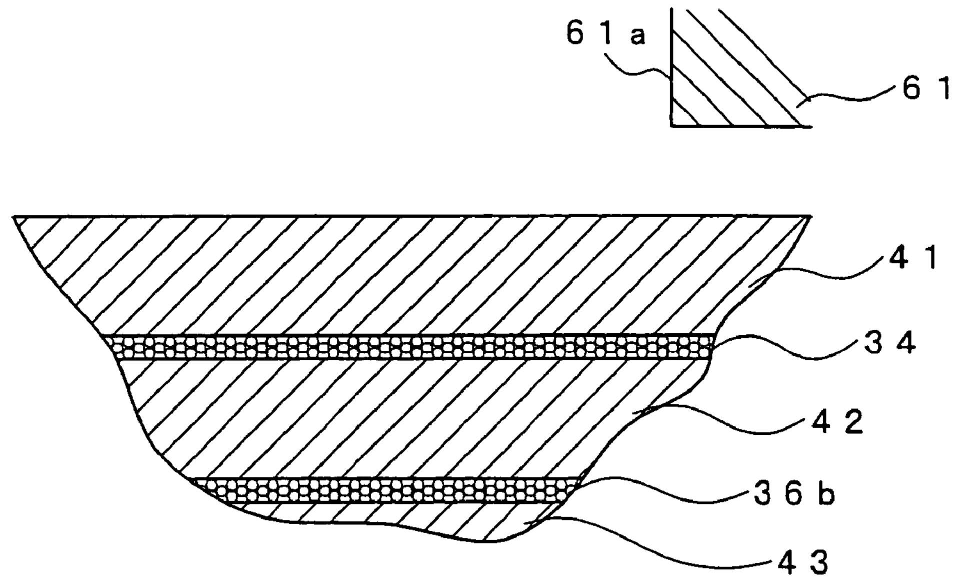
FIG. 17A and FIG. 17B are partial enlarged sectional views of the actuator unit at individual steps in the course of the manufacture of the ink-jet head shown in FIG. 4 and based on the second manufacture method embodiment of the invention.
Figure 17B:
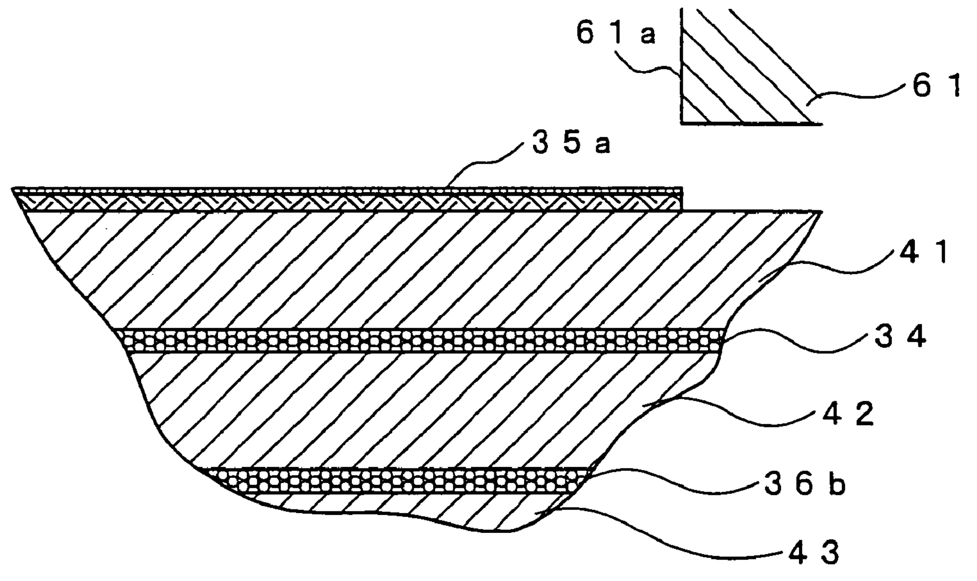
Figure 18:
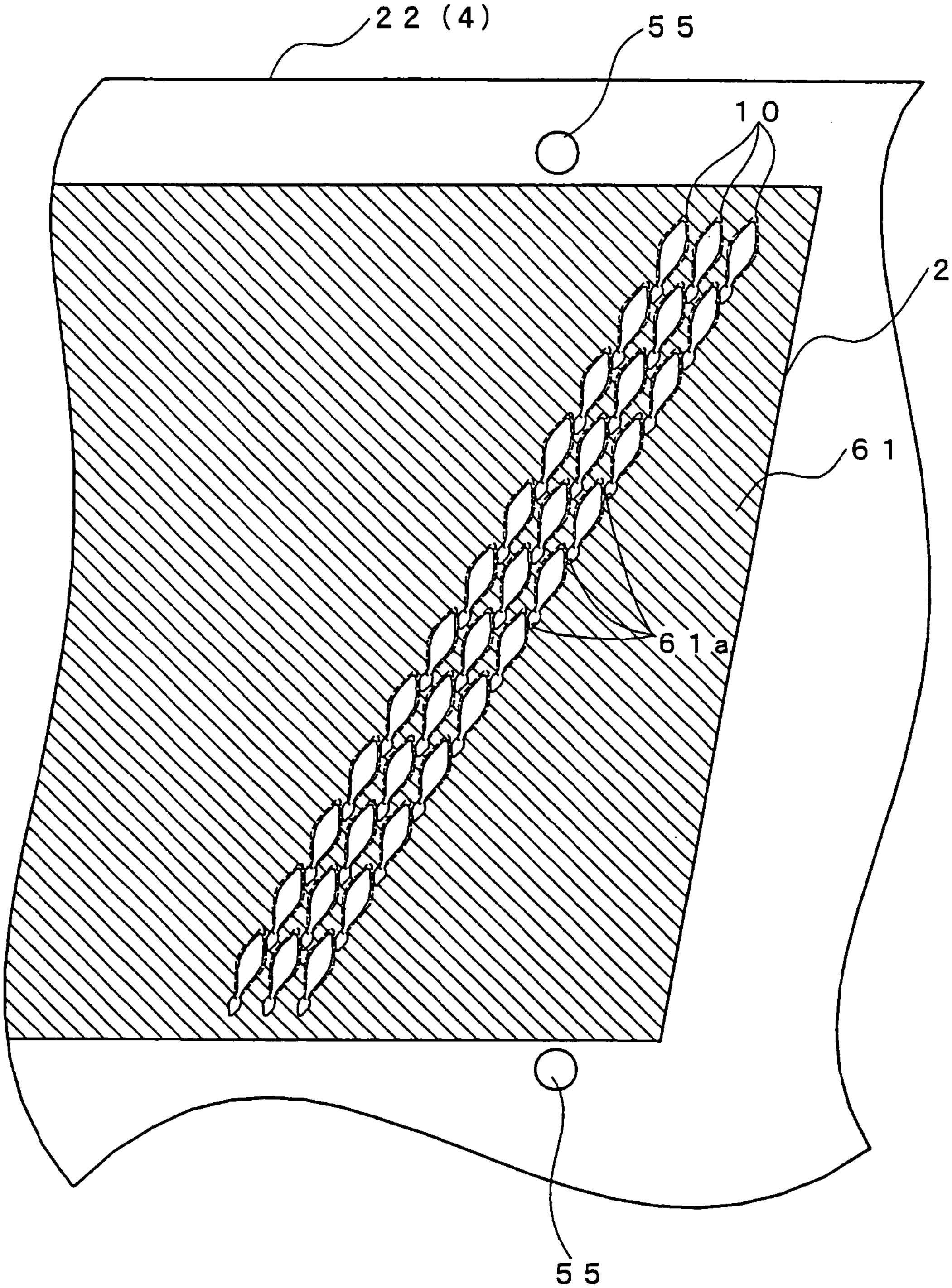
FIG. 18 is a plan view for explaining a region, in which a metal mask is arranged, at a step in the course of the manufacture of the ink-jet head shown in FIG. 4 and based on the second manufacture method embodiment of the invention.

As shown in FIG. 17B or a partial enlarged view of the region enclosed by an alternate long and short dash line of FIG. 16B, conductive films as the individual electrodes 35 are formed in a patter by the PVD (Physical Vapor Deposition) process on the piezoelectric sheet 41 exposed from the apertures **61*a* of the metal mask 61. Here, the individual electrodes 35 may be formed in a pattern by the CVD (Chemical Vapor Deposition) in place of the PVD. Moreover, it is arbitrary to form the Ni of the lower layer and the Au of the surface layer of the conductive film to the individual electrodes 35** by the PVD or to form the lower layer Ni by the PVD and the surface layer Au by plating it.

After this, the manufacture of the ink-jet head 1 is completed by moving the metal mask 61 from over the passage unit 4, applying the FPC 136 for feeding the electric signals to the individual electrodes 35, to the actuator unit 21, and by predetermined steps.

Thus, according to this exemplary manufacture method embodiment, the pattern of the individual electrodes 35 is formed by the PVD process using the metal mask 61 which is arranged based on the marks 55 formed on the passage unit 4 of the pressure chambers 10. As compared with the case in which the actuator unit having the individual electrodes formed in advance is bonded to the passage unit, the positioning precision of the individual electrodes 35 formed on the piezoelectric sheet 41 relative to the pressure chambers 10 is improved. As a result, the homogeneity of the ink ejecting performance is improved to make it easy to elongate the inkjet head 1.

With the individual electrodes 35 formed by the PVD process, no hot treatment is required such as the case in which the pastes are printed. Therefore, the individual electrodes 35 can be formed and patterned after the piezoelectric sheets 41 to 44 and the passage unit 4 are bonded, as described above. Therefore, handling the actuator unit 21 is easy.

Moreover, according to this manufacture method, no consideration need be taken into the heat resisting temperature of the adhesive and the sintering temperature of the conductive paste, unlike the printing case done in the first manufacture method, thereby to widen the range for selecting the materials for the adhesive and the conductive paste.

Here in this manufacture method, only the individual electrodes 35 are formed by the PVD. Unlike the common electrode 34 and the reinforcement metallic films 36*a* and 36*b*, more specifically, the individual electrodes 35 are not sintered together with the ceramics material to be the piezoelectric sheets 41 to 44. Therefore, the individual electrodes 35 exposed to the outside are hardly evaporated by the high-temperature heating at the sintering time. Moreover, the individual electrodes 35 can be formed to have a relatively small thickness by forming them by the PVD. Thus, the individual electrodes 35 in the uppermost layer are thinned in the ink-jet head 1 so that the displacement of the piezoelectric sheet 41 including the active layers is less regulated by the individual electrodes 35 thereby to improve the volume change of the pressure chambers 10 in the ink-jet head 1.

In this manufacture method, the individual electrodes 35 can be formed, for example, by plating them in place of the PVD. In this modification, the photoresist, not the metal mask 61, is applied to the piezoelectric sheet 41. After this, the marks 55 formed on the cavity plate 22 are optically recognized, and the photoresist in the region inside of the inner walls of the pressure chambers are irradiated with a light beam with reference to the positions of the recognized marks 55. After this, a developing liquid is used to remove the photoresist from the inside of the optically irradiated region. As a result, the photoresist has apertures in the same pattern as that of the metal mask 61. Here, the individual electrodes 35 may be formed in a pattern by the PVD by using the photoresist having the apertures as the mask. However, the use of the metal mask is more beneficial than the case of using the photoresist, because the reuse is possible and because the steps can be simplified. It is also possible to use a mask other than the metal mask and the photoresist for forming the individual electrodes and to use not only the positive type but also the negative type for the photoresist.

Figure 19A:
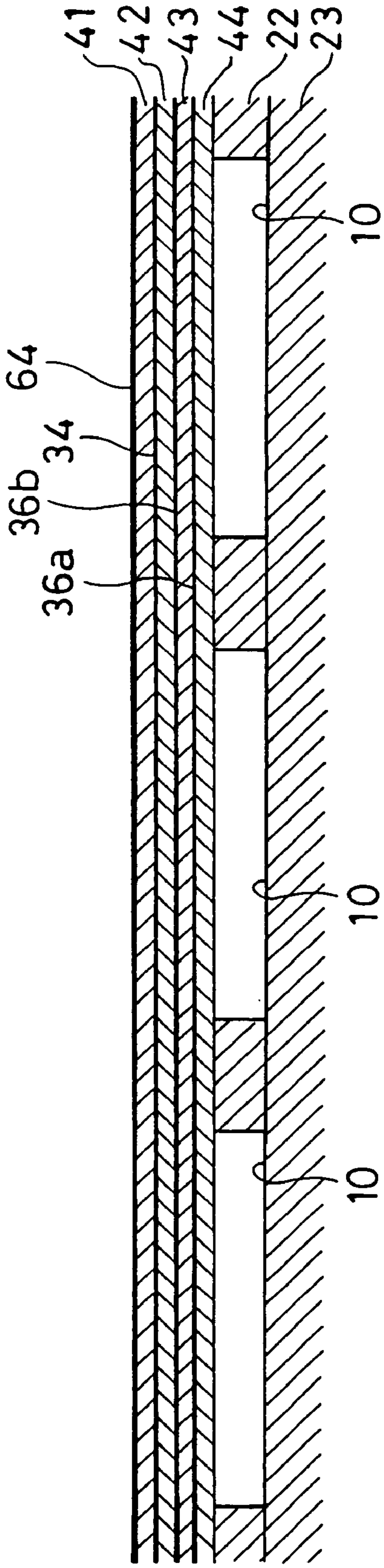
FIG. 19A and FIG. 19B are partial sectional views at individual steps in the course of the manufacture of the ink-jet head shown in FIG. 4 and based on a third manufacture method embodiment of the invention.
Figure 19B:
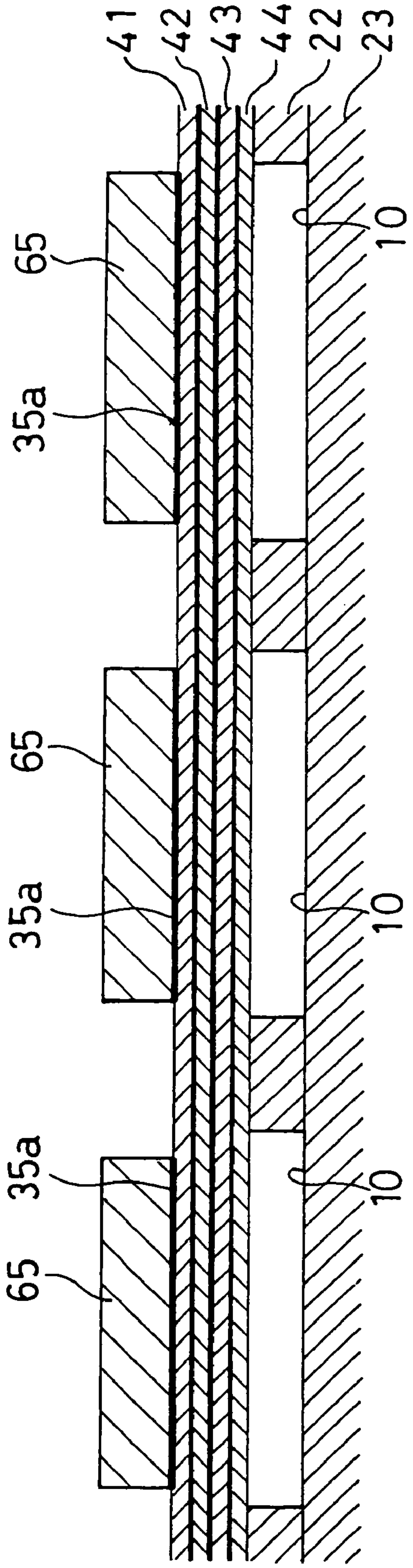
Figure 20:
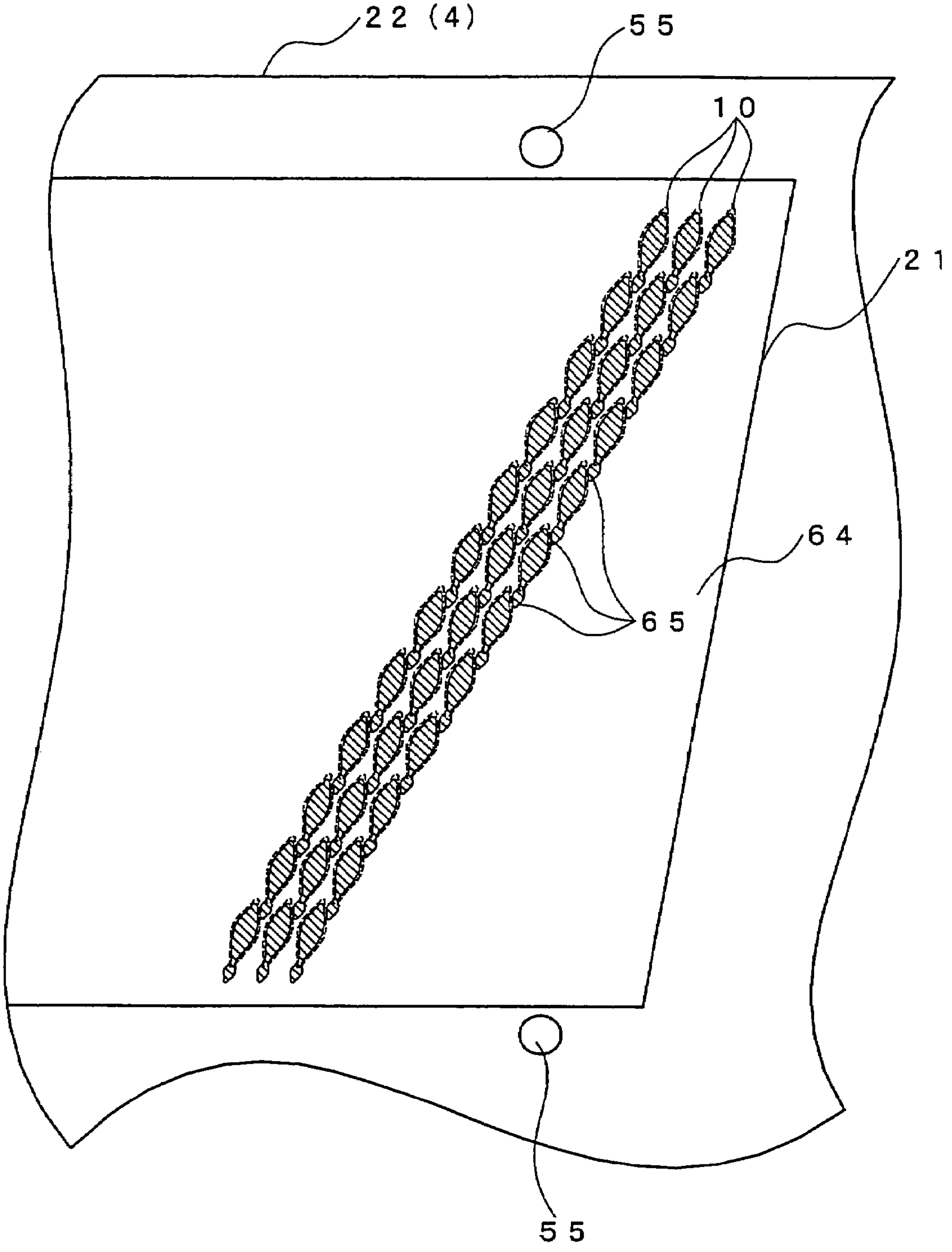
FIG. 20 is a plan view for explaining a region, in which a photoresist is arranged, at a step in the course of the manufacture of the ink-jet head shown in FIG. 4 and based on the third manufacture method embodiment of the invention.

Next, a third manufacture method of the ink-jet head 1 will be further described with reference to FIG. 19 and FIG. 20. Here, the steps up to the bonding step shown in FIG. 13A are identical so that their description will be omitted.

At first, from the bonded state shown in FIG. 13A, a conductive film 64 is formed by the PVD process all over the actuator unit 21 bonded to the passage unit 4. Here, the conductive film 64 may be formed by the CVD or plating process or by printing or sintering the paste in place of the PVD. Here, in case the paste is printed or sintered, it is necessary to consider the heat-resisting temperature of the adhesive, as described above. The sectional view corresponding to FIG. 11 of the ink-jet head at this time is presented in FIG. 19A.

Next, a positive type photoresist 65 is applied to the whole face of the conductive film 64. After this, the marks 55 formed on the cavity plate 22 are optically recognized, and the photoresist 65 outside the region corresponding to rather inside of the inner walls of the pressure chambers 10 is irradiated with a light beam with reference to the positions of the marks 55 recognized. After this, a developing liquid is used to remove the photoresist 65 from the inside of the optically irradiated region. As a result, the photoresist 65 is left as the pattern of the individual electrodes 35 only at the positions corresponding to the respective pressure chambers 10, as also shown in FIG. 20.

After this, the conductive film 64 is etched off from the region which is not covered with the photoresist 65, by using the left photoresist 65 as the etching mask. As a result, the individual electrodes 35 are formed in a pattern on the piezoelectric sheet 41. A sectional view of the ink-jet head at this time is presented in FIG. 19B.

After this, the remaining photoresist 65 is removed, and the FPC 136 for feeding the electric signals to the individual electrodes 35 is attached to the actuator unit 21. Thus, the manufacture of the ink-jet head 1 is completed through further predetermined steps.

Advantages similar to those of the first and second manufacture methods can also be obtained by this third manufacture method.

Next, a modification of the third manufacture method will be described. In this modification, at the step of laminating the piezoelectric sheets 41 to 44 when the actuator unit 21 is to be prepared, a conductive paste, which is to be the reinforcement metallic film 36, is printed in a pattern on a green sheet of a ceramics material to be the piezoelectric sheet 44. In parallel with this, a conductive paste, which is to be the reinforcement metallic film 36*b*, is printed in a pattern on a green sheet of a ceramics material to be the piezoelectric sheet 43, and a conductive paste, which is to be the common electrode 34, is printed in a pattern on a green sheet of a ceramics material to be the piezoelectric sheet 42. Moreover, the conductive film 64 to be the individual electrodes 35 is formed by the PVD or the plating process all over a green sheet of a ceramics material to be the piezoelectric sheet 41. Here, the conductive film need not be formed by the PVD or the plating process, but the conductive paste may be printed all over the face and may then be sintered.

After this, a layered structure is prepared by overlaying the four piezoelectric sheets 41 to 44 while positioning them with a jig and is sintered at a predetermined temperature. As a result, there is formed the layered structure, which has the common electrode 34 formed on the lower face of the piezoelectric sheet 41 at the uppermost layer and the conductive film 64 formed on the upper face of the piezoelectric sheet 41. After this, the layered structure is bonded to the passage unit 4. A sectional view of the ink-jet head at this time, as corresponding to FIG. 11, is identical to FIG. 19A.

After this, the ink-jet head 1 is completed through steps similar to those of the third manufacture method.

Advantages similar to those of the aforementioned first and second manufacture methods can also be obtained by this modification.

Next, an ink-jet head according to the second embodiment of the invention will be described with reference to FIG. 21 and FIG. 22. The ink-jet head according to this embodiment is difference from that of the first embodiment only in the structure of the piezoelectric sheet of the uppermost layer of the actuator unit and the periphery of the same. Therefore, the structure having been described with reference to FIG. 1 to FIG. 8 is substantially common to the ink-jet head of this embodiment. Here in this embodiment, members similar to those of the first embodiment will not be described by designating them by the common reference numerals.

Figure 21:
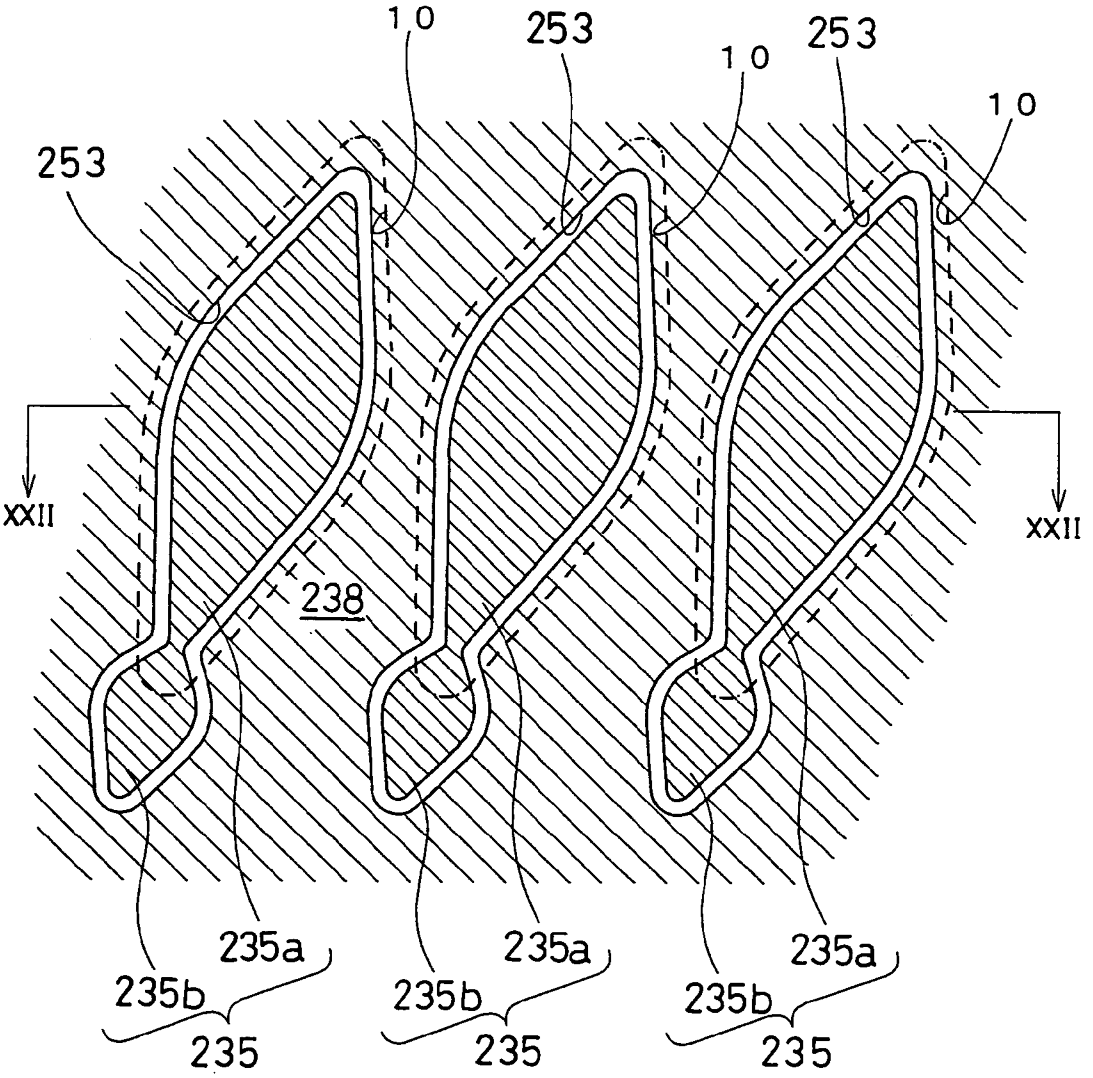
FIG. 21 is an enlarged plan view of an actuator unit in the ink-jet head according to the second embodiment of the invention.
Figure 22:
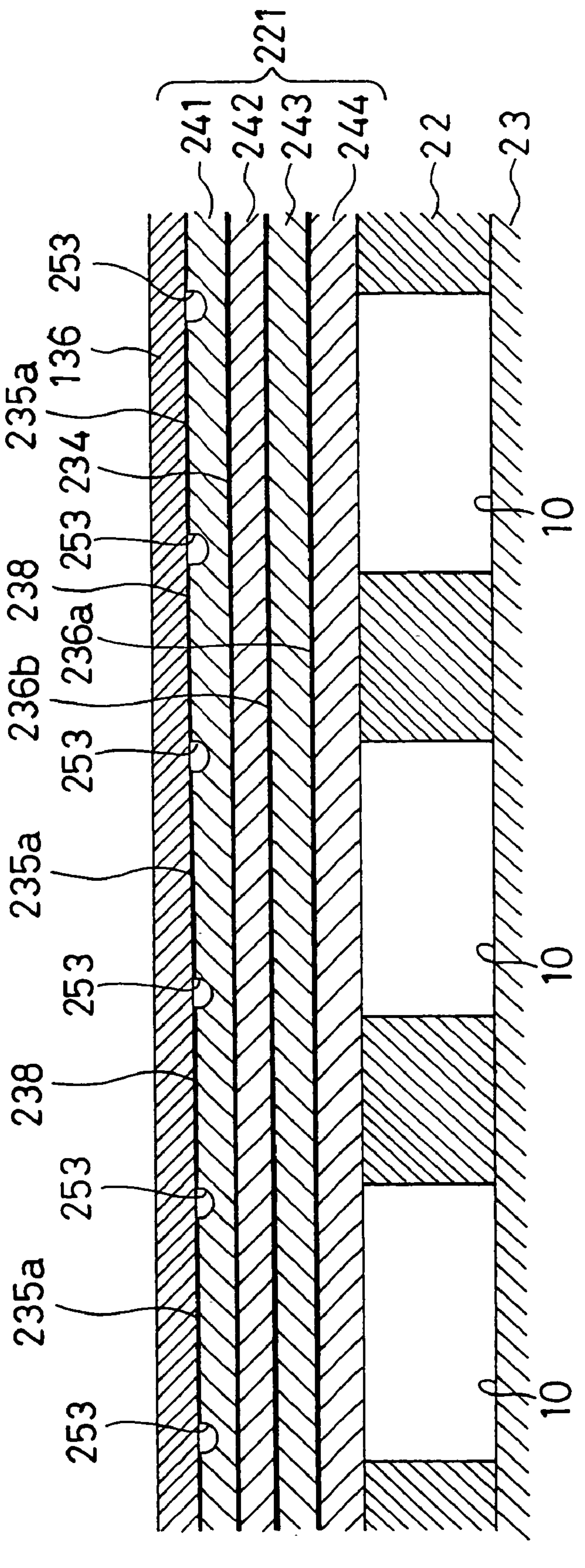
FIG. 22 is a partial sectional view of the ink-jet head taken along line XXII-XXII of FIG. 21.

FIG. 21 is an enlarged plan view of an actuator unit in the ink-jet head according to this embodiment. FIG. 22 is a partial section of the ink-jet head 1 and is taken along line XXII-XXII of FIG. 21. The passage unit contained in the ink-jet head according to this embodiment is constructed like that of the first embodiment. Moreover, an actuator unit 221 contained in the ink-jet head according to this embodiment is common to the actuator unit 221 of the first embodiment in that a common electrode 234 and reinforcement electrodes 236*a* and 236*b* are supported in four laminated piezoelectric sheets 241 to 244. However, the differences from the actuator unit 221 of the first embodiment reside in that grooves 253 are formed along and around the outer edges of individual electrodes 235 (each composed of a main electrode portion 235*a* and an auxiliary electrode portion 235*b*) on the outer face (i.e., on a face facing the opposite direction to the pressure chambers 10) of the piezoelectric sheet 241, and in that the substantially whole region other than the individual electrodes 235 and the grooves 253 of the upper face of the piezoelectric sheet 241.

The conductive film 238 is formed of the same material as that of the individual electrodes 235 and has the same thickness. The grooves 253 for insulating the individual electrodes 235 and the conductive film 238 are formed to have a width of about 30 microns and a thickness of about 5 to 10 microns. By the grooves 253, the affections due to the deformation of the piezoelectric sheet corresponding to a pressure chamber 10 are hardly transmitted to the piezoelectric sheet over the neighboring pressure chamber 10, as will be described later, so that the crosstalk between the neighboring pressure chambers 10 can be reduced.

Thus, in the ink-jet head according to this embodiment, the piezoelectric sheet 241 most distant from the pressure chambers of the actuator unit 221 is a layer containing the active layers. The individual electrodes 235 are formed on the outer face of the actuator unit 221, and the conductive film 238 is so formed on the upper face of the piezoelectric sheet 241 while separated from the individual electrodes 235 as to have the same thickness as that of the individual electrodes 235. This results in no substantial level difference between the regions, in which the individual electrodes 235 are formed, and the remaining region. In case the FPC 136 is bonded by an adhesive not only to the individual electrodes 235 but also to the whole face on the piezoelectric sheet 241 so as to increase the adhesion, therefore, the FPC 136 and the actuator unit 221 are hardly peeled off even if a peeling external force is applied to the FPC 136. As a result, the reliability of the ink-jet head is improved. In addition, advantages similar to those of the aforementioned first embodiment can also be obtained by the ink-jet head of this embodiment.

Next, a method for manufacturing the ink-jet head according to this embodiment will be further described with reference to FIG. 23 to FIG. 27.

Figure 23:
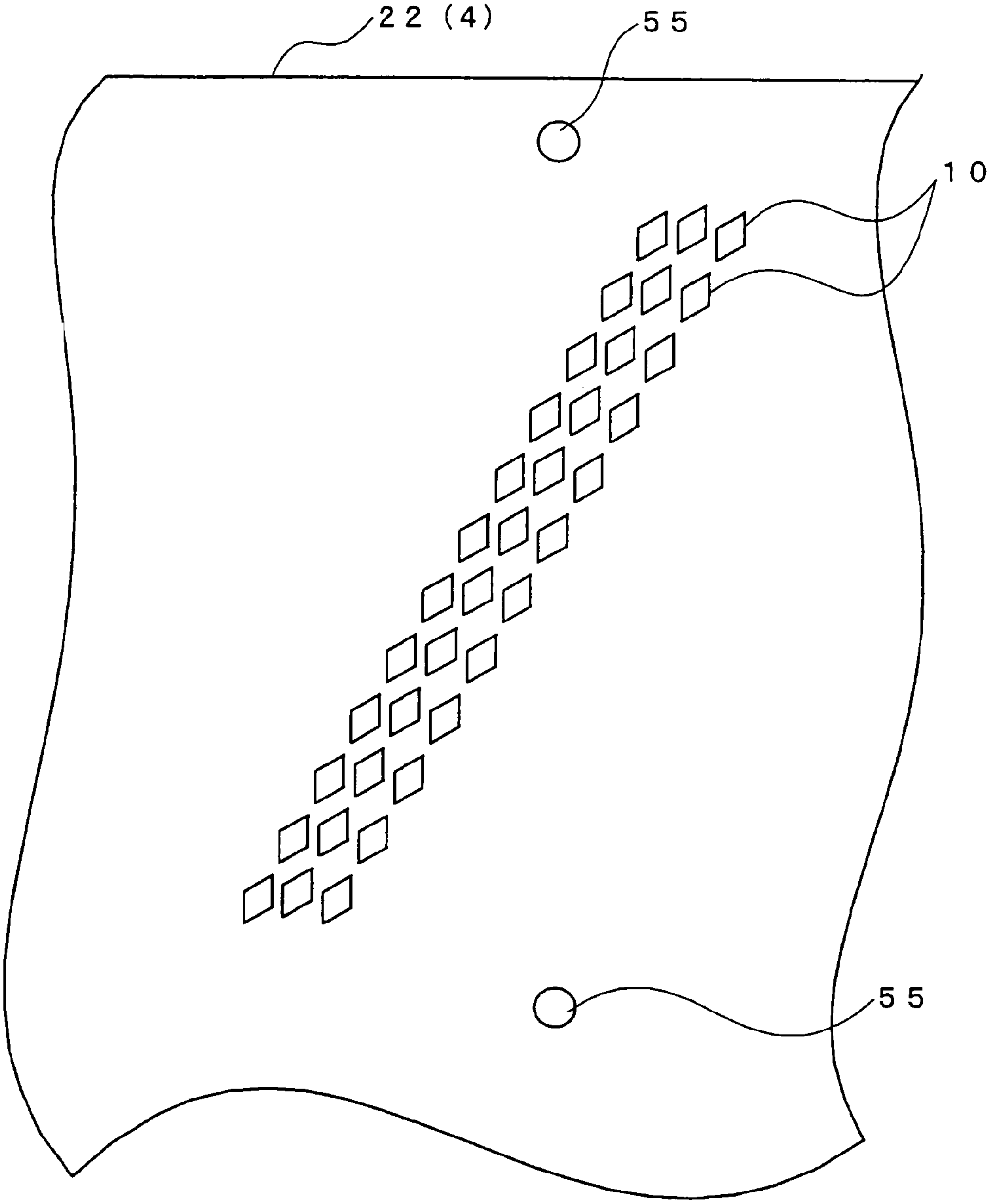
FIG. 23 is a plan view showing a cavity plate, in which marks are formed, at a step in the course of the manufacture of the ink-jet head according to the second embodiment of the invention.
Figure 24:
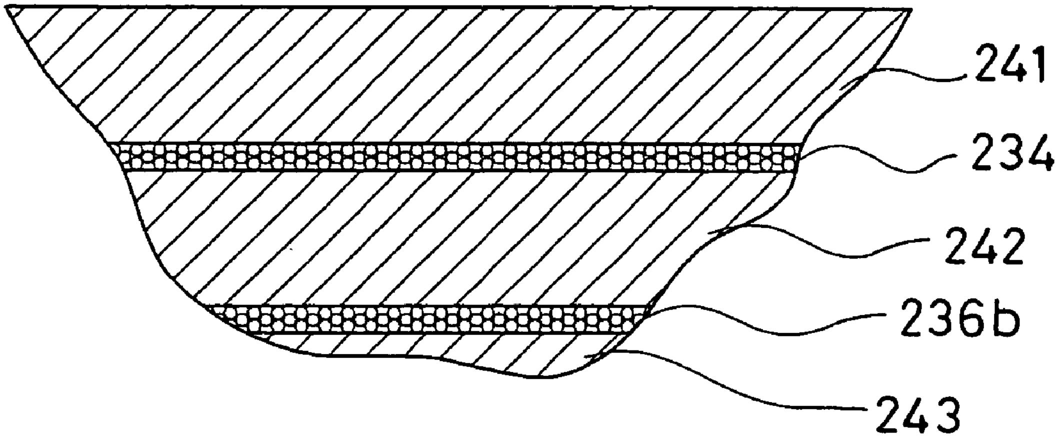
FIG. 24 is a partial enlarged sectional view of an actuator unit at a step in the course of the manufacture of the ink-jet head according to the second embodiment of the invention.

In order to manufacture the ink-jet head, the passage unit 4 and the actuator unit 221 are separately prepared at first in parallel and are then bonded to each other. The passage unit 4 is prepared like that having been described in the first embodiment. At this time, as shown in FIG. 23, the round marks (or the cavity position recognition marks) 55 are formed on the cavity plate 22 at the etching step simultaneous with the formation of the pressure chambers 10. In other words, the cavity plate 22 is etched by using the photoresist having apertures at portions corresponding to the pressure chambers 10 and the marks 55, as the mask. The marks 55 are provided for determining/correcting the tracing positions in the later-described laser beam machining and are formed outside of the ink ejecting region, for example, at a predetermined longitudinal interval of the cavity plate 22 and at two portions spaced in the widthwise direction of the cavity plate 22. The marks 55 may be exemplified by holes or recesses. Here, FIG. 23 shows only some of the numerous pressure chambers 10. In a modification, the marks 55 may be formed at a step different from the etching step of forming the pressure chambers 10, that is, by using another photoresist as the mask.

In order to prepare the actuator unit 221, a conductive paste to be the reinforcement metallic film 236*a* is printed in a pattern on a green sheet of a ceramics material to be the piezoelectric sheet 244. In parallel with this, an electrically conductive paste to be the reinforcement metallic film 236*b* is printed in a pattern on a green sheet of a ceramics material to be the piezoelectric sheet 243, and a conductive paste to be the common electrode 234 is printed in a pattern on a green sheet of a ceramics material to be the piezoelectric sheet 242. After this, a layered structure is prepared by overlaying the four piezoelectric sheets 241 to 244 while positioning them with a jig and is sintered at a predetermined temperature. As a result, a layered structure (or the piezoelectric sheet containing member) is formed which has the common electrode 234 formed on the lower face of the piezoelectric sheet 241 at the uppermost layer but does not have the individual electrodes. A partial enlarged section of the layered structure to be the actuator unit 221 at this time is presented in FIG. 24.

Next, the layered structure thus prepared to be the actuator unit 221 is bonded to the passage unit 4 by means of an adhesive that the piezoelectric sheet 244 and the cavity plate 22 contact with each other. At this time, the two member are bonded on the basis of the positioning marks 55 and 55*a* (as referred to FIG. 27) which are formed on the surface of the cavity plate 22 of the passage unit 4 and on the surface of the piezoelectric sheet 241, respectively. Here, a high precision is not required for this positioning because the individual electrodes are not formed yet on the layered structure to be the actuator unit 221.

After this, the conductive film 238 is formed all over the piezoelectric sheet 241 by the PVD, printing or plating process. The sectional view of the ink-jet head at this time, as corresponding to FIG. 22, is presented in FIG. 25A, and a partially enlarged view of the region, as enclosed by an alternate long and short dash line, is presented in FIG. 26A.

Figure 25A:
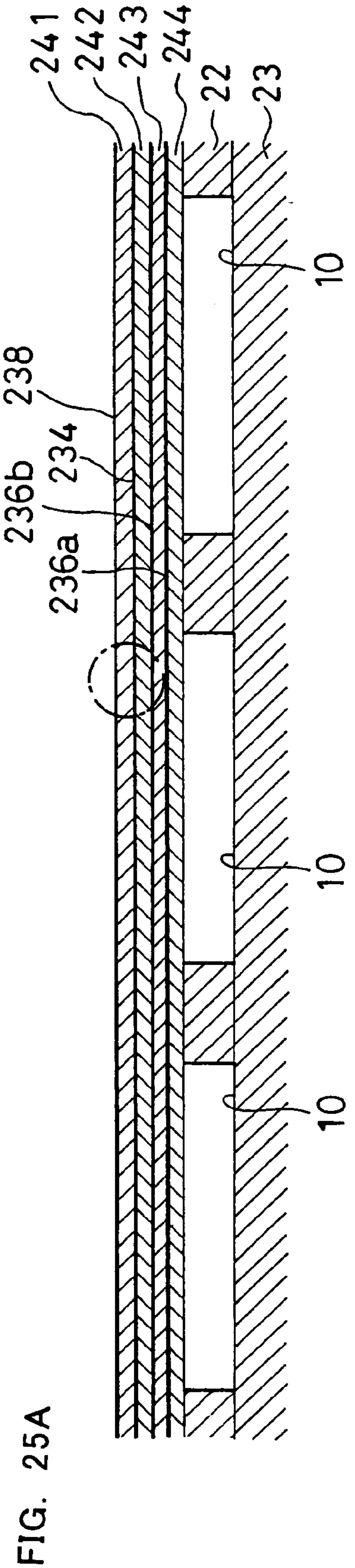
FIG. 25 is a partial sectional view at a step in the course of the manufacture of the ink-jet head according to the second embodiment of the invention.
Figure 25B:
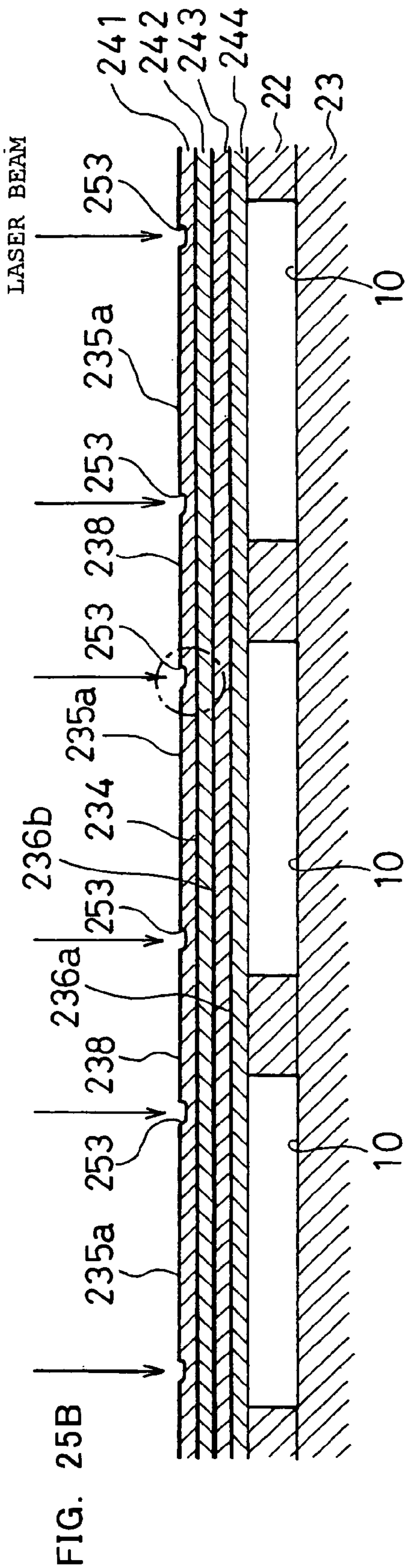
Figure 26A:
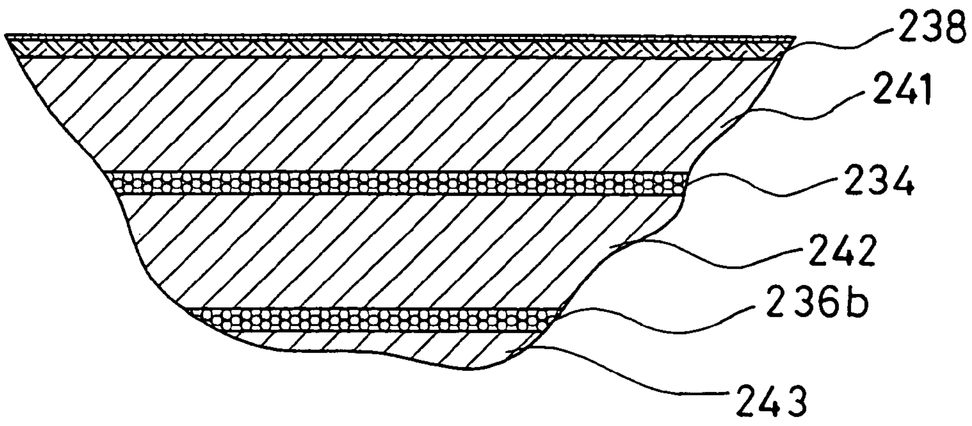
FIG. 26 is a partial enlarged sectional view corresponding to FIG. 25.
Figure 26B:
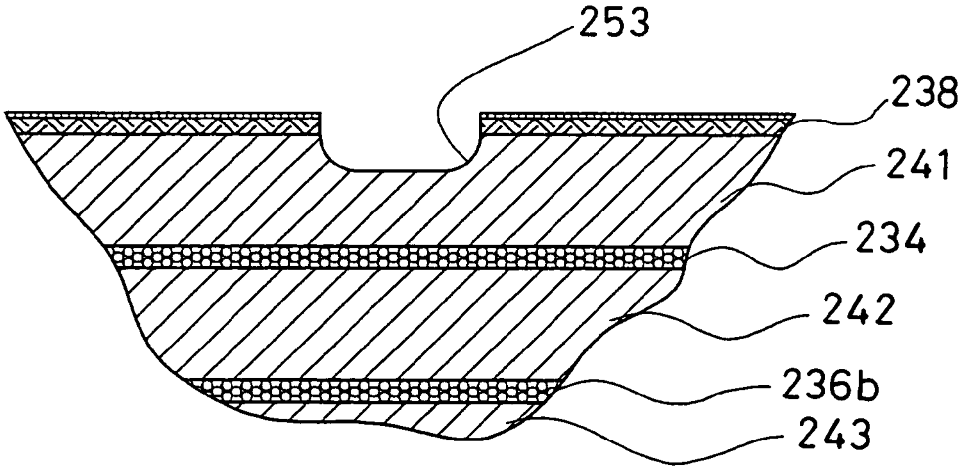
Figure 27:
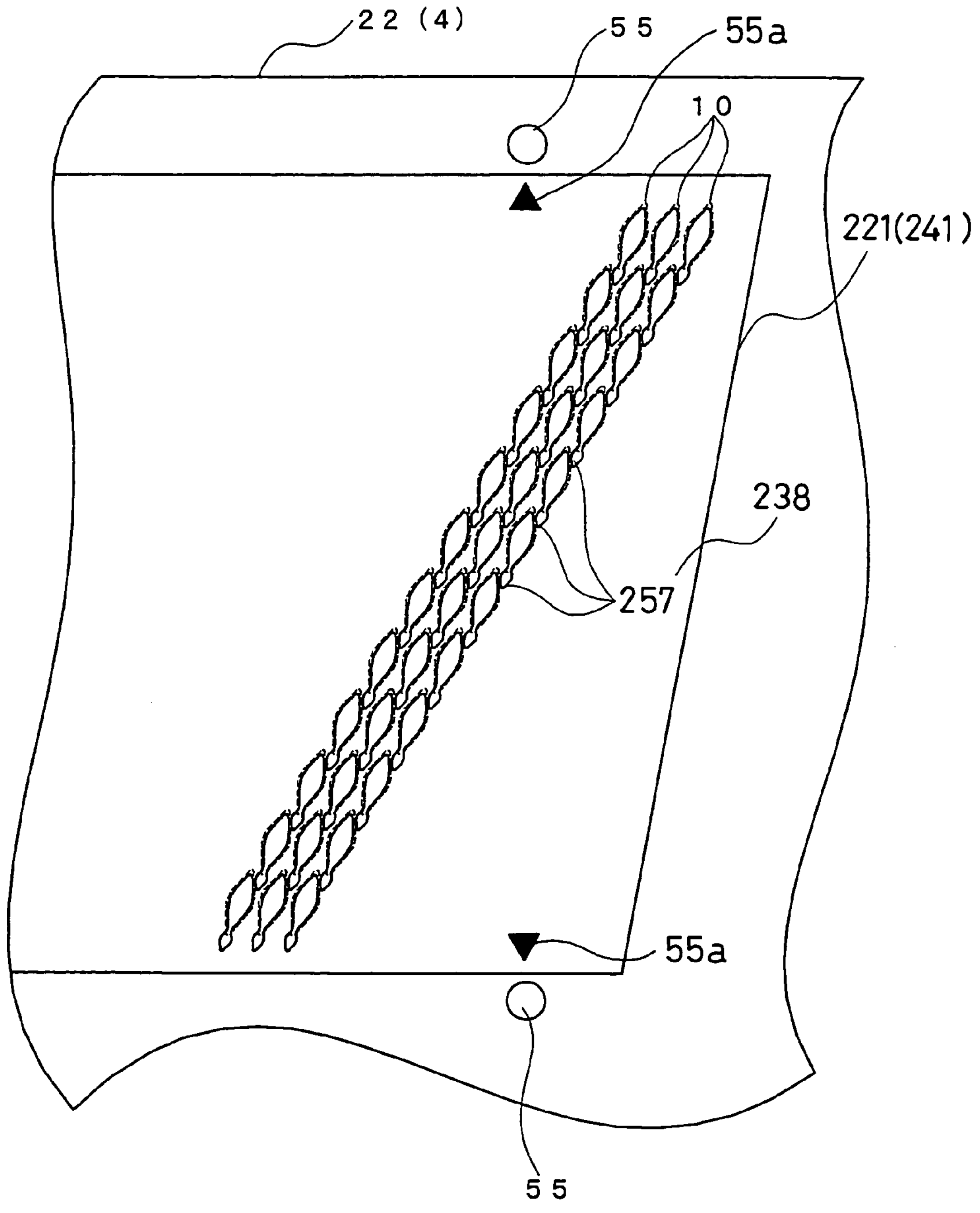
FIG. 27 is a plan view for explaining a region, which is to be irradiated with a laser, at a step in the course of the manufacture of the ink-jet head according to the second embodiment of the invention.

Next, as shown in FIG. 25B and FIG. 27, regions 257 (as indicated by thick lines in FIG. 27) corresponding to the grooves 253, as shown in FIG. 21, of the conductive film 238 on the piezoelectric sheet 241 are exclusively removed by performing a laser beam machining using a YAG laser, for example, while controlling the emanating direction with respect to the marks 55 formed on the cavity plate 22 so that the outer edges or rather insides of the pressure chambers 10 in a plan view may be irradiated with a laser beam. By partially removing the conductive film 238, a pattern of the individual electrodes 235 insulated from the conductive film 238 is formed. A partial enlarged view of the region enclosed at this time by an alternate long and short dash line in FIG. 25B is presented in FIG. 26B.

After this, the FPC 136 for feeding the electric signals to the individual electrodes 35 is bonded to the actuator unit 221, and the manufacture of the ink-jet head 1 is completed through further predetermined steps.

Thus in this embodiment, the pattern of the individual electrodes 235 is formed by the laser beam machining on the basis of the marks 55 formed on the passage unit 4 having the pressure chambers 10. As compared with the case in which the actuator unit having the individual electrodes formed in advance is bonded to the passage unit, therefore, the positioning precision of the individual electrodes 235 formed on the piezoelectric sheet 241 relative to the corresponding pressure chambers 10 is improved. As a result, the ink ejecting performance has an excellent homogeneity so that the ink-jet head 1 is easily elongated. Unlike the ink-jet head 1 of this embodiment in which a plurality of actuator units 221 are provided and arrayed in the longitudinal direction of the passage unit 4, it is possible to use only one actuator unit 221 which is as long as the passage unit 4.

Moreover, in cases where the conductive film 238 is formed by the PVD or the like, no hot treatment is required, which is different than the case in which the paste is printed. Therefore, the conductive film 238 can be formed and patterned after the piezoelectric sheets 241 to 244 and the passage unit 4 are bonded, as described above. Therefore, it is very easy to handle the actuator unit 221.

In the manufacture method of the ink-jet head according to this embodiment thus far described, the individual electrodes are not formed between the adjoining piezoelectric sheets 241 to 244 when these piezoelectric sheets are laminated, that is, only the piezoelectric sheet 241 most distant from the pressure chambers 10 is a layer containing the active layers. Therefore, the through holes for connecting the individual electrodes overlapping one another in a plan view need not be formed in the piezoelectric sheets 241 to 244. As described above, therefore, the ink-jet head according to this embodiment can be manufactured at a low cost by the relatively simple steps.

In this embodiment, the four piezoelectric sheets 241 to 244 are laminated so that only the uppermost piezoelectric sheet 241 is a layer containing the active layers whereas the remaining three piezoelectric sheets 242 to 244 are inactive layers. According to the ink-jet head 1 thus manufactured, the volume change of the pressure chambers 10 can be made relatively large, as described above. Therefore, it is possible to lower the drive voltage of the individual electrodes 235 and to reduce the size and raise the integration of the pressure chambers 10.

Further, in this embodiment, the grooves 253 having a depth of about ⅓ to ⅔ of the thickness of the piezoelectric sheet 241 are formed in the sheet 241 by performing the laser beam machining consecutively even after the conductive film 238 is removed. By thus forming the grooves 253 along the outer edges of the individual electrodes 235 between the individual electrodes 235 and the conductive film 238, the affections due to the deformation of the piezoelectric sheet corresponding to a pressure chamber 10 are hardly transmitted to the piezoelectric sheet over the neighboring pressure chamber 10, as will be described later, so that the crosstalk between the neighboring pressure chambers 10 can be reduced.

In this embodiment, moreover, the conductive film 238 other than the portions corresponding to the grooves 253 is not removed. In case the FPC 136 is bonded by an adhesive not only to the individual electrodes 235 but also all over the piezoelectric sheet 241 so as to strengthen the adhesion, as described above, the conductive film 238 having substantially the same thickness as that of the individual electrodes 235 locates in the regions other than the individual electrodes 235 so that no substantial level difference is made between the regions, in which the individual electrodes 235 are formed, and the remaining region. Even if a peeling external force is applied to the FPC 136, therefore, the FPC 136 and the actuator unit 221 are hardly peeled off to provide an advantage that the reliability of the ink-jet head is improved. In the embodiment, if the FPC 136 is adhered to the main electrode portion 235*a*, the deformations of the actuator unit 221 and the pressure chambers 10 may be obstructed. Therefore, the FPC 136 is not bonded to the main electrode portion 235*a* of each individual electrode 235.

Here in this embodiment, the conductive film 238 other than the individual electrodes 235 is left at the time of the laser beam machining. In a modification, however, the conductive film 238 other than the regions to be the individual electrodes 235 may be completely removed. Here, the removal of the conductive film 238 other than the regions to be the individual electrodes 235 need not be positively performed not only because the aforementioned advantage is lost but also because the working time is elongated to raise the cost.

In this embodiment, moreover, subsequent to the removal of the conductive film 238, the piezoelectric sheet 241 of the uppermost layer is partially removed to form the grooves 253, which are not essential. So long as the common electrode 234 is not isolated, moreover, the grooves 253 may extend to or lower than the piezoelectric sheet 242 of the second layer. As the grooves 253 are formed the deeper, the crosstalk suppressing effect becomes the higher.

Further, in this embodiment, the conductive film 238 is formed after the actuator unit 221 and the passage unit 4 are bonded. However, the passage unit 4 may be bonded after the conductive film 238 is formed on the actuator unit 221 by the PVD.

Next, here will be described an ink-jet head according to a third embodiment of the invention. At first, the ink-jet head 301 according to this embodiment will be described on its schematic construction with reference to FIG. 28 to FIG. 30.

Figure 28:
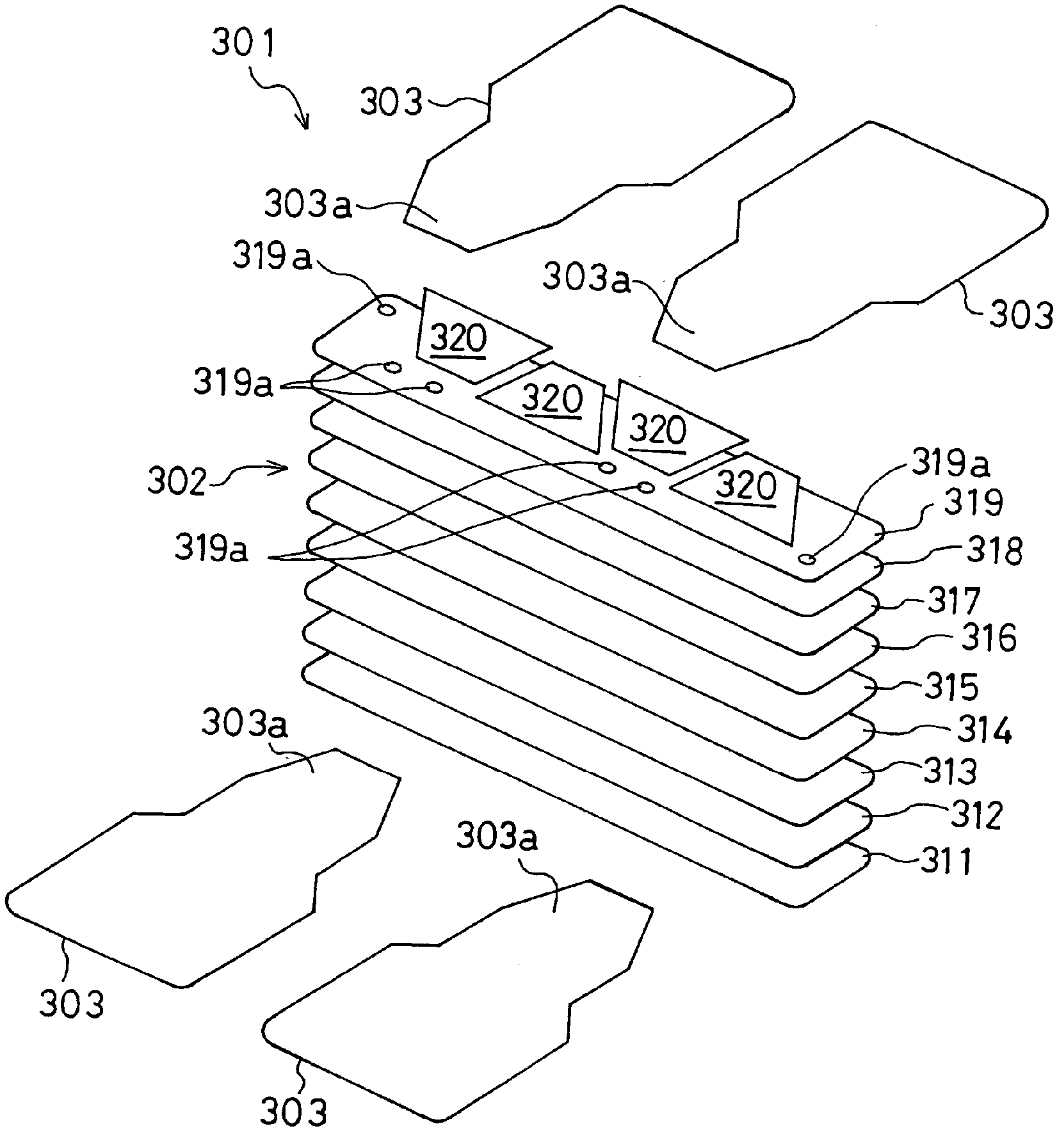
FIG. 28 is an expanded perspective view of an ink-jet head according to a third embodiment of the invention.
Figure 29:
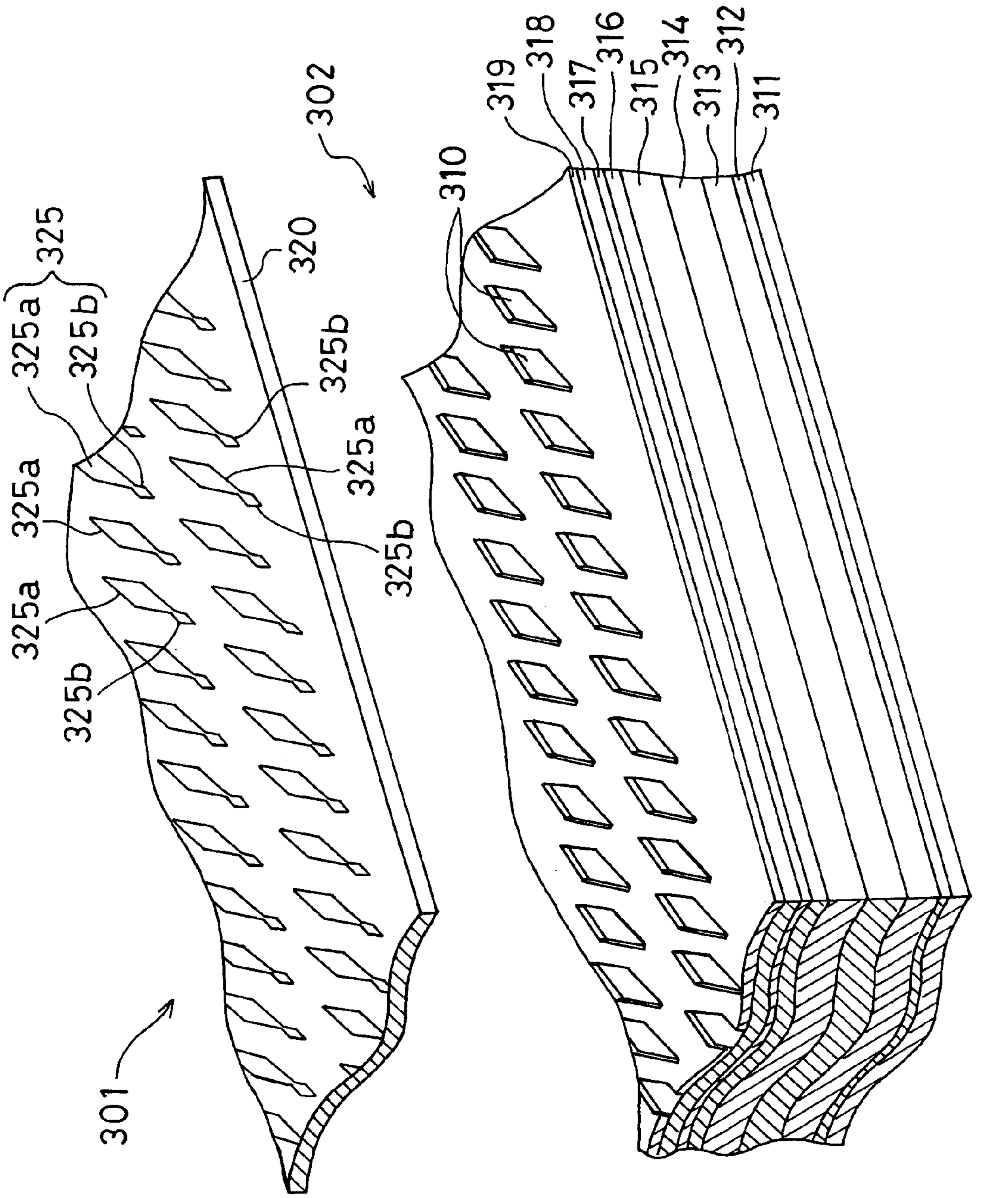
FIG. 29 is an expanded perspective view of portions of a passage unit and an actuator unit in the ink-jet head shown in FIG. 28.

As shown in FIG. 28 to FIG. 30, the ink-jet head 301 includes four actuator units 320 (as referred to FIG. 31 to FIG. 36) formed of a plate type, having a generally trapezoidal shape in a plan view. Actuator units 320 are laminated in two staggered shape on a passage unit 302 having a laminated structure of thin metallic sheets formed in a generally rectangular shape. On each upper side of the actuator units 320, electrode-patterned portions 303*a* are placed which are formed at the leading end regions of FPCs 303 and electrically connected to the actuator units 320 by soldering. These electrode-patterned portions 303*a* are formed into a generally trapezoidal shape substantially identical in a plan view to that of the actuator units 320.

Each actuator unit 320 is arranged to have its parallel opposite sides (i.e., upper and lower sides) in the longitudinal direction of the passage unit 302. The oblique sides of the adjoining actuator units 320 overlap each other in the widthwise direction of the passage unit 302. On the surface of the passage unit 302 on which the actuator units 320 are to be laminated, pressure chambers 310 formed generally in a rhombic shape are arrayed in a matrix so as to correspond to the printing density required. These rows of respective pressure chambers 310 are arranged in such a high density that their acute portions may be sandwiched between the two pressure chambers 310 of another row.

Figure 30A:
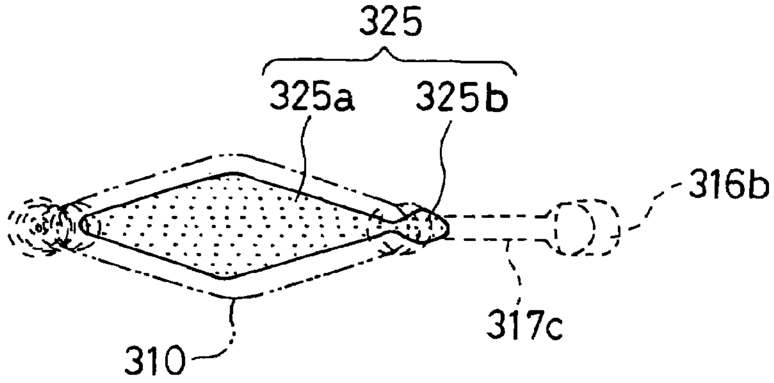
FIG. 30A is a plan view of a pressure chamber and an individual electrode in the ink-jet head shown in FIG. 28.
Figure 30B:
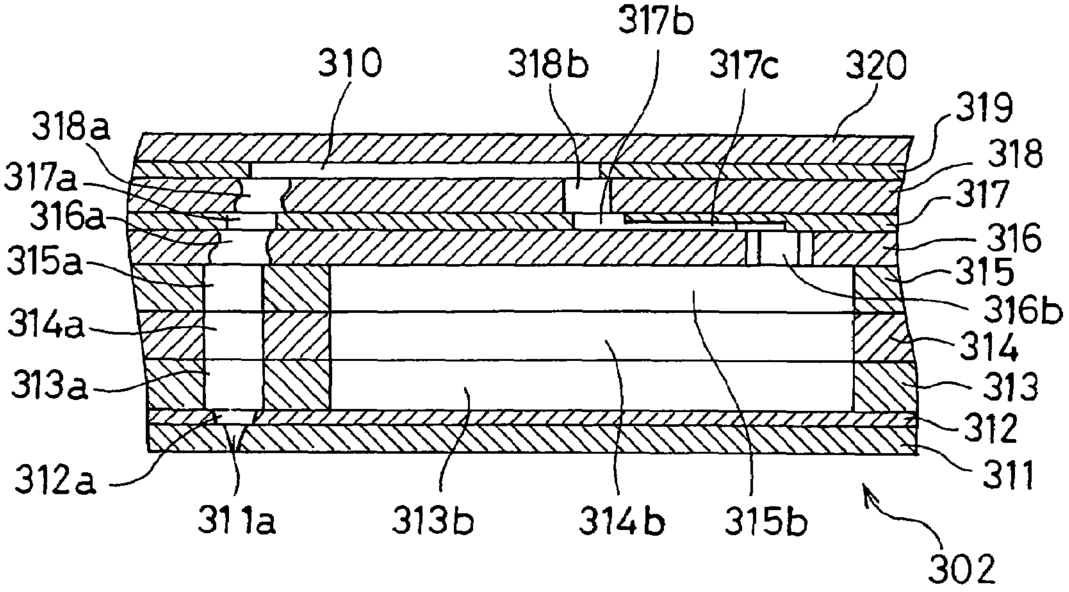
FIG. 30B is a partial longitudinal section of the ink-jet head shown in FIG. 28.

Moreover, the passage unit 302 has a nine-layered structure in which nine generally rectangular metal sheets are laminated. As shown in FIG. 30B, the passage unit 302 has a structure, in which a cover plate 312, three manifold plates 313, 314 and 315, a supply plate 316, an aperture plate 317, a spacer plate 318, and a cavity plate 319 are laminated from the lower layer nine thin metal sheets of a nozzle plate 311.

As shown in FIG. 28, each region of the passage unit 302 having no actuator unit 320 is provided with pairs of ink introduction ports 319*a*, which are staggered in the longitudinal direction and confronted by the upper side of each actuator unit 320 and which are to be fed with ink. Each actuator unit 320 at each two transverse end portions is also provided with one ink introduction port 319*a* at a position near the outer side of its lower side. Each ink introduction port 319*a* is provided at the lower end of the cavity plate 319 with the not-shown filter, which has a number of fine through holes formed for preventing the dust in ink from invading it. Moreover, each ink introduction port 319*a* communicates with the later-described ink manifold passage, which is formed by the respective manifold plates 313, 314 and 315 so that the ink is fed to the ink manifold passage.

In the nozzle plate 311, as shown in FIG. 30B, a number of ink ejection ports 311*a* having a minute diameter are formed. In the cover plate 312, a number of through holes 312*a* or ink passages of a minute diameter are formed, which are positioned to confront and communicate with the individual ink ejection ports 311*a* and which form one of the later-described ink manifold passages formed by the respective manifold plates 313, 314 and 315.

In the manifold plate 313, a number of through holes 313*a* or ink passages of a minute diameter are formed and positioned to communicate with the through holes 312*a*. A plurality of rows of grooved holes 313*b* extending in the longitudinal direction and along the respective rows of the pressure chambers 310 and forming parts of the ink manifold passages are also formed in plate 313.

In the manifold plate 314, a number of through holes 314*a* or ink passages of a minute diameter are formed and positioned to communicate with the through holes 313*a*. A plurality of rows of grooved holes 314*b* extending in the longitudinal direction and along the respective rows of the pressure chambers 310 and forming parts of the ink manifold passages are also formed in the manifold plate 314.

In the manifold plate 315, a number of through holes 315*a* or ink passages of a minute diameter are formed and positioned to communicate with the through holes 314*a*. A plurality of rows of grooved holes 315*b* extending in the longitudinal direction and along the respective rows of the pressure chambers 310 and forming parts of the ink manifold passages are also formed in the manifold plate 315.

In the supply plate 316, a number of through holes 316*a* or ink passages of a minute diameter are formed and positioned to communicate with the through holes 315*a*. In the diagonal direction opposed to the acute portions of the pressure chambers 310 with respect to the through holes 316*a* of the supply plate 316 and at positions near the side end edge portions of the holes 315*b* (or at positions of the righthand end edge portions in FIG. 30B), a number of through holes 316*b*, which communicate with the ink manifold passages thereby to form feed passages of ink are also formed.

Thus, there are longitudinally formed rows of ink manifold passages, which are defined by the upper face of the cover plate 312, the respective grooved holes 313*b*, 314*b* and 315*b* and the bottom face of the supply plate 316 and which act as the common ink chamber for feeding ink to the respective pressure chambers 310.

The aperture plate 317 is provided with a number of through holes 317*a* or ink passages of a minute diameter communicating with the through holes 316*a*. This aperture plate 317 is provided with a through hole 317*b*, which is formed at a position on the lower side of an ink feeding acute portion of each pressure chamber 310, and an aperture 317*c* or a grooved recess, which is formed in the bottom face portion and extends from the lower end portion of the through hole 317*b* to a position to confront the through hole 316*b*. Aperture 317*c* has a depth about one half as large as the thickness of the aperture plate 317.

The spacer plate 318 is provided with a number of through holes 318*a* which communicate with the respective through holes 317*a*. Moreover, the spacer plate 318 is provided with a number of through holes 318*b* which communicate with the respective through holes 317*b*.

In the cavity plate 319, numerous pressure chambers 310 having a generally rhombic shape are formed. Moreover, the respective through holes 318*a* and 318*b* formed in the spacer plate 318 are arranged to confront the respective acute portions of the pressure chambers 310. Pressure chambers 310 are closed on their upper faces by the respective actuator units 320 laid over the upper side.

As shown in FIG. 29, individual electrodes 325 are formed on the upper face of the actuator unit 320. Each individual electrode 325 is composed of a main electrode portion 325*a* and an auxiliary electrode portion 325*b*. The main electrode portion 325*a* is positioned to correspond to each pressure chamber 310 and has a generally similar and rhombic shape slightly smaller than the projected shape of the rhombic pressure chamber 310. As shown in FIG. 30A, the auxiliary electrode portion 325*b* is extended continuously from the acute portion of the main electrode portion 325*a*, corresponding to the ink feeding acute portion of the pressure chamber 310, to a position corresponding to the outer region of the pressure chamber 310, and is given a generally rhombic shape. Here, the upper portion 328*a* of the later-described conductive film 328 and the groove 330 are omitted from FIG. 29 so that the illustration may be clearer.

Next, the detailed structure of the actuator unit 320 will be described with reference to FIG. 31 and FIG. 32. On the upper face of the actuator units 320, there are arranged the main electrode portion 325*a* and the auxiliary electrode portion 325*b* of a thickness of about 1.1 microns, which are opposed to each pressure chamber 310. Moreover, each auxiliary electrode portion 325*b* is formed at its almost region on an outer position of the pressure chamber 310.

The region of the upper face of the actuator unit 320 other than the individual electrode 325 formed of the main electrode portion 325*a* and the auxiliary electrode portion 325*b* is almost covered with the upper portion 328*a* (acting as the surface electrode) of a conductive film 328, which is made of the same material having the same thickness as those of that individual electrode 325. Each individual electrode 325 and the upper portion 328*a* of the conductive film 328 are insulated by a groove 330, which is so formed in the surface of the actuator unit 320 along the outer edge of that individual electrode 325 to have a width of about 30 microns and a depth of about 5 to 10 microns. The interference between the neighboring active layers can be reduced by that groove 330 thereby to suppress the occurrence of the crosstalk.

Figure 32:
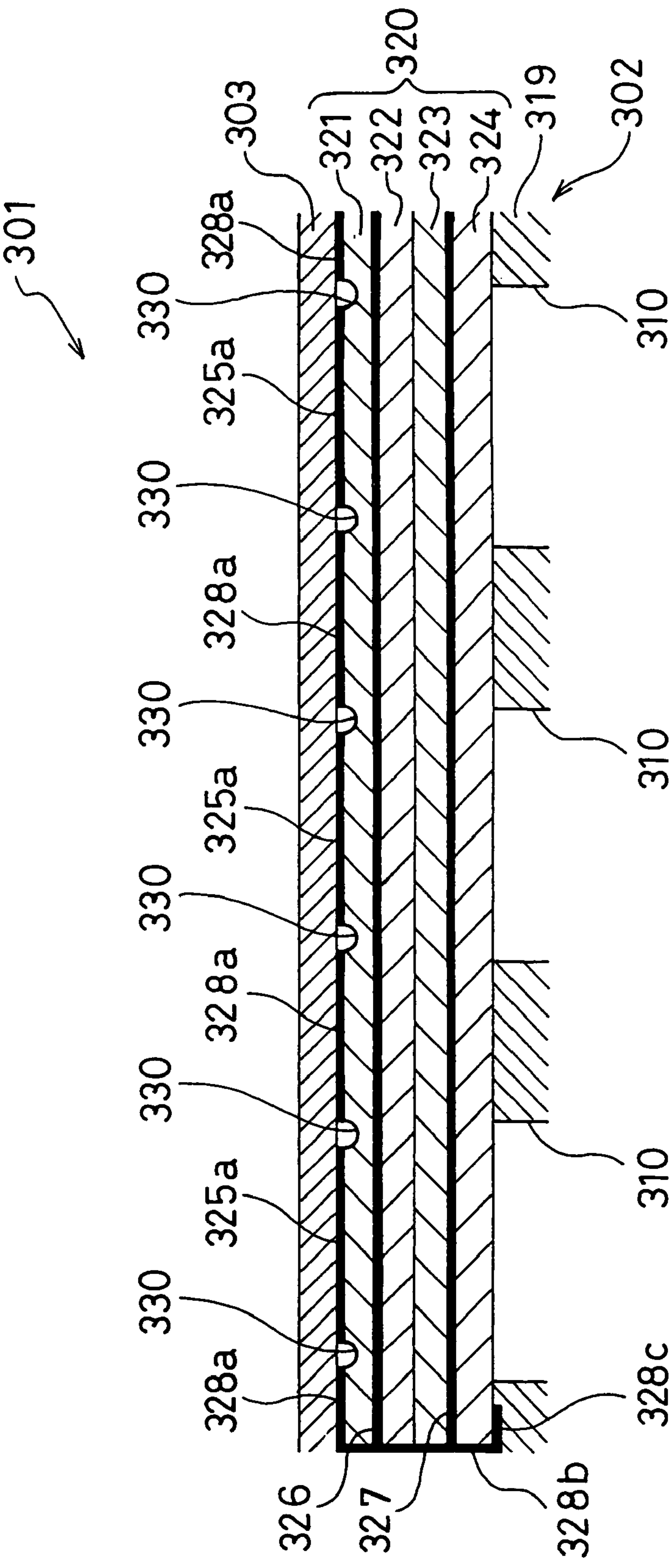
FIG. 32 is a partial sectional view of the ink-jet head and taken along line XXXII-XXXII of FIG. 31.

As shown in FIG. 32, the actuator unit 320 is formed into a structure, in which four piezoelectric sheets 321, 322, 323 and 324 formed into a generally trapezoidal shape in a plan view and having a thickness of about 14 microns are laminated. On the upper face of the piezoelectric sheet 321, there are formed the individual electrodes 325, each of which is composed of the main electrode portion 325*a* located at the position corresponding to each pressure chamber 310 and having a generally rhombic shape slightly smaller than and generally similar to the projected shape of the pressure chamber 310, and the auxiliary electrode portion 325*b* having a generally rhombic shape and extended continuously from the acute portion of the main electrode portion 325*a* to a position corresponding to the outer part of the pressure chamber 310.

Substantially all over the upper face of the piezoelectric sheet 322, there is formed a common electrode 326, which has a thickness of about 2 microns. The common electrode 326 is extended to the two transverse side faces (or the side faces corresponding to the two oblique sides of the actuator unit 320), so that it is exposed from the side face of the actuator unit 320. No electrode is formed on the upper face of the piezoelectric sheet 323.

Substantially all over the upper face of the piezoelectric sheet 324, there is formed of a reinforcement electrode 327, which has a thickness of about 2 microns. The reinforcement electrode 327 is extended to the two transverse side faces (or the side faces corresponding to the two oblique sides of the actuator unit 320), so that it is exposed from the side face of the actuator unit 320. Here, the reinforcement electrode 327 need not always be exposed to the outside.

Figure 34A:
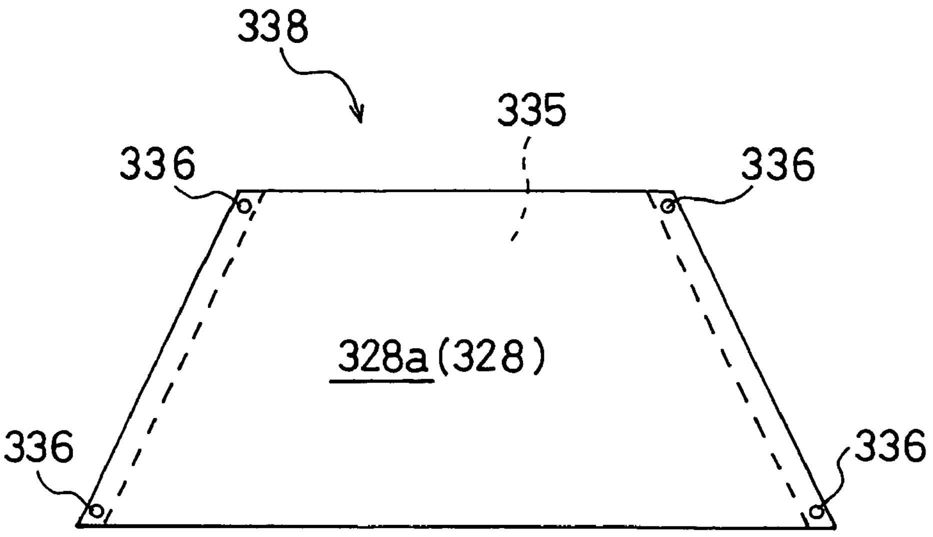
FIG. 34A, FIG. 34B and FIG. 34C are a plan view, a front elevation and a bottom view of a layered structure to be the actuator unit, respectively.
Figure 34B:
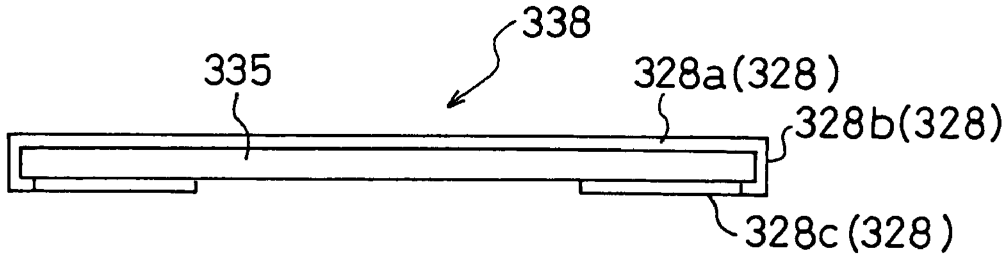
Figure 34C:
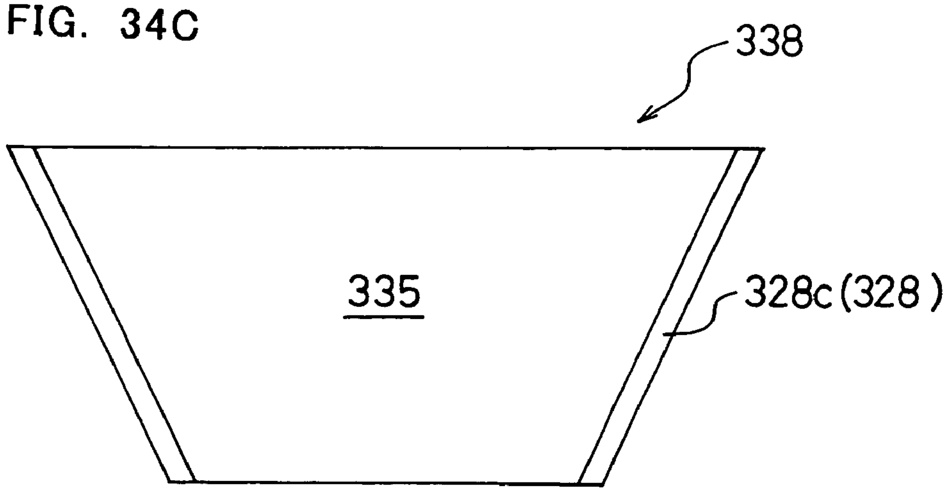

As shown in FIG. 32 and FIG. 34, the two transverse side faces (or the side faces corresponding to the two oblique sides) of the actuator unit 320 are covered with the side portion 328*b* of the conductive film 328, which is extended from the upper face of the actuator unit 320 to the transverse side faces. As a result, the common electrode 326 and the reinforcement electrode 327 are held in contact and connected with the conductive film 328. Further, this conductive film 328 is extended to the lower face of the actuator unit 320 so as to have a lower portion 328*c*, which covers that region of the actuator unit 320, which does not face or confront the pressure chamber 310. As shown in FIG. 31, however, that end portion of the lower portion 328*c*, which is the closest to the pressure chamber 310, is rather spaced from the pressure chamber 310. This spacing is made to prevent the conductive film 328 from being corroded with ink.

On the upper face of the actuator unit 320, there is arranged the FPC 303, which is extended from the driver IC. The FPC 303 feeds the drive voltage to the main electrode portion 325*a* and the common electrode 326 through the auxiliary electrode portion 325*b* and the conductive film 328, respectively. When the drive voltage is fed to the main electrode portion 325*a* and the common electrode 326, the piezoelectric sheets 321 to 324 of the actuator unit 320 can be deformed to apply a pressure to the ink in the corresponding pressure chamber 310 of the passage unit 302.

The ink fed from the ink manifold passages, which are defined by the upper face of the cover plate 312, the respective grooved holes 313*b*, 314*b* and 315*b* and the bottom face of the supply plate 316, flows into the pressure chamber 310 through the through hole 316*b*, the aperture 317*c*, the through hole 317*b* and the through hole 318*b*. When the drive voltage is applied between the main electrode portion 325*a* and the common electrode 326 through the FPC 303, moreover, the actuator unit 320 is deformed toward the pressure chamber 310 so that the ink is expelled from the pressure chamber 310 and ejected from the ink ejection port 311*a* through the respective through holes 318*a* to 312*a*.

Figure 33:
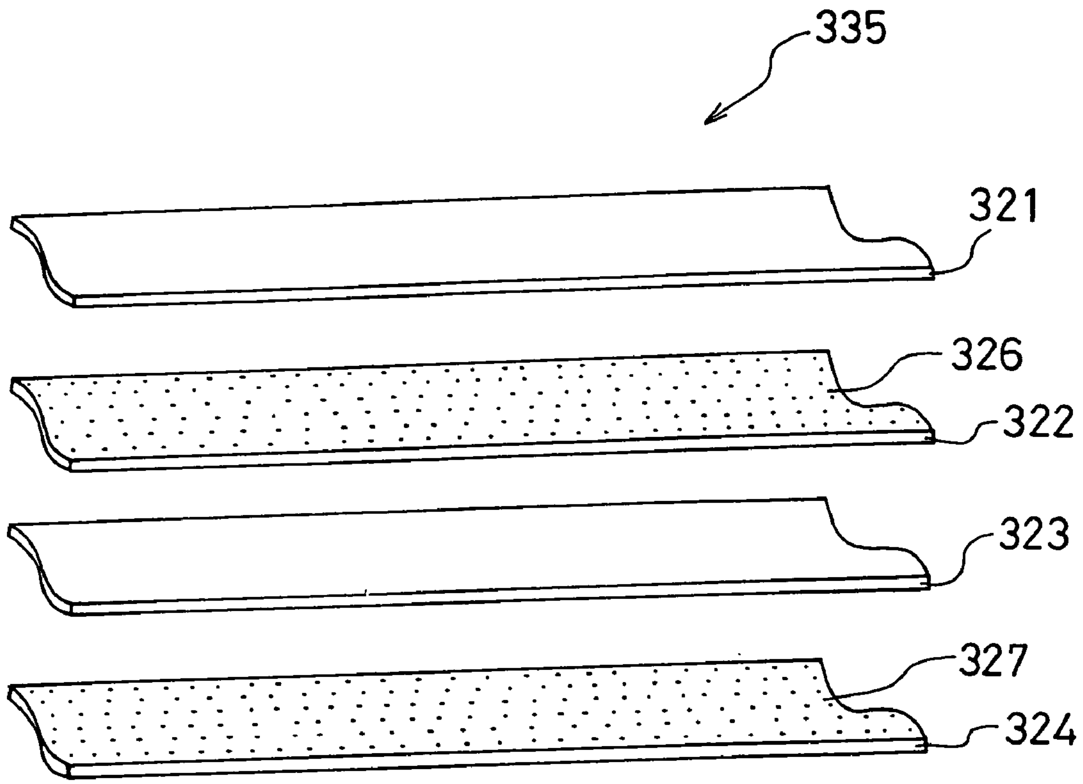
FIG. 33 is an expanded perspective view of the actuator unit at a step in the course of the manufacture of the ink-jet head shown in FIG. 28.

Next, the manufacture method of the actuator unit 320 will be described with reference to FIG. 33 to FIG. 36. First, a conductive paste of an Ag—Pb-base metallic material is applied to the whole upper faces of a green sheet of a ceramics material to be the piezoelectric sheet 322 of the actuator unit 320 and a green sheet of a ceramics material to be the piezoelectric sheet 324, as shown in FIG. 33. The paste is dried to form the common electrode 326 and the reinforcement electrode 327, respectively. After this, green sheets of a ceramics material to be the piezoelectric sheets 221, 222, 223 and 224 are laminated in the recited order and are then pressed and sintered. As a result, a layered structure 335 is formed which includes four layers of piezoelectric sheets 321 to 324 having a generally trapezoidal shape in a plan view. The common electrode 326 and the reinforcement electrode 327 are exposed from the side faces of the layered structure 335, as corresponding to the transverse side faces of the layered structure 335.

Figure 35A:
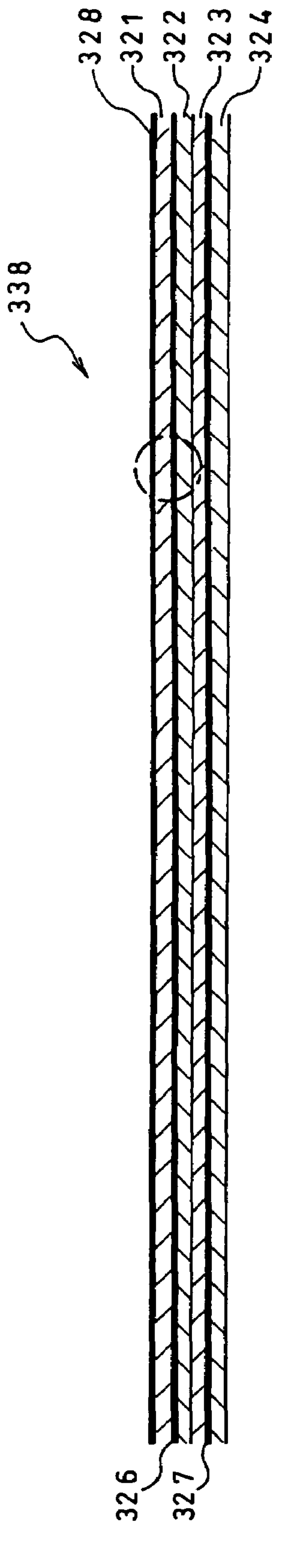
FIG. 35A and FIG. 35B are partial sectional views at individual steps in the course of the manufacture of the ink-jet head shown in FIG. 28.

Subsequently, a Ni-layer (having a film thickness of about 1 micron) is formed, as shown in FIG. 35A, on the upper face (i.e., the upper face in FIG. 34B), on the two side faces (i.e., the side faces corresponding to the transverse oblique sides in FIG. 34A) of the four side faces, and on the regions in the lower face within a predetermined distance from the portions connected to the aforementioned two side faces. This predetermined distance is set so that the Ni-layer may not confront the pressure chamber 310 of the passage unit 302. Moreover, an Au-layer (having a film thickness of about 0.1 microns) is formed as a surface layer on the upper side of that lower Ni-layer. The Ni-layer and the Au-layer are formed by the PVD, printing or plating process. As a result, the conductive film 328 (328*a*, 328*b* and 328*c*), in which the Ni-layer and the Au-layer) are laminated, is formed on the upper face and on the two side faces of the layered structure 335 and on the lower face within the predetermined distance from the portions connected to the two side faces. The conductive film 328 is electrically connected with the common electrode 326 and the reinforcement electrode 327, which are exposed from the side faces corresponding to the transverse oblique sides of the layered structure 335. A partial enlarged view of the region enclosed at this time by an alternate long and short dash line in FIG. 35A is presented in FIG. 36A.

Next, round positioning marks 336 are formed in the four corners of the upper face of the layered structure 335 by an etching process. Thus, a layered structure 338 is prepared.

Here, the aforementioned steps can also be replaced by steps of masking the regions of the lower face to confront the pressure chambers 310 and the positioning marks 336 together, then forming the Ni-layer and the Au-layer and then removing the mask. According to this modification, the positioning marks 336 can be formed simultaneously as the conductive film 328 is formed, to reduce the number of manufacture steps.

Figure 31:
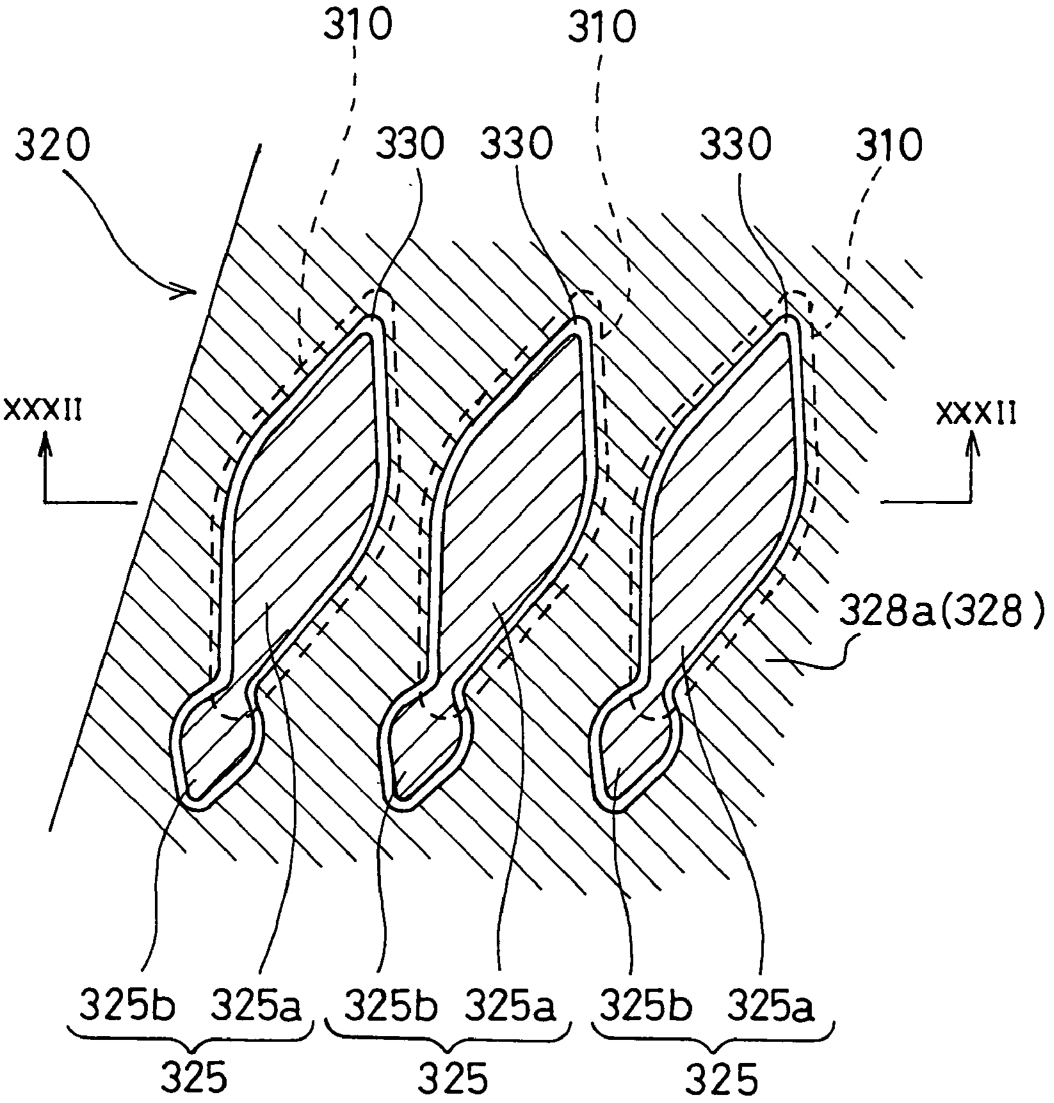
FIG. 31 is an enlarged partial plan view of the actuator unit in the ink-jet head shown in FIG. 28.
Figure 35B:
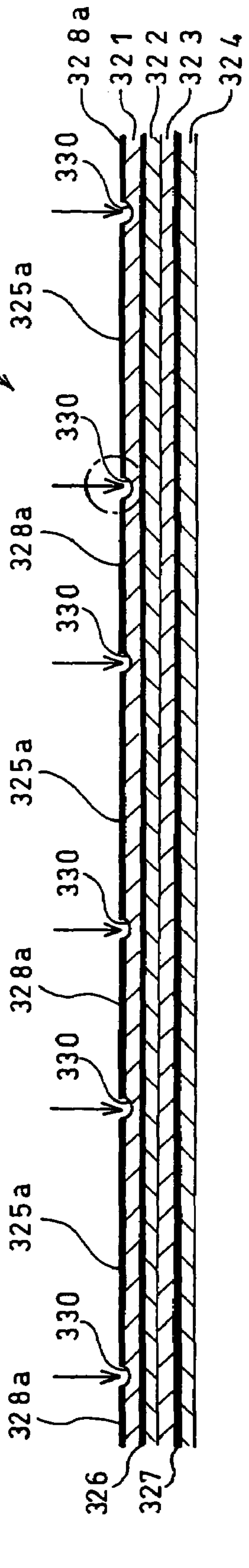
Figure 36A:
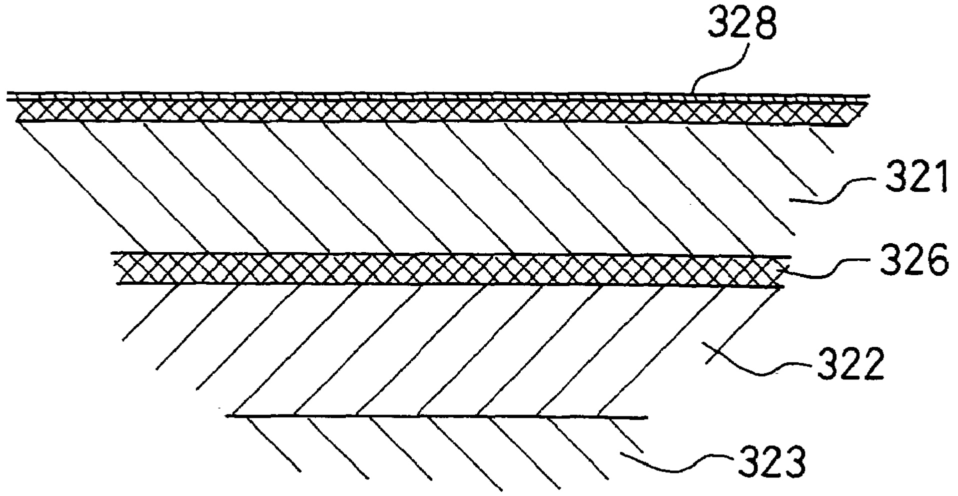
FIG. 36A and FIG. 36B are partial enlarged sections of the actuator unit, at individual steps in the course of the manufacture of the ink-jet head shown in FIG. 28.
Figure 36B:
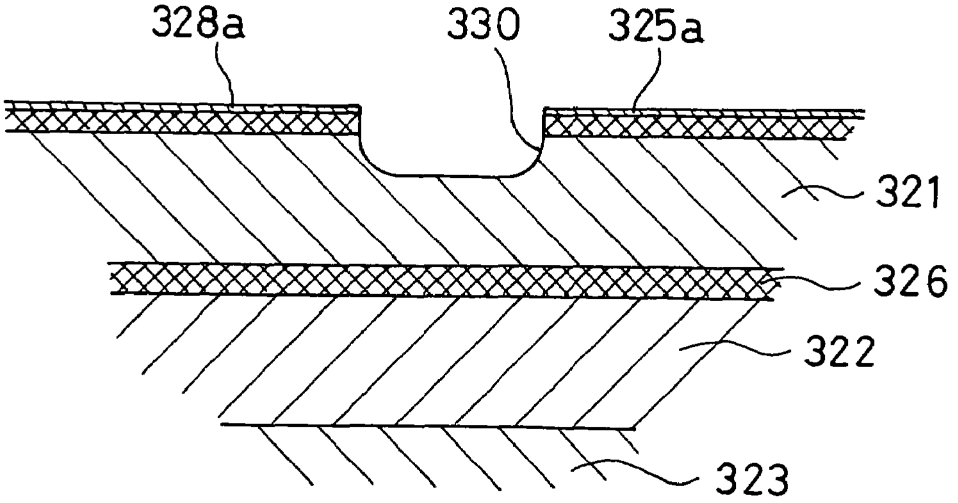

After this, as shown in FIG. 35B, the regions corresponding to the grooves 330, as shown in FIG. 31, of the conductive film 328 are exclusively removed by performing a laser beam machining using the YAG laser, for example, while controlling the emanating direction with respect to the positioning marks 336 formed on the upper face of the layered structure 338, so that the outer edges or rather insides of the pressure chambers 310 in a plan view may be irradiated with a laser beam. By thus removing the conductive film 328 partially, there is formed a pattern of the individual electrodes 325, each of which is composed of the main electrode portion 325*a* and the auxiliary electrode portion 325*b* and which is insulated from the conductive film 328. A partial enlarged view of the region enclosed at this time by an alternate long and short dash line in FIG. 35B is presented in FIG. 36B.

Figure 37:
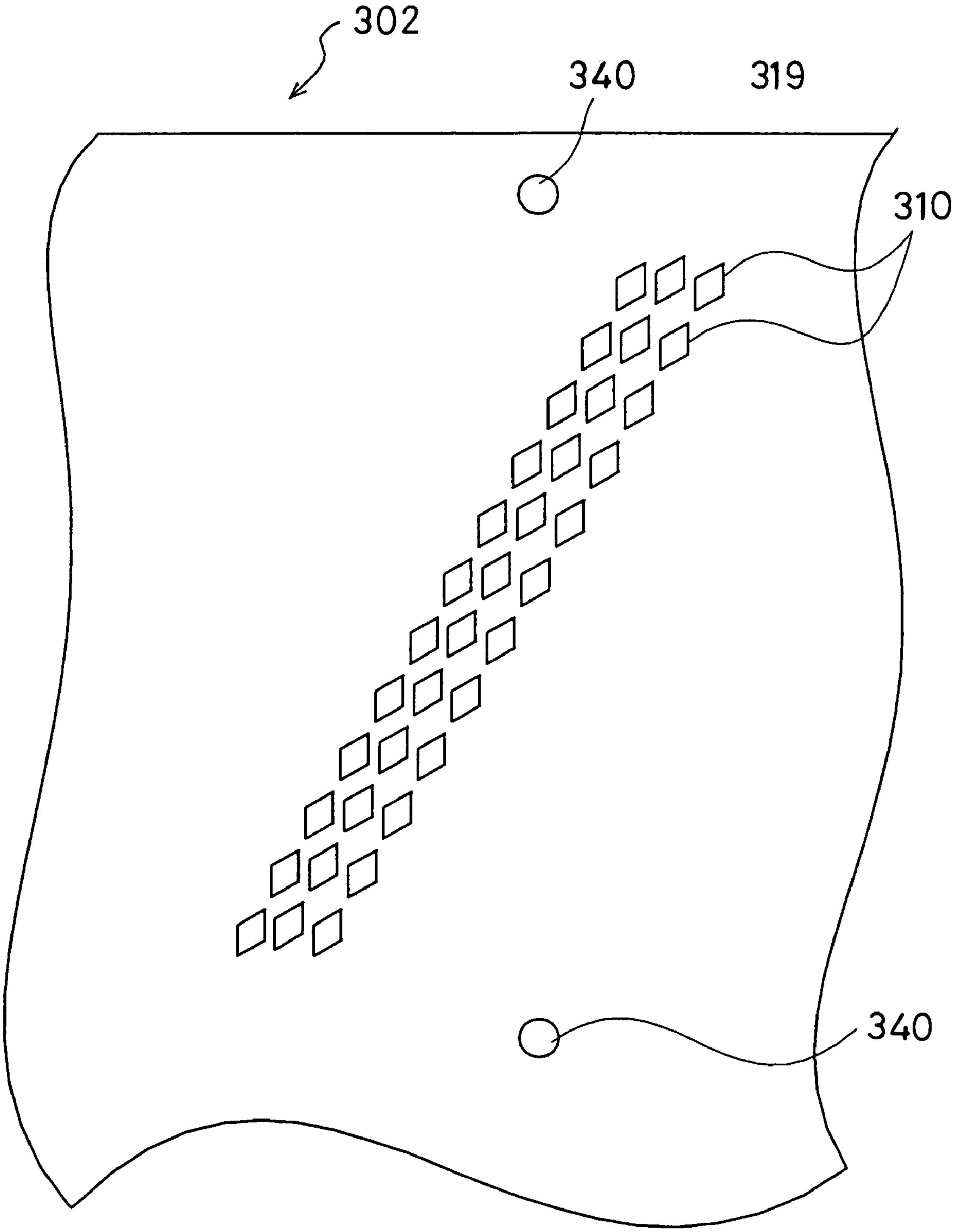
FIG. 37 is a plan view showing one example of positioning marks at a step in the course of the manufacture of the ink-jet head shown in FIG. 28.

Next, a method for arranging the actuator unit 320 on the passage unit 302 will be described with reference to FIG. 37 and FIG. 38. As shown in FIG. 37, a plurality of positioning marks 340 are formed at such predetermined positions of the surface region in the cavity plate 319 of the passage unit 302 as are not covered with the actuator unit 320. The positioning marks 340 are formed simultaneously as the pressure chambers 310 are formed. Therefore, the positioning marks 340 can take a high positioning precision with respect to the pressure chambers 310.

Figure 38:
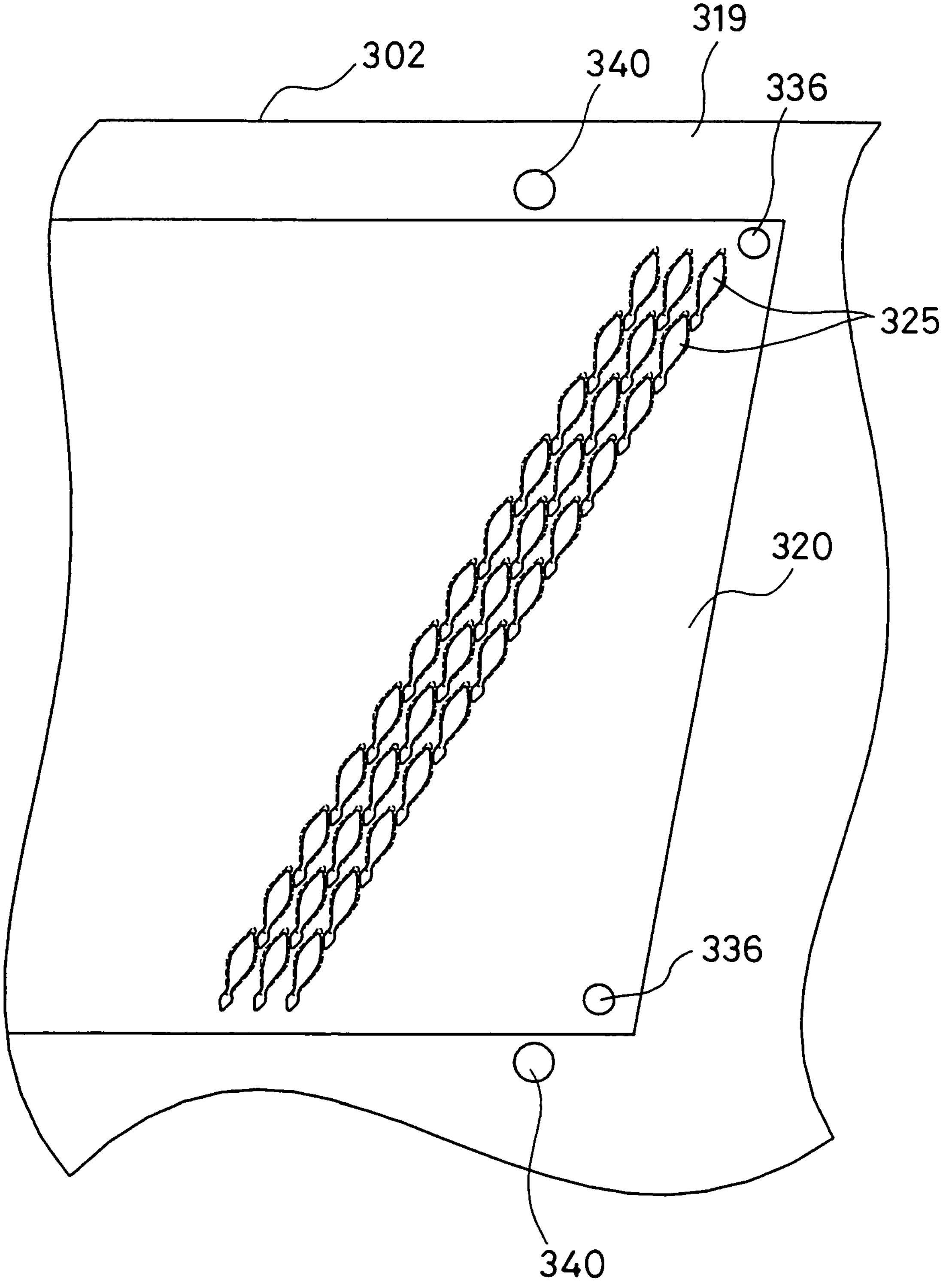
FIG. 38 is a plan view showing the state, in which the actuator unit is bonded to the passage unit, at a step in the course of the manufacture of the ink-jet head shown in FIG. 28.

Subsequently, the actuator unit 320 thus prepared is so bonded to the passage unit 302 by means of an adhesive that the lower portion 328*c* of the conductive film 328 and the portions of the upper face of the cavity plate 319 other than the pressure chambers 310 may contact with each other, as shown in FIG. 38. At this time, the two components are bonded so that the positioning marks 340 formed on the surface of the passage unit 302 and the positioning marks 336 formed on the upper face of the actuator unit 320 may take a predetermined positional relation (for example, the two are spaced at a predetermined distance in the longitudinal direction of the passage unit 302). As a result, the conductive film 328 and the passage unit 302 are electrically connected with each other. Moreover, the individual electrodes 325 formed on the actuator unit 320 can take a high positioning precision with respect to the pressure chambers 310. Therefore, the homogeneity of the ink ejecting performance can be improved to elongate the ink-jet head 301 easily.

After this, in order to feed the drive voltage to each auxiliary electrode portion 325*b* of the actuator unit 320 and the upper portion 328*a* of the conductive film 328, the electrode-patterned portion 303*a* of the FPC 303 is soldered on the actuator unit 320 by a thermal contact bonding process. The manufacture of the ink-jet head 301 is completed through further predetermined steps.

In the ink-jet head 301 of this embodiment, as has been specifically described, the passage unit 302 has a structure in which the nine thin metallic plates 311 to 319 are laminated. Moreover, the cavity plate 319 is provided with the numerous pressure chambers 310 of the generally rhombic shape, which are arrayed in the matrix, and the positioning marks 340 formed at the predetermined positions on the surface region which is not covered with the actuator unit 320. In addition, the conductive film 328 is formed to cover the upper face and the two sides of the actuator unit 320 and the region forming part in the lower face but not confronting the pressure chambers 310. Moreover, the common electrode 326 and the reinforcement electrode 327, which are arranged in the actuator unit 320 having the laminated piezoelectric sheets 321 to 324, are exposed from the side faces corresponding to the transverse oblique sides of the actuator unit 320 so as to have electric conduction with the side portions 328*b* of the conductive film 328 by contacting with them. Thus, by overlaying the conductor pattern of the electrode-patterned portion 303*a* of the FPC 303 on the auxiliary electrode portions 325*b* of the individual electrodes 325 and the upper portion 328*a* of the conductive film 328 for their electric connections, the potentials of the individual electrodes 325 and the common electrode 326 can be controlled to reduce the number of steps of assembling the ink-jet head 301. Moreover, the side portions 328*b* of the conductive film 328 are electrically connected with the common electrode 326 on the two side faces of the actuator unit 320, thereby to make it unnecessary to form through holes or the like for connecting a grounding electrode to be formed on the actuator unit 320 and the common electrode 326 electrically with each other. Accordingly, it is possible to reduce the cost for manufacturing the ink-jet head 301. Moreover, substantially the whole faces of the two side faces of the actuator unit 320, from which the common electrode 326 is exposed, are covered with the side portions 328*b* of the conductive film 328 thereby to ensure the electric connection between the common electrode 326 and the conductive film 328.

In order to manufacture the ink-jet head 301 of this embodiment, the pattern of the individual electrodes 325 are formed by the laser beam machining on the basis of the positioning marks 340 which are formed on the upper face of the actuator unit 320. After this, the passage unit 302 and the actuator unit 320 are bonded so that the positioning marks 340 formed on the passage unit 302 and the positioning marks 336 formed on the actuator unit 320 take the predetermined positional relation. Therefore, the individual electrodes 325 and the pressure chambers 310 can be positioned in a high precision.

By laminating the actuator unit 320 on the passage unit 302, moreover, the common electrode 326 and the passage unit 302 are electrically connected through the conductive film 328, so that the common electrode 326 and the passage unit 302 can be kept at an equal potential without increasing the number of parts and the number of assembling steps. As a result, it is possible to reduce the manufacture cost and to prevent the passage unit 302 or the piezoelectric sheet 324 from being corroded by the electrification of ink.

Further, the common electrode 326 arranged in the actuator unit 320 and the conductive film 328 covering the upper face of the actuator unit 320 are reliably connected, and each individual electrode 325 and the conductive film 328 are electrically insulated without fail. Therefore, the conductive film 328 for the grounding electrode connected with the common electrode 326 and each individual electrode 325 can be easily formed on the upper face of the actuator unit 320. At the same time, no through hole need be formed so that the manufacture cost of the actuator unit 320 can be reduced.

Figure 39A:
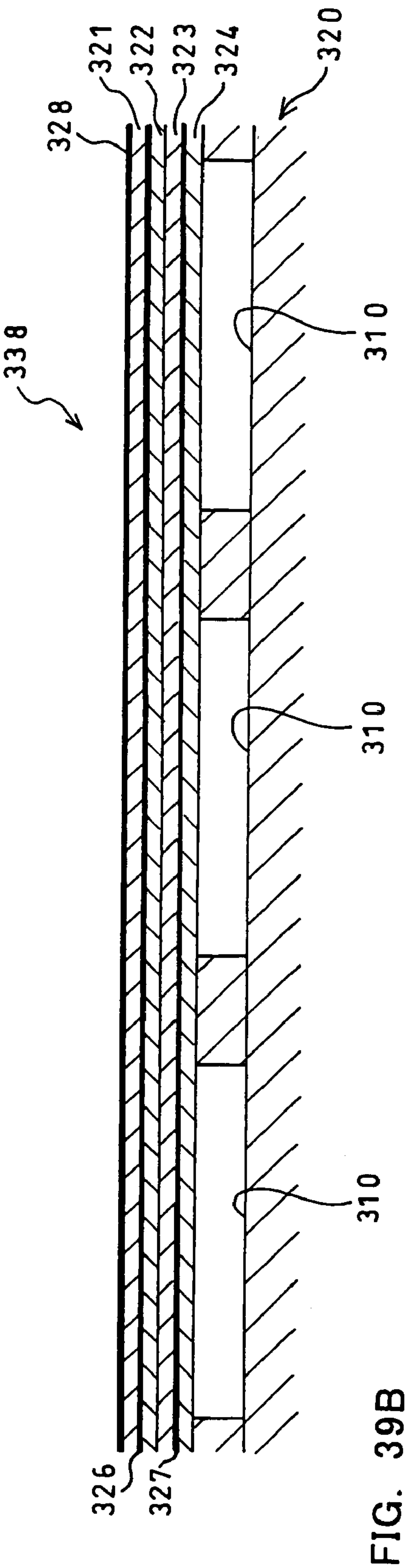
FIG. 39A and FIG. 39B are partial sectional views at a step in the course of the manufacture of modifications of the ink-jet head shown in FIG. 28.
Figure 39B:
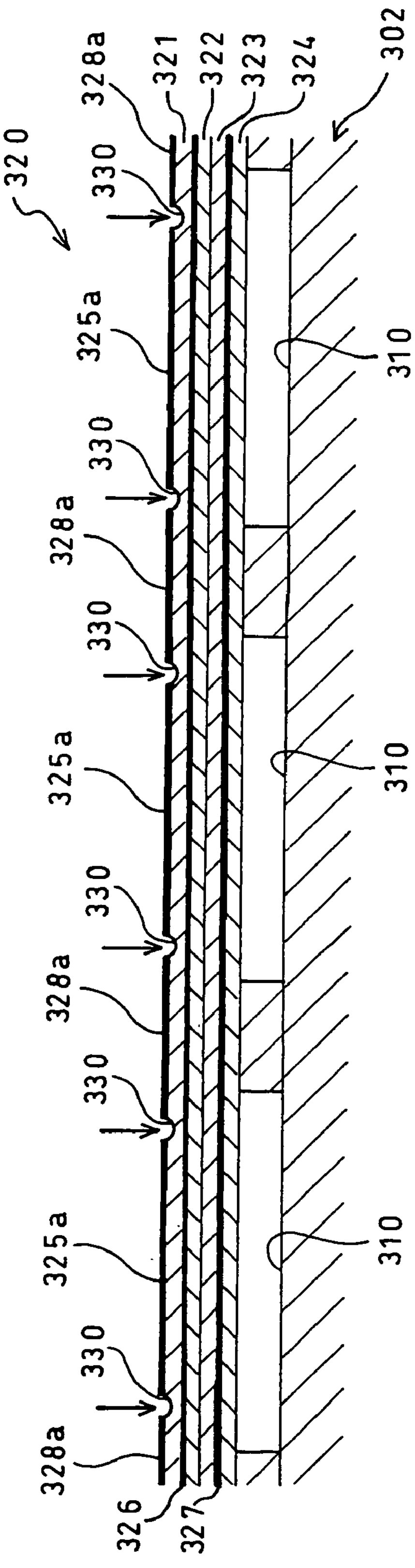

Next, a modification of this embodiment will be described. In this embodiment, as shown in FIG. 39A and FIG. 39B, the actuator unit 320 may also be formed by bonding the layered structure 338 and the passage unit 302 on the basis of the positioning marks 336 formed on the layered structure 338 and the positioning marks 340 formed on the passage unit 302, and then by forming the pattern of the individual electrodes 325 on the upper face of the layered structure 338 by the laser beam machining based on the positioning marks 340. As a result, it is possible to enhance the positioning precision of the individual electrodes 325 formed on the actuator unit 320 with respect to the pressure chambers 310. Therefore, the homogeneity of the ink ejecting performance can be improved to elongate the ink-jet head 301 more easily. Here in FIG. 39A and FIG. 39B, the same reference numerals as those of the ink-jet head 301 according to this embodiment designate those identical or corresponding to those of the ink-jet head 301.

In this embodiment, the conductive film 328 is formed on the whole region of the two side faces corresponding to the transverse oblique sides of the actuator unit 320. However, the conductive film 328 may also be formed only partially on one of the two side faces corresponding to the transverse oblique sides of the actuator unit 320. Moreover, the conductive film 328 is formed such a substantially whole region of the lower face of the actuator unit 320 as not confronting the pressure chambers 310. However, the conductive film 328 may also be formed only in a smaller region in the lower face. As a result, it is possible to reduce the amounts of materials to be used for forming the conductive film 328.

Further, in this embodiment, the conductive film 328 is formed on the two sides corresponding to the transverse oblique sides of the actuator unit 320. However, the conductive film 328 may also be formed on the side faces corresponding to the upper side and the lower side of the actuator unit 320. At this time, the conductive film 328 may also be formed on such a region of the lower face near the side faces corresponding to the upper side and the lower side of the actuator unit 320 as not confronting the pressure chambers 310. As a result, the electric connection between the common electrode 326 and the passage unit 302 can be more ensured through the conductive film 328.

Here, the materials used in the aforementioned three embodiments for the piezoelectric sheets and the electrodes should not be limited to the aforementioned ones but may be modified into other well-known materials. Moreover, the plan shapes, sectional shapes and arrangements of the pressure chambers, the number of piezoelectric sheets including the active layers, and the number of the inactive layers may also be suitably modified. In addition, the film thickness may also be made different between the piezoelectric sheets including the active layers and the inactive layers.

In the aforementioned embodiments, moreover, the actuator unit is formed by arranging the individual electrodes and the common electrode on the piezoelectric sheet. However, this actuator unit need not always be bonded to the passage unit but can also be exemplified by another if it can change the volumes of the pressure chambers individually. Moreover, the foregoing embodiments have been described on the structure in which the pressure chambers are arranged in a matrix. However, the invention can also be applied to the structure in which the pressure chambers are arrayed in one or a plurality of rows.

In the foregoing embodiments, the active layers are formed only in the uppermost piezoelectric sheet that is the most distant sheet from the pressure chamber. However, the uppermost piezoelectric sheet may not always contain the active layers, but the active layers may also be formed in another piezoelectric sheet in addition to the uppermost one. In these modifications, it is possible to acquire a sufficient crosstalk suppressing effect. Moreover, the ink-jet head of the aforementioned embodiments has the unimorph structure utilizing the transversal piezoelectric effect. However, the invention can also be applied to the ink-jet head which has a layer including active layers arranged closer to the pressure chamber than the inactive layer and utilizes the longitudinal piezoelectric effect.

The apertures and marks are formed in the individual plates constructing the passage unit by the etching process. However, these apertures and marks may also be formed in the individual plates by a process other than the etching process.

In the foregoing embodiments, all the inactive layers are the piezoelectric sheets in the foregoing embodiments, but the inactive layers may be exemplified by insulating sheets other than the piezoelectric sheets. Moreover, the actuator unit need not be arranged continuously across a plurality of pressure chambers. In other words, independent actuator units of the number of pressure chambers may also be adhered to the passage units.

In the invention, moreover, the member containing the piezoelectric sheet may contain only one piezoelectric sheet having the active layers, each of them being sandwiched between the common electrode and the individual electrode, as in the foregoing embodiments, or may contain not only one or more piezoelectric sheets having the active layers but also a plurality of sheet members as the inactive layers laminated on the piezoelectric sheet or sheets.

While this invention has been described in conjunction with the specific embodiments outlined above, it is evident that many alternatives, modifications and variations will be apparent to those skilled in the art. Accordingly, the preferred embodiments of the invention as set forth above are intended to be illustrative, not limiting. Various changes may be made without departing from the spirit and scope of the invention as defined in the following claims.

What is claimed is:

1. A method for manufacturing an actuator unit including a piezoelectric sheet, the actuator unit to be laminated on a passage unit having a plurality of pressure chambers formed therein, the method comprising:

preparing a member containing the piezoelectric sheet on which a common electrode is supported, the member having a first face to be fixed to the passage unit and a second face facing a direction opposite to the first face, the common electrode being provided to be common to pressure chambers and exposing from a side face of the member that connects the first face and the second face;

forming a surface electrode that covers the second face and the side face and contacts the common electrode on the side face of the member; and partially removing the surface electrode on the second face to form individual electrodes at positions corresponding to the respective pressure chambers.

2. The actuator unit manufacturing method according to claim 1, wherein in forming the surface electrode, the surface electrode is formed to substantially cover the entire region of one or more side faces of the actuator unit, having a plurality of side faces, from which the common electrode exposes.

3. The actuator unit manufacturing method according to claim 1, wherein in forming the surface electrode, the surface electrode is formed to extend over the first face of the actuator unit to cover the region not confronting the pressure chamber.

* * * * *